(12) United States Patent
Lee

(10) Patent No.: US 9,431,481 B2
(45) Date of Patent: Aug. 30, 2016

(54) SUPERJUNCTION STRUCTURES FOR POWER DEVICES AND METHODS OF MANUFACTURE

(71) Applicant: Fairchild Semiconductor Corporation, San Jose, CA (US)

(72) Inventor: Jaegil Lee, Puchon-si (KR)

(73) Assignee: Fairchild Semiconductor Corporation, San Jose, CA (US)

( * ) Notice: Subject to any disclaimer, the term of this patent is extended or adjusted under 35 U.S.C. 154(b) by 0 days.

(21) Appl. No.: 14/491,653

(22) Filed: Sep. 19, 2014

(65) Prior Publication Data
US 2015/0069567 A1    Mar. 12, 2015

Related U.S. Application Data

(63) Continuation of application No. 13/095,652, filed on Apr. 27, 2011, now abandoned.

(51) Int. Cl.
*H01L 29/06* (2006.01)
*H01L 29/66* (2006.01)
(Continued)

(52) U.S. Cl.
CPC ..... *H01L 29/0634* (2013.01); *H01L 29/66712* (2013.01); *H01L 29/66734* (2013.01); *H01L 29/7397* (2013.01); *H01L 29/74* (2013.01);
(Continued)

(58) Field of Classification Search
CPC ..... H01L 29/04; H01L 29/045; H01L 29/06; H01L 29/063; H01L 29/0634; H01L 29/7813; H01L 29/0688; H01L 29/0692; H01L 29/66734; H01L 29/402; H01L 29/404; H01L 29/4238; H01L 29/42376; H01L 29/0615
See application file for complete search history.

(56) References Cited

U.S. PATENT DOCUMENTS

| 3,404,295 A | 10/1968 | Warner, Jr. |
| 3,412,297 A | 11/1968 | Amlinger |

(Continued)

FOREIGN PATENT DOCUMENTS

| CN | 1036666 A | 10/1989 |
| CN | 1744329 A | 3/2006 |

(Continued)

OTHER PUBLICATIONS

Shenai et al., "Current Transport Mechanisms in Atomically Abrupt Metal-Semiconductor Interfaces", IEEE Transactions on Electron Devices, vol. 35, No. 4, Apr. 1988, pp. 468-482.

(Continued)

*Primary Examiner* — Steven Loke
*Assistant Examiner* — Leslie Pilar Cruz

(57) ABSTRACT

In a general aspect, a power device can include an epitaxial layer of a first conductivity type, an active region, a termination region surrounding the active region, a plurality of trenches disposed in the epitaxial layer, and silicon material of a second conductivity type disposed in the plurality of trenches. The silicon material of the second conductivity type and a plurality of mesas defined in the epitaxial layer by the trenches, can define a plurality of concentric octagon-shaped pillars of alternating conductivity type, a first portion of the pillars being disposed in the active region and a second portion of the pillars being disposed in the termination region. Sidewalls of the plurality of trenches can define a first four legs and a second four legs of each of the pillars. The sidewalls can have a same crystallographic plane direction.

20 Claims, 54 Drawing Sheets

(51) Int. Cl.
*H01L 29/78* (2006.01)
*H01L 29/872* (2006.01)
*H01L 29/739* (2006.01)
*H01L 29/74* (2006.01)
H01L 29/40 (2006.01)
H01L 29/423 (2006.01)
H01L 29/04 (2006.01)
H01L 29/08 (2006.01)
H01L 29/10 (2006.01)

(52) U.S. Cl.
CPC ....... *H01L 29/7811* (2013.01); *H01L 29/7813* (2013.01); *H01L 29/872* (2013.01); *H01L 29/045* (2013.01); *H01L 29/0615* (2013.01); *H01L 29/0619* (2013.01); *H01L 29/0649* (2013.01); *H01L 29/0696* (2013.01); *H01L 29/0878* (2013.01); *H01L 29/1095* (2013.01); *H01L 29/402* (2013.01); *H01L 29/404* (2013.01); *H01L 29/4238* (2013.01)

(56) References Cited

U.S. PATENT DOCUMENTS

| | | |
|---|---|---|
| 3,497,777 A | 2/1970 | Teszner |
| 3,564,356 A | 2/1971 | Wilson |
| 3,660,697 A | 5/1972 | Berglund et al. |
| 4,003,072 A | 1/1977 | Matsushita et al. |
| 4,300,150 A | 11/1981 | Colak |
| 4,326,332 A | 4/1982 | Kenney |
| 4,337,474 A | 6/1982 | Yukimoto |
| 4,345,265 A | 8/1982 | Blanchard |
| 4,404,575 A | 9/1983 | Nishizawa |
| 4,445,202 A | 4/1984 | Goetze et al. |
| 4,579,621 A | 4/1986 | Hine |
| 4,636,281 A | 1/1987 | Buignez et al. |
| 4,638,344 A | 1/1987 | Cardwell, Jr. |
| 4,639,761 A | 1/1987 | Singer |
| 4,682,405 A | 7/1987 | Blanchard et al. |
| 4,698,653 A | 10/1987 | Cardwell, Jr. |
| 4,716,126 A | 12/1987 | Cogan |
| 4,746,630 A | 5/1988 | Hui et al. |
| 4,754,310 A | 6/1988 | Coe |
| 4,774,556 A | 9/1988 | Fujii et al. |
| 4,775,881 A | 10/1988 | Ploog et al. |
| 4,801,986 A | 1/1989 | Chang et al. |
| 4,801,995 A | 1/1989 | Iwanishi |
| 4,821,095 A | 4/1989 | Temple |
| 4,823,176 A | 4/1989 | Baliga et al. |
| 4,853,345 A | 8/1989 | Himelick |
| 4,868,624 A | 9/1989 | Grung et al. |
| 4,893,160 A | 1/1990 | Blanchard |
| 4,914,058 A | 4/1990 | Blanchard |
| 4,941,026 A | 7/1990 | Temple |
| 4,967,245 A | 10/1990 | Cogan et al. |
| 4,974,059 A | 11/1990 | Kinzer |
| 4,975,782 A | 12/1990 | Bauer |
| 4,990,463 A | 2/1991 | Mori |
| 4,992,390 A | 2/1991 | Chang |
| 5,027,180 A | 6/1991 | Nishizawa et al. |
| 5,034,785 A | 7/1991 | Blanchard |
| 5,071,782 A | 12/1991 | Mori |
| 5,072,266 A | 12/1991 | Bulucea et al. |
| 5,079,608 A | 1/1992 | Wodarczyk et al. |
| 5,105,243 A | 4/1992 | Nakagawa et al. |
| 5,111,253 A | 5/1992 | Korman et al. |
| 5,142,640 A | 8/1992 | Iwamatsu |
| 5,164,325 A | 11/1992 | Cogan et al. |
| 5,164,802 A | 11/1992 | Jones et al. |
| 5,216,275 A | 6/1993 | Chen |
| 5,219,777 A | 6/1993 | Kang |
| 5,219,793 A | 6/1993 | Cooper et al. |
| 5,233,215 A | 8/1993 | Baliga |
| 5,262,336 A | 11/1993 | Pike et al. |
| 5,268,311 A | 12/1993 | Euen et al. |
| 5,275,965 A | 1/1994 | Manning |
| 5,294,824 A | 3/1994 | Okada |
| 5,298,761 A | 3/1994 | Aoki et al. |
| 5,298,781 A | 3/1994 | Cogan et al. |
| 5,300,447 A | 4/1994 | Anderson |
| 5,326,711 A | 7/1994 | Malhi |
| 5,350,937 A | 9/1994 | Yamazaki et al. |
| 5,365,102 A | 11/1994 | Mehrotra et al. |
| 5,366,914 A | 11/1994 | Takahashi et al. |
| 5,389,815 A | 2/1995 | Takahashi |
| 5,405,794 A | 4/1995 | Kim |
| 5,418,376 A | 5/1995 | Muraoka et al. |
| 5,424,231 A | 6/1995 | Yang |
| 5,429,977 A | 7/1995 | Lu et al. |
| 5,430,311 A | 7/1995 | Murakami et al. |
| 5,430,324 A | 7/1995 | Bencuya |
| 5,434,435 A | 7/1995 | Baliga |
| 5,436,189 A | 7/1995 | Beasom |
| 5,438,215 A | 8/1995 | Tihanyi |
| 5,442,214 A | 8/1995 | Yang |
| 5,454,435 A | 10/1995 | Reinhardt |
| 5,473,176 A | 12/1995 | Kakumoto |
| 5,473,180 A | 12/1995 | Ludikhuize |
| 5,474,943 A | 12/1995 | Hshieh et al. |
| 5,489,787 A | 2/1996 | Amaratunga et al. |
| 5,519,245 A | 5/1996 | Tokura et al. |
| 5,541,425 A | 7/1996 | Nishihara |
| 5,545,915 A | 8/1996 | Disney et al. |
| 5,554,862 A | 9/1996 | Omura et al. |
| 5,567,634 A | 10/1996 | Hebert et al. |
| 5,567,635 A | 10/1996 | Acovic et al. |
| 5,572,048 A | 11/1996 | Sugawara |
| 5,576,245 A | 11/1996 | Cogan et al. |
| 5,578,851 A | 11/1996 | Hshieh et al. |
| 5,581,100 A | 12/1996 | Ajit |
| 5,583,065 A | 12/1996 | Miwa |
| 5,592,005 A | 1/1997 | Floyd et al. |
| 5,595,927 A | 1/1997 | Chen et al. |
| 5,597,765 A | 1/1997 | Yilmaz et al. |
| 5,605,852 A | 2/1997 | Bencuya |
| 5,616,945 A | 4/1997 | Williams |
| 5,623,152 A | 4/1997 | Majumdar et al. |
| 5,629,543 A | 5/1997 | Hshieh et al. |
| 5,637,898 A | 6/1997 | Baliga |
| 5,637,910 A | 6/1997 | Sakamoto |
| 5,639,676 A | 6/1997 | Hshieh et al. |
| 5,640,034 A | 6/1997 | Malhi |
| 5,648,670 A | 7/1997 | Blanchard |
| 5,656,843 A | 8/1997 | Goodyear et al. |
| 5,665,619 A | 9/1997 | Kwan et al. |
| 5,670,803 A | 9/1997 | Beilstein et al. |
| 5,689,128 A | 11/1997 | Hshieh et al. |
| 5,693,569 A | 12/1997 | Ueno |
| 5,705,409 A | 1/1998 | Witek |
| 5,710,072 A | 1/1998 | Krautschneider et al. |
| 5,714,781 A | 2/1998 | Yamamoto et al. |
| 5,719,409 A | 2/1998 | Singh et al. |
| 5,726,469 A | 3/1998 | Chen |
| 5,770,878 A | 6/1998 | Beasom |
| 5,776,813 A | 7/1998 | Huang et al. |
| 5,780,343 A | 7/1998 | Bashir |
| 5,801,417 A | 9/1998 | Tsang et al. |
| 5,814,858 A | 9/1998 | Williams |
| 5,877,528 A | 3/1999 | So |
| 5,879,971 A | 3/1999 | Witek |
| 5,879,994 A | 3/1999 | Kwan et al. |
| 5,895,951 A | 4/1999 | So et al. |
| 5,895,952 A | 4/1999 | Darwish et al. |
| 5,897,343 A | 4/1999 | Mathew et al. |
| 5,897,360 A | 4/1999 | Kawaguchi |
| 5,900,663 A | 5/1999 | Johnson et al. |
| 5,906,680 A | 5/1999 | Meyerson |
| 5,917,216 A | 6/1999 | Floyd et al. |
| 5,929,481 A | 7/1999 | Hshieh et al. |
| 5,943,581 A | 8/1999 | Lu et al. |
| 5,949,104 A | 9/1999 | D'Anna et al. |
| 5,949,124 A | 9/1999 | Hadizad et al. |
| 5,959,324 A | 9/1999 | Kohyama |
| 5,960,271 A | 9/1999 | Wollesen et al. |

(56) References Cited

U.S. PATENT DOCUMENTS

| | | |
|---|---|---|
| 5,972,741 A | 10/1999 | Kubo et al. |
| 5,973,360 A | 10/1999 | Tihanyi |
| 5,973,367 A | 10/1999 | Williams |
| 5,976,936 A | 11/1999 | Miyajima et al. |
| 5,981,344 A | 11/1999 | Hshieh et al. |
| 5,981,996 A | 11/1999 | Fujishima |
| 5,998,833 A | 12/1999 | Baliga |
| 6,005,271 A | 12/1999 | Hshieh |
| 6,008,097 A | 12/1999 | Yoon et al. |
| 6,011,298 A | 1/2000 | Blanchard |
| 6,015,727 A | 1/2000 | Wanlass |
| 6,020,250 A | 2/2000 | Kenney |
| 6,034,415 A | 3/2000 | Johnson et al. |
| 6,037,202 A | 3/2000 | Witek |
| 6,037,628 A | 3/2000 | Huang |
| 6,037,632 A | 3/2000 | Omura et al. |
| 6,040,600 A | 3/2000 | Uenishi et al. |
| 6,048,772 A | 4/2000 | D'Anna |
| 6,049,108 A | 4/2000 | Williams et al. |
| 6,057,558 A | 5/2000 | Yamamoto et al. |
| 6,063,678 A | 5/2000 | D'Anna |
| 6,064,088 A | 5/2000 | D'Anna |
| 6,066,878 A | 5/2000 | Neilson |
| 6,069,043 A | 5/2000 | Floyd et al. |
| 6,081,009 A | 6/2000 | Neilson |
| 6,084,264 A | 7/2000 | Darwish |
| 6,084,268 A | 7/2000 | De Fresart et al. |
| 6,087,232 A | 7/2000 | Kim et al. |
| 6,096,608 A | 8/2000 | Williams |
| 6,097,063 A | 8/2000 | Fujihira |
| 6,103,578 A | 8/2000 | Uenishi et al. |
| 6,104,054 A | 8/2000 | Corsi et al. |
| 6,110,799 A | 8/2000 | Huang |
| 6,114,727 A | 9/2000 | Ogura et al. |
| 6,137,152 A | 10/2000 | Wu |
| 6,150,697 A | 11/2000 | Teshigahara et al. |
| 6,156,606 A | 12/2000 | Michaelis |
| 6,156,611 A | 12/2000 | Lan et al. |
| 6,163,052 A | 12/2000 | Liu et al. |
| 6,165,870 A | 12/2000 | Shim et al. |
| 6,168,983 B1 | 1/2001 | Rumennik et al. |
| 6,168,996 B1 | 1/2001 | Numazawa et al. |
| 6,171,935 B1 | 1/2001 | Nance et al. |
| 6,174,773 B1 | 1/2001 | Fujishima |
| 6,174,785 B1 | 1/2001 | Parekh et al. |
| 6,184,545 B1 | 2/2001 | Werner et al. |
| 6,184,555 B1 | 2/2001 | Tihanyi et al. |
| 6,188,104 B1 | 2/2001 | Choi et al. |
| 6,188,105 B1 | 2/2001 | Kocon et al. |
| 6,190,978 B1 | 2/2001 | D'Anna |
| 6,191,447 B1 | 2/2001 | Baliga |
| 6,194,741 B1 | 2/2001 | Kinzer et al. |
| 6,198,127 B1 | 3/2001 | Kocon |
| 6,201,279 B1 | 3/2001 | Pfirsch |
| 6,204,097 B1 | 3/2001 | Shen et al. |
| 6,207,994 B1 | 3/2001 | Rumennik et al. |
| 6,222,233 B1 | 4/2001 | D'Anna |
| 6,225,649 B1 | 5/2001 | Minato |
| 6,228,727 B1 | 5/2001 | Lim et al. |
| 6,239,463 B1 | 5/2001 | Williams et al. |
| 6,239,464 B1 | 5/2001 | Tsuchitani et al. |
| 6,265,269 B1 | 7/2001 | Chen et al. |
| 6,271,100 B1 | 8/2001 | Ballantine et al. |
| 6,271,552 B1 | 8/2001 | D'Anna |
| 6,271,562 B1 | 8/2001 | Deboy et al. |
| 6,274,904 B1 | 8/2001 | Tihanyi |
| 6,274,905 B1 | 8/2001 | Mo |
| 6,277,706 B1 | 8/2001 | Ishikawa |
| 6,281,547 B1 | 8/2001 | So et al. |
| 6,285,060 B1 | 9/2001 | Korec et al. |
| 6,291,298 B1 | 9/2001 | Williams et al. |
| 6,291,856 B1 | 9/2001 | Miyasaka et al. |
| 6,294,818 B1 | 9/2001 | Fujihira |
| 6,297,534 B1 | 10/2001 | Kawaguchi et al. |
| 6,303,969 B1 | 10/2001 | Tan |
| 6,307,246 B1 | 10/2001 | Nitta et al. |
| 6,309,920 B1 | 10/2001 | Laska et al. |
| 6,310,365 B1 | 10/2001 | Chen |
| 6,313,482 B1 | 11/2001 | Baliga |
| 6,316,806 B1 | 11/2001 | Mo |
| 6,326,656 B1 | 12/2001 | Tihanyi |
| 6,337,499 B1 | 1/2002 | Werner |
| 6,346,464 B1 | 2/2002 | Takeda et al. |
| 6,346,469 B1 | 2/2002 | Greer |
| 6,351,018 B1 | 2/2002 | Sapp |
| 6,353,252 B1 | 3/2002 | Yasuhara et al. |
| 6,359,308 B1 | 3/2002 | Hijzen et al. |
| 6,362,112 B1 | 3/2002 | Hamerski |
| 6,362,505 B1 | 3/2002 | Tihanyi |
| 6,365,462 B2 | 4/2002 | Baliga |
| 6,365,930 B1 | 4/2002 | Schillaci et al. |
| 6,368,920 B1 | 4/2002 | Beasom |
| 6,368,921 B1 | 4/2002 | Hijzen et al. |
| 6,376,314 B1 | 4/2002 | Jerred |
| 6,376,878 B1 | 4/2002 | Kocon |
| 6,376,890 B1 | 4/2002 | Tihanyi |
| 6,384,456 B1 | 5/2002 | Tihanyi |
| 6,388,286 B1 | 5/2002 | Baliga |
| 6,388,287 B2 | 5/2002 | Deboy et al. |
| 6,400,003 B1 | 6/2002 | Huang |
| 6,429,481 B1 | 8/2002 | Mo et al. |
| 6,433,385 B1 | 8/2002 | Kocon et al. |
| 6,436,779 B2 | 8/2002 | Hurkx et al. |
| 6,437,399 B1 | 8/2002 | Huang |
| 6,441,454 B2 | 8/2002 | Hijzen et al. |
| 6,452,230 B1 | 9/2002 | Boden, Jr. |
| 6,461,918 B1 | 10/2002 | Calafut |
| 6,465,304 B1 | 10/2002 | Blanchard et al. |
| 6,465,843 B1 | 10/2002 | Hirler et al. |
| 6,465,869 B2 | 10/2002 | Ahlers et al. |
| 6,472,678 B1 | 10/2002 | Hshieh et al. |
| 6,472,708 B1 | 10/2002 | Hshieh et al. |
| 6,475,884 B2 | 11/2002 | Hshieh et al. |
| 6,476,443 B1 | 11/2002 | Kinzer |
| 6,479,352 B2 | 11/2002 | Blanchard |
| 6,489,652 B1 | 12/2002 | Jeon et al. |
| 6,501,146 B1 | 12/2002 | Harada |
| 6,580,123 B2 | 6/2003 | Thapar |
| 6,608,350 B2 | 8/2003 | Kinzer et al. |
| 6,611,021 B1 | 8/2003 | Onishi et al. |
| 6,630,698 B1 | 10/2003 | Deboy et al. |
| 6,635,906 B1 | 10/2003 | Chen |
| 6,649,459 B2 | 11/2003 | Deboy et al. |
| 6,649,975 B2 | 11/2003 | Baliga |
| 6,673,679 B1 | 1/2004 | Miyasaka et al. |
| 6,677,626 B1 | 1/2004 | Shindou et al. |
| 6,683,347 B1 | 1/2004 | Fujihira |
| 6,693,323 B2 | 2/2004 | Sato et al. |
| 6,693,338 B2 | 2/2004 | Saitoh et al. |
| 6,696,728 B2 | 2/2004 | Onishi et al. |
| 6,700,156 B2 | 3/2004 | Saitoh et al. |
| 6,700,175 B1 | 3/2004 | Kodama et al. |
| 6,710,403 B2 | 3/2004 | Sapp |
| 6,713,813 B2 | 3/2004 | Marchant |
| 6,724,042 B2 | 4/2004 | Onishi et al. |
| 6,740,931 B2 | 5/2004 | Kouzuki et al. |
| 6,777,746 B2 | 8/2004 | Kitagawa et al. |
| 6,803,626 B2 | 10/2004 | Sapp et al. |
| 6,818,513 B2 | 11/2004 | Marchant |
| 6,819,089 B2 | 11/2004 | Deboy et al. |
| 6,825,514 B2 | 11/2004 | Deboy et al. |
| 6,825,537 B2 | 11/2004 | Iwamoto et al. |
| 6,828,609 B2 | 12/2004 | Deboy et al. |
| 6,844,592 B2 | 1/2005 | Yamaguchi et al. |
| 6,870,201 B1 | 3/2005 | Deboy et al. |
| 6,878,989 B2 | 4/2005 | Izumisawa et al. |
| 6,884,592 B2 | 4/2005 | Matzinger et al. |
| 6,894,329 B2 | 5/2005 | Deboy et al. |
| 6,903,418 B2 | 6/2005 | Iwamoto et al. |
| 6,919,610 B2 | 7/2005 | Saitoh et al. |
| 6,930,352 B2 | 8/2005 | Saito et al. |
| 6,940,126 B2 | 9/2005 | Deboy et al. |
| 6,960,798 B2 | 11/2005 | Deboy et al. |
| 6,995,426 B2 | 2/2006 | Okumura et al. |

(56) References Cited

U.S. PATENT DOCUMENTS

| | | | |
|---|---|---|---|
| 7,023,069 B2 | 4/2006 | Blanchard |
| 7,041,560 B2 | 5/2006 | Hshieh |
| 7,052,982 B2 | 5/2006 | Hshieh et al. |
| 7,115,475 B2 | 10/2006 | Yamaguchi et al. |
| 7,170,119 B2 | 1/2007 | Yamauchi et al. |
| 7,202,526 B2 | 4/2007 | Kitagawa et al. |
| 7,224,022 B2 | 5/2007 | Tokano et al. |
| 7,224,027 B2 | 5/2007 | Blanchard |
| 7,226,841 B2 | 6/2007 | Izumisawa et al. |
| 7,301,203 B2 | 11/2007 | Lee et al. |
| 7,317,213 B2 | 1/2008 | Yamaguchi et al. |
| 7,452,777 B2 | 11/2008 | Kocon et al. |
| 7,476,589 B2 | 1/2009 | Grebs et al. |
| 7,576,393 B2 | 8/2009 | Ono et al. |
| 7,655,981 B2 | 2/2010 | Lee et al. |
| 7,859,076 B2 | 12/2010 | Van Dalen et al. |
| 7,943,989 B2 | 5/2011 | Yilmaz et al. |
| 8,580,651 B2 | 11/2013 | Ishiguro |
| 8,673,700 B2 | 3/2014 | Yedinak et al. |
| 8,772,868 B2 | 7/2014 | Yedinak et al. |
| 8,786,010 B2 | 7/2014 | Yedinak et al. |
| 8,836,028 B2 | 9/2014 | Yedinak et al. |
| 2001/0023961 A1 | 9/2001 | Hshieh et al. |
| 2001/0025984 A1 | 10/2001 | Osawa |
| 2001/0028083 A1 | 10/2001 | Onishi et al. |
| 2001/0032998 A1 | 10/2001 | Iwamoto et al. |
| 2001/0041400 A1 | 11/2001 | Ren et al. |
| 2001/0041407 A1 | 11/2001 | Brown |
| 2001/0049167 A1 | 12/2001 | Madson |
| 2001/0050394 A1 | 12/2001 | Onishi et al. |
| 2002/0009832 A1 | 1/2002 | Blanchard |
| 2002/0014658 A1 | 2/2002 | Blanchard |
| 2002/0066924 A1 | 6/2002 | Blanchard |
| 2002/0070418 A1 | 6/2002 | Kinzer et al. |
| 2002/0088990 A1 | 7/2002 | Iwamoto et al. |
| 2002/0100933 A1 | 8/2002 | Marchant |
| 2002/0167020 A1 | 11/2002 | Iwamoto et al. |
| 2003/0060013 A1 | 3/2003 | Marchant |
| 2003/0100933 A1 | 5/2003 | Ayal et al. |
| 2003/0132450 A1 | 7/2003 | Minato et al. |
| 2003/0183858 A1 | 10/2003 | Kitagawa et al. |
| 2003/0193067 A1 | 10/2003 | Kim |
| 2003/0222327 A1 | 12/2003 | Yamaguchi et al. |
| 2004/0026735 A1 | 2/2004 | Suzuki et al. |
| 2004/0065921 A1 | 4/2004 | Iwamoto et al. |
| 2004/0108568 A1 | 6/2004 | Qu |
| 2004/0135228 A1 | 7/2004 | Iwamoto et al. |
| 2004/0232483 A1 | 11/2004 | Kitagawa et al. |
| 2005/0098826 A1 | 5/2005 | Yamaguchi et al. |
| 2005/0116313 A1 | 6/2005 | Lee et al. |
| 2005/0167742 A1 | 8/2005 | Challa et al. |
| 2005/0184336 A1 | 8/2005 | Takahashi et al. |
| 2005/0242411 A1 | 11/2005 | Tso |
| 2005/0250322 A1 | 11/2005 | Aida et al. |
| 2005/0280086 A1 | 12/2005 | Saito et al. |
| 2006/0006458 A1 | 1/2006 | Motai et al. |
| 2006/0033157 A1 | 2/2006 | Kitagawa et al. |
| 2006/0038226 A1 | 2/2006 | Kitagawa et al. |
| 2006/0043480 A1 | 3/2006 | Tsuchitani et al. |
| 2006/0043481 A1 | 3/2006 | Yamashita et al. |
| 2006/0138536 A1 | 6/2006 | Kouzuki et al. |
| 2006/0197152 A1 | 9/2006 | Tokano et al. |
| 2006/0214222 A1 | 9/2006 | Challa et al. |
| 2006/0216896 A1 | 9/2006 | Saito et al. |
| 2006/0231917 A1 | 10/2006 | Ono et al. |
| 2006/0284248 A1 | 12/2006 | Saito et al. |
| 2007/0001194 A1 | 1/2007 | Ono et al. |
| 2007/0018243 A1 | 1/2007 | Ono et al. |
| 2007/0023830 A1 | 2/2007 | Pfirsch et al. |
| 2007/0023831 A1 | 2/2007 | Kitagawa et al. |
| 2007/0029597 A1* | 2/2007 | Lee .................... H01L 29/0634 257/302 |
| 2007/0102773 A1 | 5/2007 | Hisatomi et al. |
| 2007/0120201 A1 | 5/2007 | Yamaguchi et al. |
| 2007/0138453 A1 | 6/2007 | Le |
| 2007/0138543 A1 | 6/2007 | Saito |
| 2007/0138546 A1 | 6/2007 | Kawamura et al. |
| 2007/0158740 A1 | 7/2007 | Yoshikawa et al. |
| 2007/0173021 A1 | 7/2007 | Kocon et al. |
| 2007/0181927 A1 | 8/2007 | Yedinak et al. |
| 2007/0272977 A1 | 11/2007 | Saito et al. |
| 2008/0038850 A1 | 2/2008 | Yamaguchi et al. |
| 2008/0265317 A1 | 10/2008 | Blanchard |
| 2009/0079002 A1 | 3/2009 | Lee et al. |
| 2009/0085100 A1 | 4/2009 | Iwamuro |
| 2010/0065908 A1 | 3/2010 | Moens et al. |
| 2010/0096692 A1* | 4/2010 | Saito .................... H01L 29/0634 257/330 |
| 2010/0123186 A1 | 5/2010 | Ohta et al. |
| 2010/0140698 A1 | 6/2010 | Roig-Guitart et al. |
| 2010/0200936 A1 | 8/2010 | Saito et al. |
| 2010/0314682 A1 | 12/2010 | Yilmaz et al. |
| 2011/0018055 A1 | 1/2011 | Ohta et al. |
| 2012/0273871 A1 | 11/2012 | Yedinak et al. |
| 2012/0273875 A1 | 11/2012 | Yedinak et al. |
| 2012/0273884 A1 | 11/2012 | Yedinak et al. |
| 2012/0273916 A1 | 11/2012 | Yedinak et al. |
| 2012/0276701 A1 | 11/2012 | Yedinak et al. |

FOREIGN PATENT DOCUMENTS

| | | |
|---|---|---|
| DE | 4300806 C1 | 12/1993 |
| DE | 4309764 A1 | 9/1994 |
| DE | 19736981 A1 | 8/1998 |
| EP | 0053854 A1 | 6/1982 |
| EP | 0114435 A1 | 8/1984 |
| EP | 0634798 A1 | 1/1995 |
| EP | 0975024 A2 | 1/2000 |
| EP | 1026749 A1 | 8/2000 |
| EP | 1054451 A2 | 11/2000 |
| EP | 1111685 A1 | 6/2001 |
| EP | 0747967 B1 | 2/2002 |
| EP | 1205980 A1 | 5/2002 |
| EP | 1114466 B1 | 7/2006 |
| EP | 1734565 A1 | 12/2006 |
| EP | 2530721 A1 | 12/2012 |
| GB | 2309336 A | 7/1997 |
| JP | 61-128554 A | 6/1986 |
| JP | 62-069562 A | 3/1987 |
| JP | 63-186475 A | 8/1988 |
| JP | 63-288047 A | 11/1988 |
| JP | 64-022051 A | 1/1989 |
| JP | 1-93169 A | 4/1989 |
| JP | 01-192174 A | 8/1989 |
| JP | 1-194364 A | 8/1989 |
| JP | 4-256370 A | 9/1992 |
| JP | 5-226638 A | 9/1993 |
| JP | 7-221116 A | 8/1995 |
| JP | 9-64352 A | 3/1997 |
| JP | 9-213938 A | 8/1997 |
| JP | 9-266311 A | 10/1997 |
| JP | 10-223896 A | 8/1998 |
| JP | 2000-040822 A | 2/2000 |
| JP | 2000-040872 A | 2/2000 |
| JP | 2000-156978 A | 6/2000 |
| JP | 2000-277726 A | 10/2000 |
| JP | 2000-277728 A | 10/2000 |
| JP | 2001-015448 A | 1/2001 |
| JP | 2001-015752 A | 1/2001 |
| JP | 2001-102577 A | 4/2001 |
| JP | 2001-111041 A | 4/2001 |
| JP | 2001-135819 A | 5/2001 |
| JP | 2001-144292 A | 5/2001 |
| JP | 2001-244461 A | 9/2001 |
| JP | 2001-313391 A | 11/2001 |
| JP | 2002-083976 A | 3/2002 |
| JP | 2002-280555 A | 9/2002 |
| JP | 2004-134714 A | 4/2004 |
| KR | 10-2005-0095385 A | 9/2005 |
| WO | 97/29518 A1 | 8/1997 |
| WO | 00/33386 A2 | 6/2000 |
| WO | 00/68997 A1 | 11/2000 |
| WO | 00/68998 A1 | 11/2000 |
| WO | 00/75965 A2 | 12/2000 |

(56) References Cited

FOREIGN PATENT DOCUMENTS

| WO | 01/06550 A1 | 1/2001 |
|---|---|---|
| WO | 01/06557 A1 | 1/2001 |
| WO | 01/45155 A1 | 6/2001 |
| WO | 01/59847 A2 | 8/2001 |
| WO | 01/71815 A2 | 9/2001 |
| WO | 01/88997 A2 | 11/2001 |
| WO | 01/95385 A1 | 12/2001 |
| WO | 01/95398 A1 | 12/2001 |
| WO | 02/01644 A2 | 1/2002 |
| WO | 02/47171 A1 | 6/2002 |
| WO | 03/085722 A2 | 10/2003 |
| WO | 2009/039441 A1 | 3/2009 |
| WO | 2012/149195 A1 | 11/2012 |

OTHER PUBLICATIONS

Shenai et al., "Monolithically Integrated Power MOSFET and Schottky Diode with Improved Reverse Recovery Characteristics", IEEE Transactions on Electron Devices, vol. 37, No. 4, Apr. 1990, pp. 1167-1169.
Shenoy et al., "Analysis of the Effect of Charge Imbalance on the Static and Dynamic Characteristic of the Super Junction MOSFET", IEEE International Symposium on Power Semiconductor Devices, 1999, pp. 99-102.
Singer, "Empty Spaces in Silicon (ESS): An Alternative to SOI", Semiconductor International, Dec. 1999, 42 pages.
Tabisz et al., "A MOSFET Resonant Synchronous Rectifier for High-Frequency De/De Converters", Proc. IEEE Power Electronics Specialist Conf. (PESC), 1990, pp. 769-779.
Takahashi et al., "20m'Ωcm2 660V Super Junction MOSFETs Fabricated by Deep Trench Etching and Epitaxial Growth", Proceedings of the 18th International Symposium on Power Semiconductor Devices & IC's, Jun. 4-8, 2006, 4 pages.
Takaya et al., "Floating Island and Thick Bottom Oxide Trench Gate MOSFET (FITMOS)—A 60V Ultra Low On-Resistance Novel MOSFET with Superior Internal Body Diode", Proceedings of the 17 International Symposium on Power Semiconductor Devices & IC's, May 23-26, 2005, pp. 43-46.
Tu et al., "On the Reverse Blocking Characteristics of Schottky Power Diodes", IEEE Transactions on Electron Devices, vol. 39, No. 12, Dec. 1992, pp. 2813-2814.
Udrea et al., "Ultra-High Voltage Device Termination Using the 3D RESURF (Super-Junction) Concept-Experimental Demonstration at 6.5 Kv", Proceedings of 2001 International Symposium on Power Semiconductor Devices & ICs, 2011, pp. 129-132.
Ueda et al., "An Ultra-Low On-Resistance Power MOSFET Fabricated by Using a Fully Self-Aligned Process", IEEE Transactions on Electron Devices, vol. 34, pp. 926-930.
Wilamowski, "Schottky Diodes with High Breakdown Voltages", Solid-State Electronics vol. 26, No. 5, 1983, pp. 491-493.
Wolf, "Silicon Processing for the VLSI Era", vol. 2, Process Integration Lattice Press, 1990, 3 pages.
Yamaguchi et al., "Breakthrough of on-resistance Si Limit by Super 3D MOSFET under 100V Breakdown Voltage", Proceedings of the 18th International Symposium on Power Semiconductor Devices & IC's, Jun. 4-8, 2006, 4 pages.
Yamashita et al., "Conduction Power Loss in MOSFET Synchronous Rectifier with Parallel-Connected Schottky Barrier Diode", IEEE Transactions on Power electronics, vol. 13, No. 4, Jul. 1998, pp. 667-673.
Yamauchi et al., "200V Super Junction MOSFET Fabricated by High Aspect Ratio Trench Filling", Proceedings of the 18th International Symposium on Power Semiconductor Devices & IC's, Jun. 4-8, 2006, 4 pages.
Yamauchi et al., "Electrical Properties of Super Junction p-n Diodes Fabricated by Trench Filling", IEEE 15th International Symposium on Power Semiconductor Devices and ICs, 2003, 4 pages.
Yamauchi et al., "Fabrication of High Aspect Ratio Doping Region by Using Trench Filling of Epitaxial Si Growth", Proceedings of 2001 International Symposium on Power Semiconductor Devices and ICs, 2001, pp. 363-366.
Yamauchi et al., "Influence of Trench Etching on Super Junction Devices Fabricated by Trench Filling", Proceedings of the 16th International Symposium on Power Semiconductor Devices & ICs, 2004, pp. 193-196.
Yamazaki et al., "Forward Transient Behavior of Pin and Super Junction Diodes", Proceedings of 2004 International Symposium on Power Semiconductor Devices and IC's, 2004, pp. 197-200.
Zhang et al., "Analysis of the Forward Biased Safe Operating Area of the Super Junction MOSFET", Proceedings of International Symposium on Power Semiconductor Devices and ICs, 2000. pp. 1-4.
Zingg, Rene P., "New Benchmark for RESURF, SoI and Super-Junction Power Devices", Proceedings of International Symposium on Power Semiconductor Devices and ICs, 2001, pp. 343-346.
Extended European Search Report received for European Patent Application No. 12777529.4, mailed on Nov. 20, 2014, 10 pages.
Curtis, et al., "APCVD TEOS: O3 Advanced Trench Isolation Applications", Semiconductor Fabtech 9th Edition, 1999, 8 pages.
Dalen et al., "Electrical Characterisation of Vertical Vapor Phase Doped (VPD) RESURF MOSFETs", Proceedings of 2004 International Symposium on Power Semiconductor Devices and ICs, 2004, pp. 451-454.
Darwish et al., "A New Power W-Gated Trench MOSFET (WMOSFET) with High Switching Performance", ISPSD Proceedings, Apr. 14-17, 2003, pp. 24-27.
Djekic et al., "High Frequency Synchronous Buck Converter for Low Voltage Applications", Proceedings of IEEE Power Electronics Specialist Confernce (PESC), 1998, pp. 1248-1254.
Fujihira, Tatsuhiko, "Theory of Semiconductor Superjunction Devices", Jpn. J. Appl. Phys., vol. 36, Part 1, No. 10, Oct. 1997, pp. 6254-6262.
Gan, et al., "Poly Flanked VDMOS (PFVDMOS): A Superior Technology for Superjunction Devices", IEEE Power Electronics Specialists Conference, Jun. 17-22, 2001, 4 pages.
Glenn, et al., "A Novel Vertical Deep Trench RESURF DMOS (VTR-DMOS)", IEEE ISPD, May 22-25, 2000, pp. 197-200.
Hatorri et al., "Shallow Angle Implantation for Extended Trench Gate Power Mosfets with Super Junction Structure", Proceedings of the 13th International Symposium on Power Semiconductor Devices and ICs, 2001, 4 pages.
Hattori et al., "Design of A 200V Super Junction Mosfet with N-Buffer Regions and its Fabrication By Trench Filling", Proceedings of 2004 International Symposium on Power Semiconductor Devices and ICs, pp. 189-192.
Henson et al., "Low Voltage Super Junction MOSFET Simulation and Experimentation", International Rectifier, May 2003, 4 pages.
Iwamoto et al., "Above 500V Class Superjunction MOSFETs Fabricated by Deep Trench Etching and Epitaxial Growth", Proceedings of the 17 International Symposium on Power Semiconductor Devices & IC's, May 23-26, 2005, 4 pages.
irf.com, "IR Develops CoolMOSa-Equivalent Technology, Positions It At the Top of a 3-Tiered Line of New Products for SMPS", available online at <http://www.irf.com/pressroom/pressreleases/nr990403.html>, Apr. 1999, 3 pages.
Kao et al., "Two Dimensional Thermal Oxidation of Silicon-I Experiments", IEEE Transactions on Electron Devices, vol. 34, No. 5, pp. 1008-1017.
Kao et al., "Two Dimensional Thermal Oxidation of Silicon-II. Modeling Stress Effects in Wet Oxides", IEEE Transactions on Electron Devices, vol. 35, No. 1, Jan. 1998, pp. 25-37.
Kassakian et al., "High-Frequency High-Density Converters for Distributed Power Supply Systems", Proceedings of the IEEE, vol. 76, No. 4, Apr. 1988, pp. 362-376.
Kodama et al., "Temperature Characteristics of a New 100V Rated Power MOSFET, VLMOS (vertical LOCOS MOS)", Proceedings of 2004 International Symposium on Power Semiconductor Devices and ICs, 2004, pp. 463-466.
Koops et al., "RESURF Stepped Oxide (RSO) MOSFET for 85V Having a Record-Low Specific On-Resistance", Proceedings of 2004 International Symposium on Power Semiconductor Devices and ICs, 2004, pp. 185-188.

(56) References Cited

OTHER PUBLICATIONS

Korman et al., "High Performance Power DMOSFET With Integrated Schottky Diode", Proc. IEEE Power Electronics Specialist Conf. (PESC), 1989, pp. 176-179.
Kunori et al., "120V Multi RESURF Junction Barrier Schottky Rectifier (MR-JBS)", Power Semiconductor Devices and ICs, 2002. Proceedings of the 14th International Symposium, 2002, 4 pages.
Kurosaki et al., "200V Multi RESURF Trench MOSFET (MR-TMOS)", Apr. 14-17, 2003, 4 pages.
Lorenz et al., "COOL MOS—An Important Milestone Towards a New Power MOSFET Generation", Power Conversion, May 1988, pp. 151-160.
Maksimovic et al., "Modeling and Simulation of Power Electronic Converters", Proceedings of the IEEE, vol. 89, No. 6, Jun. 2001, pp. 898-912.
Mehrotra et al., "Very Low Forward Drop Jbs Rectifiers Fabricated Using Submicron Technology", IEEE Transactions on Electron Devices, vol. 40, No. 11, Nov. 1993, pp. 2131-2132.
Minato et al., "Which is Cooler, Trench or Multi-Epitaxy? Cutting Edge Approach for the Silicon Limit by the Super Trench Power MOS-FET (STM)", The 12th International Symposium on Power Semiconductor Devices and ICs, Proceedings 2000, 4 pages.
Miura et al., "High Performance Superjunction UMOSFETs with Split P-Columns Fabricated by Multi-ion-Implantations", Proceedings of the 17 International Symposium on Power Semiconductor Devices & IC's, May 23-26, 2005, pp. 39-42.
Moghadam, "Delivering Value Around New Industry Paradigms", Technical Literature from Applied Materials, vol. 1, Issue 2, Nov. 1999, 15 pages.
Napoli et al., "Design Consideration of 1000 V merged PiN Schottky Diode Using Superjunction Sustaining Layer", Proceedings of the 13th International Symposium on Power Semiconductor Devices and ICs,Osaka2001, pp. 339-342.
Nassif-Khalil et al., "170V Super Junction-LDMOST in a 0.5 μm Commercial CMOS/SOS Technology", Proceedings on IEEE 15th International Symposium on Power Semiconductor Devices and ICs, 2003, 4 pages.
Ninomiya et al., "Ultra-Low On-Resistance 60-100 V Superjunction UMOSFETs Fabricated by Multiple Ion-Implantation", Proceedings of 2004 International Symposium on Power Semiconductor Devices and ICs, 2004, pp. 177-180.
Nitta et al., "Experimental Results and Simulation Analysis of 250V Super Trench Power MOSFET(STM)", ISPSD 2000, 8 pages.
Onishi et al., "24mΩcm2 680V Silicon Superjunction MOSFET", Proceedings of the 14th International Symposium on Power Semiconductor Devices and ICs, 2002, pp. 241-244.
Park et al., "Lateral Trench Gate Super-Junction SOI-LDMOSFETs with Low On-Resistance"Institute for Microelectronics, 2002, pp. 283-285.
Quddus et al., "Drain Voltage Dependence of on Resistance in 700V Super Junction LDMOS Transistor, Proceedings of 2004 International Symposium on Power Semiconductor Devices and ICs", 2004, pp. 201-204.
Rochefort et al., "A scalable trench etch based process for high voltage vertical RESURF MOSFETs", Proceedings of the 17 International Symposium on Power Semiconductor Devices & IC's, May 23-26, 2005, pp. 35-38.
Rochefort et al., "Manufacturing of High Aspect-Ratio p-n Junctions Using Vapor Phase Doping for Application in multi-Resurf devices", Proceedings of the 14th International Symposium on Power Semiconductor Devices and ICs, 2002, pp. 237-240.
Roig et al., "Electrical and Physical Characterization of 150-200V FLYMOSFETs", Proceedings of the 18th International Symposium on Power Semiconductor Devices & IC's, Jun. 4-8, 2006, 4 pages.
Rub et al., "550 V superjunction 3.9 Ωmm2 transistor formed by 25 MeV masked boron implantation", Proceedings of 2004 International Symposium on Power Semiconductor Devices and ICs, 2004, pp. 455-458.
Rub et al., "A 600V 8.7Ohmmm2 Lateral Superjunction Transistor", Proceedings of the 18th International Symposium on Power Semiconductor Devices & IC's, Jun. 4-8, 2006, 2 pages.
Rub et al., "First Study on Superjunction High-Voltage Transistors With N-Columns Formed by Proton Implantation and Annealing", Proceedings of 2004 International Symposium on Power Semiconductor Devices and ICs, 2004, pp. 181-184.
Saggio et al., "MDmeshTM: Innovative Technology for High Voltage PowerMOSFETs", Proceedings of 2000 International Symposium on Power Semiconductor Devices and ICs, 2000, 4 pages.
Saint-Eve et al., "Reliability of CoolMOSTM Under Extremely Hard Repetitive Electrical Working Conditions", IEEE 15th International Symposium on Power Semiconductor Devices and ICs, 2003, 4 pages.
Saito et al., "600V Semi-superjunction MOSFET", IEEE 15th International Symposium on Power Semiconductor Devices and ICs, 2003, 4 pages.
Saito et al., "A 15.5mΩcm2-680V Superjunction MOSFET Reduced On-Resistance by Lateral Pitch Narrowing", Proceedings of the 18th International Symposium on Power Semiconductor Devices & IC's, Jun. 4-8, 2006, 4 pages.
Saito et al., "A 20mΩcm2 600 V-Class Superjunction MOSFET", Proceedings of 2004 International Symposium on Power Semiconductor Devices and ICs, 2004, pp. 459-462.
Saitoh et al., "Ultra Low On-Resistance SBD with P-Buried Floating Layer", Proceedings of the 14th International Symposium on Power Semiconductor Devices and ICs, 2002, 4 pages.
Sakakibara et al., "Break-Through of the Si Limit Under 300V Breakdown Voltage with New Concept Power Device : Super 3D MOSFET", Proceedings of the 14th International Symposium on Power Semiconductor Devices and ICs, 2002, 4 pages.
Sakakibara et al., "Ultra Low On-resistance Super 3D MOSFET", Proceedings of the 16th International Symposium on Power Semiconductor Devices & ICs, 2004, pp. 39-43.
Sakai et al., "Experimental Investigation of Dependence of Electrical Characteristics of Device Parameters in Trench MOS Barrier Schottky Diodes", International Symposium on Power Semiconductors and ICs, Technical Digest, 1998, pp. 293-296.
Sapp et al., "Novel Low Capacitance VDMOS Device for Switching and RF Power Amplification", Proceedings of the 17 International Symposium on Power Semiconductor Devices & IC's, May 23-26, 2005, pp. 187-190.
Schmitt et al., "A Comparison of Electron, Proton and Helium Ion Irradiation for the Optimization of the CoolMOSTM Body Diode", Proceedings of the 14th International Symposium on Power Semiconductor Devices and ICs, 2002, 4 pages.
Cheng et al., "Improving the CoolMOSTM Body-Diode Switching Performance with Integrated Schottky Contacts", ISPSD '03 Proceedings. IEEE 15th International Symposium on Power Semiconductor Devices and ICs, 2003, 4 pages.
Cheng et al., "Fast Reverse Recovery Body Diode in High-Voltage VDMOSFET Using Cell-Distributed Schottky Contacts", IEEE Transactions on Electron Devices, vol. 50, No. 5, May 2003, pp. 1422-1425.
Chang et al., "Self-Aligned UMOSFET's with a Specific On-Resistance of 1 mΩ cm2", IEEE Transactions on Electron Devices, vol. 34, No. 11, Nov. 1987, pp. 2329-2334.
Buzzo et al., "Characterization of Unconventional Engineering Solutions for Superjunction Devices", Proceedings of the 18th International Symposium on Power Semiconductor Devices & IC's, Jun. 4-8, 2006, 4 pages.
Bulucea, "Trench DMOS Transistor Technology for High Current (100 A Range) Switching", Solid-State Electronics, vol. 34, No. 5, May 1991, pp. 493-507.
Brown et al., "Novel Trench Gate Structure Developments Set the Benchmark for Next Generation Power MOSFET Switching Performance", Power Electronics Proceedings of PCIM, vol. 47, May 2003, pp. 275-278.
Baur, Friedhelm, "The Mos Controlled Super Junction Transistor (SJBT): A New, Highly Efficient, High Power Semiconductor Device for Medium to High Voltage Applications", 2002, pp. 197-200.

(56) References Cited

OTHER PUBLICATIONS

Baliga et al., "Improving the Reverse Recovery of Power MOSFET Integral Diodes by Electron Irradiation," Solid State Electronics, vol. 26, No. 12, Dec. 1983, pp. 1133-1141.

Baliga, John, "Options for CVD of Dielectrics Include Low-k Materials", Technical Literature from Semiconductor International, Jun. 1998, 4 pages.

Baliga, B. Jayant, "New Concepts in Power Rectifiers," 1985, pp. 471-481.

Bai et al., "Novel Automated Optimization of Power Mosfet for 12v Input, High-Frequency DC-DC Converter," International Symposium on Power Semiconductors and ICs, Technical Digest, 2003, pp. 366-369.

Bai et al., "Junction Termination Technique for Super Junction Devices", Proceedings of the 12th International Symposium on Power Semiconductor Devices and Ics., 2000, 5 pages.

Saito et al., "Over 1000V Semi-Superjunction MOSFET with Ultra-Low On-Resistance blow the Si-Limit", Proceedings of the 17 International Symposium on Power Semiconductor Devices & IC's, May 23-26, 2005, pp. 27-30.

Technical Literature from Silicon Valley Group Thermal Systems, APNext, High Throughput APCVD Cluster Tool for 200 mm/300 mm Wafer Processing, (unknown date), 2 pages.

Technical Literature from Quester Technology, Model APT-6000 Atmospheric TEOS-Ozone CVD System, (unknown date), 2 pages.

Technical Literature from Quester Technology, Model APT-4300 300mm Atmospheric TEOS/Ozone CVD System, (unknown date), 3 pages.

"CoolMOSa the Second Generation," Infineon Technologies product information, 2000, 2 pages.

International Search Report and Written Opinion received for PCT Application No. PCT/US2012/35262, mailed on Sep. 24, 2012, 16 pages.

International Preliminary Report on Patentability received for PCT Application No. PCT/US2012/35262, mailed on Nov. 7, 2013, 17 pages.

\* cited by examiner

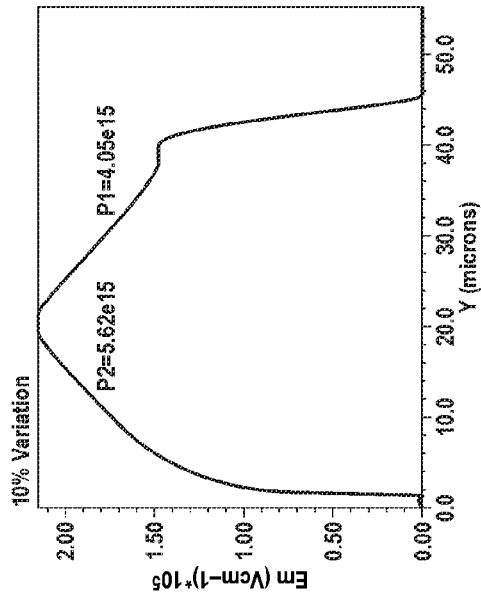
FIG. 7B
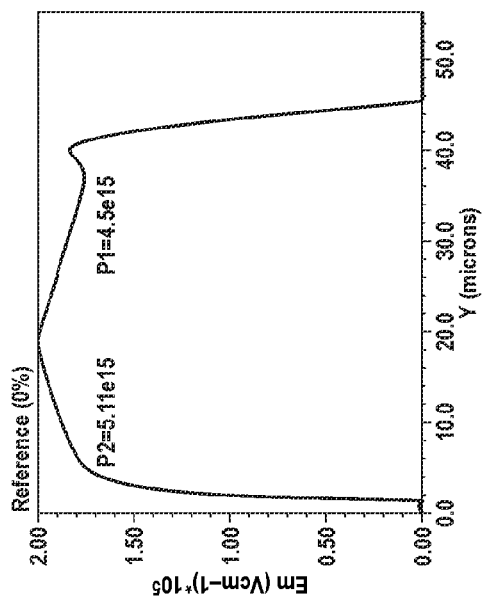
FIG. 7A
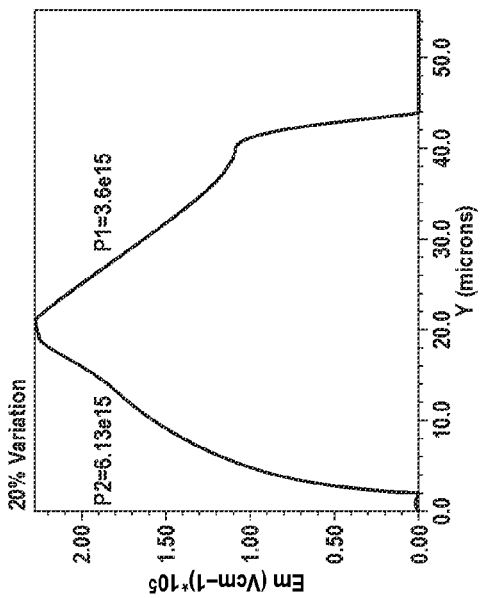
FIG. 7C
Control degree of E field concentration:
- t1 (epi 1 thickness) = t2 (epi 2 thickness) = 25 um
- N1 (epi 1 concentration) = N2 (epi 2 concentration) = 3.03e15cm$^{-3}$
|  | Bottom Pillar | | Top Pillar | | BV | Rsp |
| --- | --- | --- | --- | --- | --- | --- |
|  | N-Mesa | P-Fill | N-Mesa | P-Fill | | |
| 0% | 3.03E+15 | 4.50E+15 | 3.03E+15 | 5.11E+15 | 772 | 20.6 |
| 10% var. | 3.03E+15 | 4.05E+15 | 3.03E+15 | 5.62E+15 | 715 | 20.6 |
| 20% var. | 3.03E+15 | 3.60E+15 | 3.03E+15 | 6.13E+15 | 639 | 20.5 |
FIG. 7D

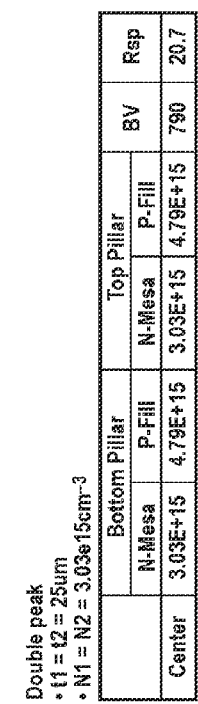
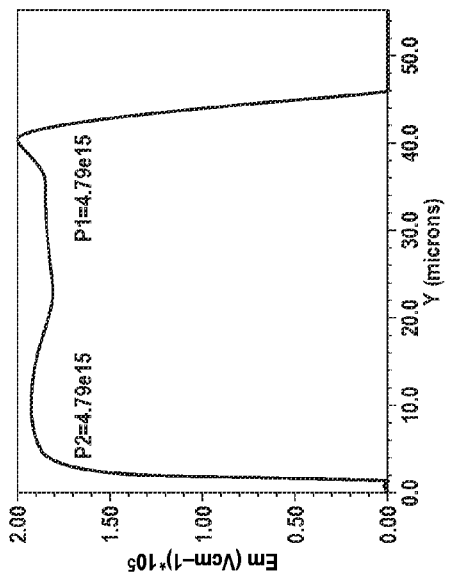
FIG. 9A
Double peak
- t1 = t2 = 25um
- N1 = N2 = 3.03e15cm⁻³
|  | Bottom Pillar | | Top Pillar | | BV | Rsp |
|---|---|---|---|---|---|---|
|  | N-Mesa | P-Fill | N-Mesa | P-Fill |  |  |
| Center | 3.03E+15 | 4.79E+15 | 3.03E+15 | 4.79E+15 | 790 | 20.7 |
FIG. 9B
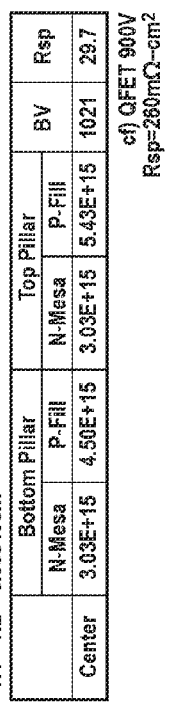
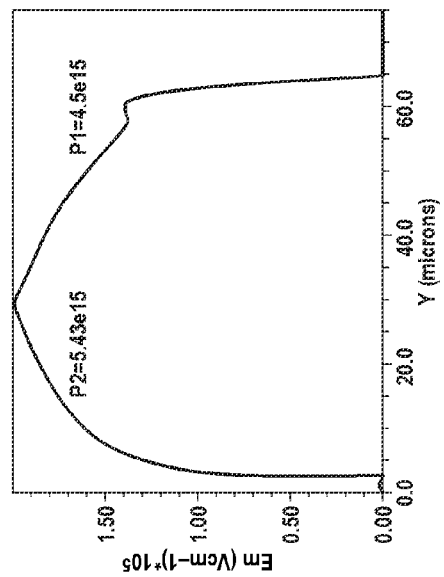
FIG. 10A
Can easily increase breakdown voltage
- t1 = t2 = 35um
- N1 = N2 = 3.03e15cm⁻³
|  | Bottom Pillar | | Top Pillar | | BV | Rsp |
|---|---|---|---|---|---|---|
|  | N-Mesa | P-Fill | N-Mesa | P-Fill |  |  |
| Center | 3.03E+15 | 4.50E+15 | 3.03E+15 | 5.43E+15 | 1021 | 29.7 |
cf) QFET 900V Rsp=260mΩ-cm²
FIG. 10B

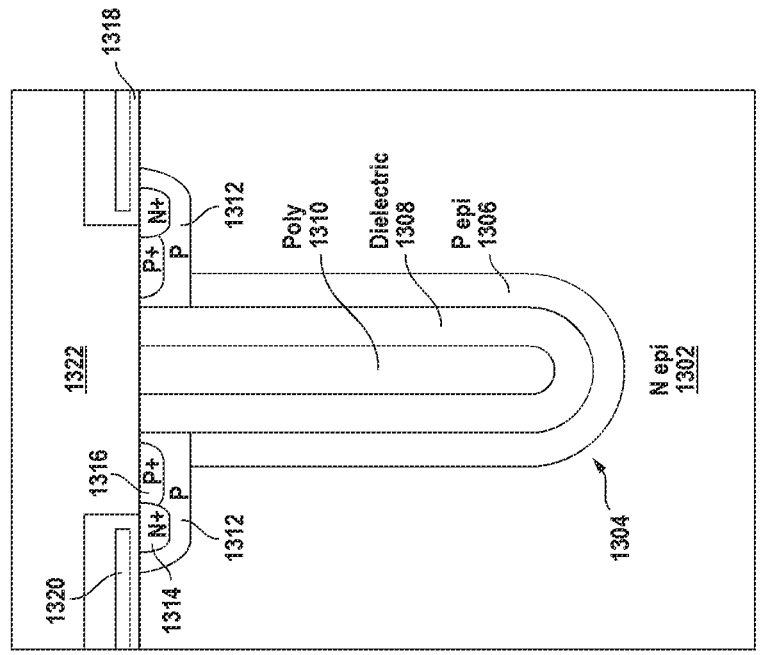
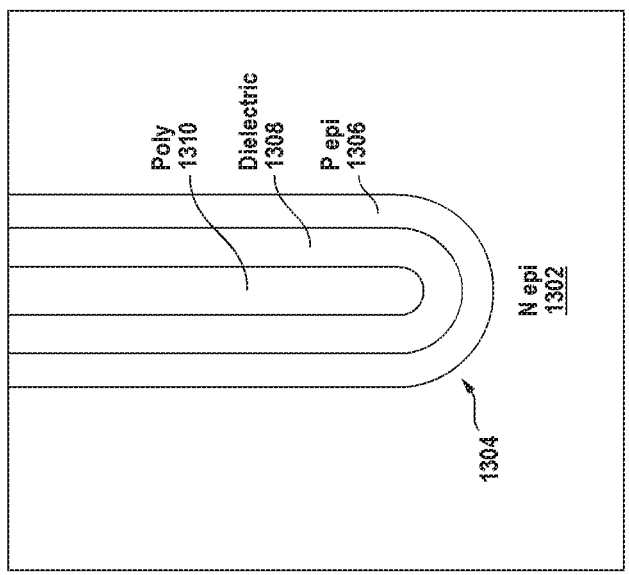
FIG. 13B
FIG. 13A

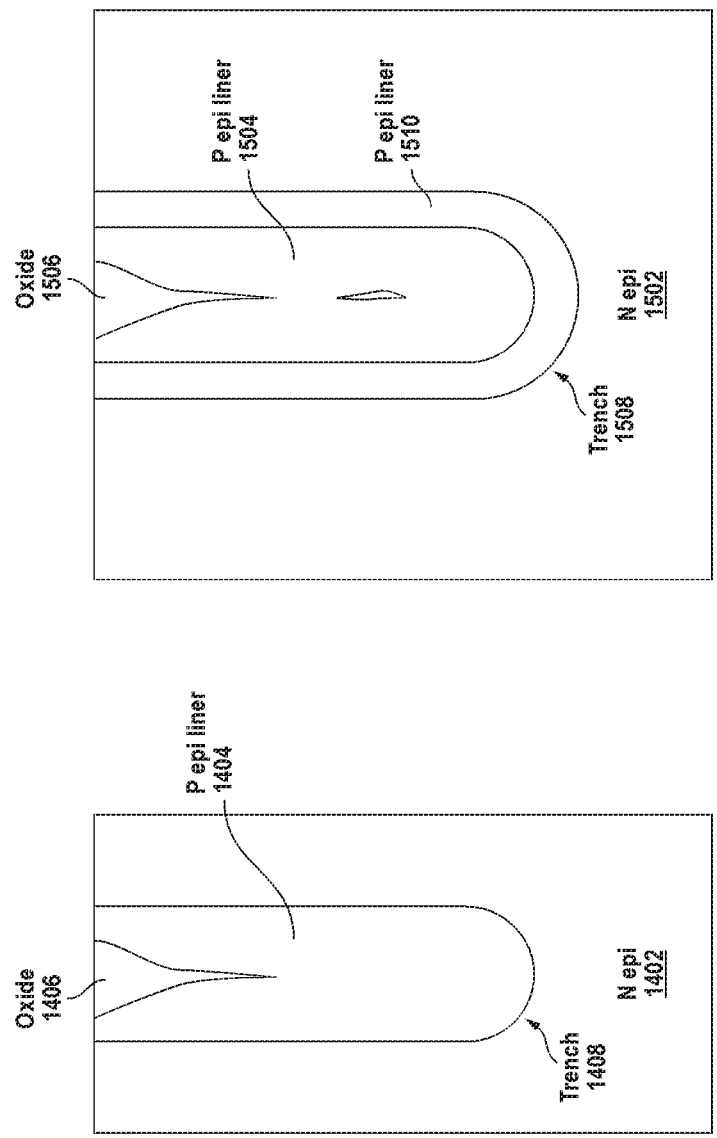

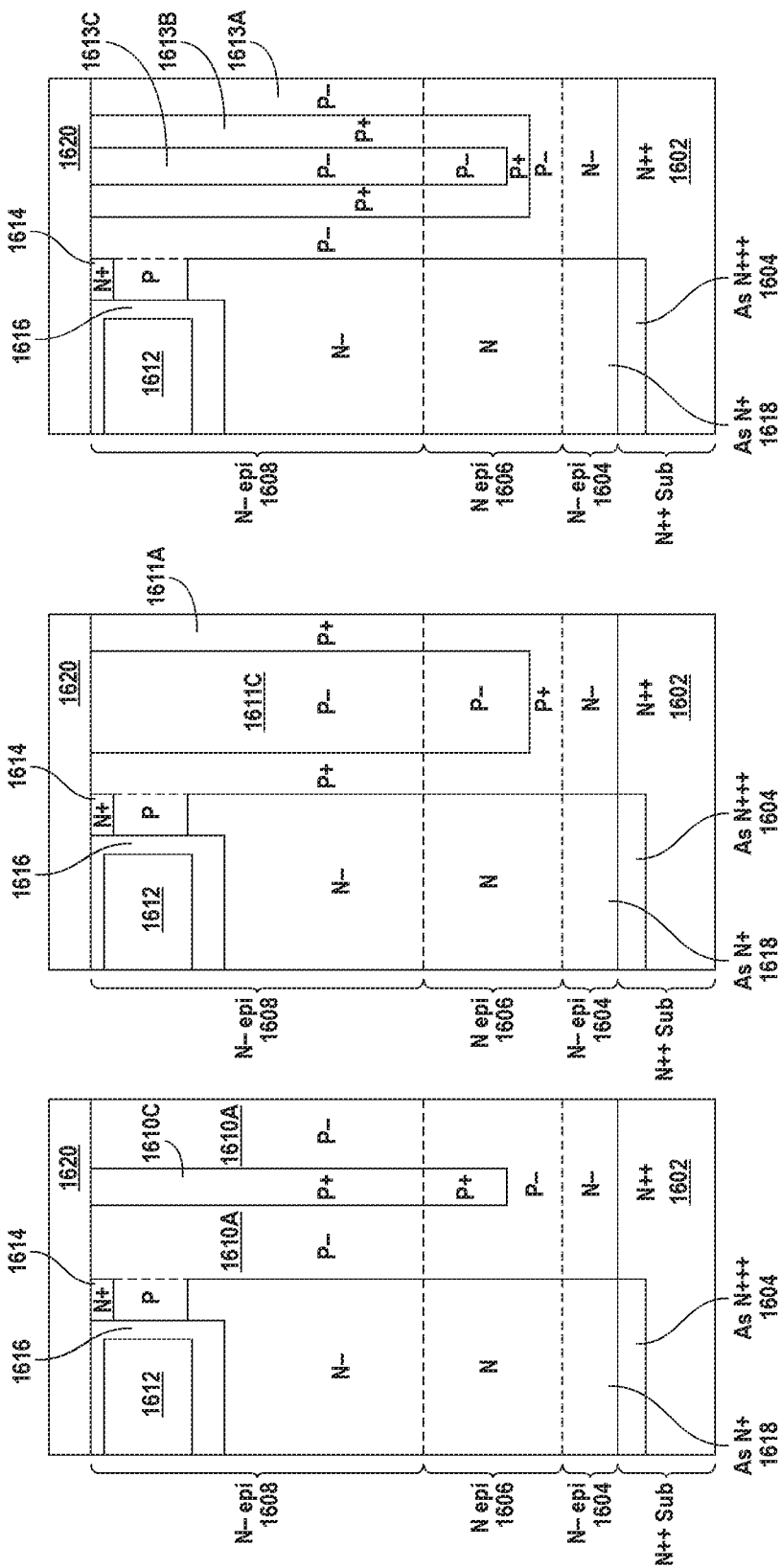

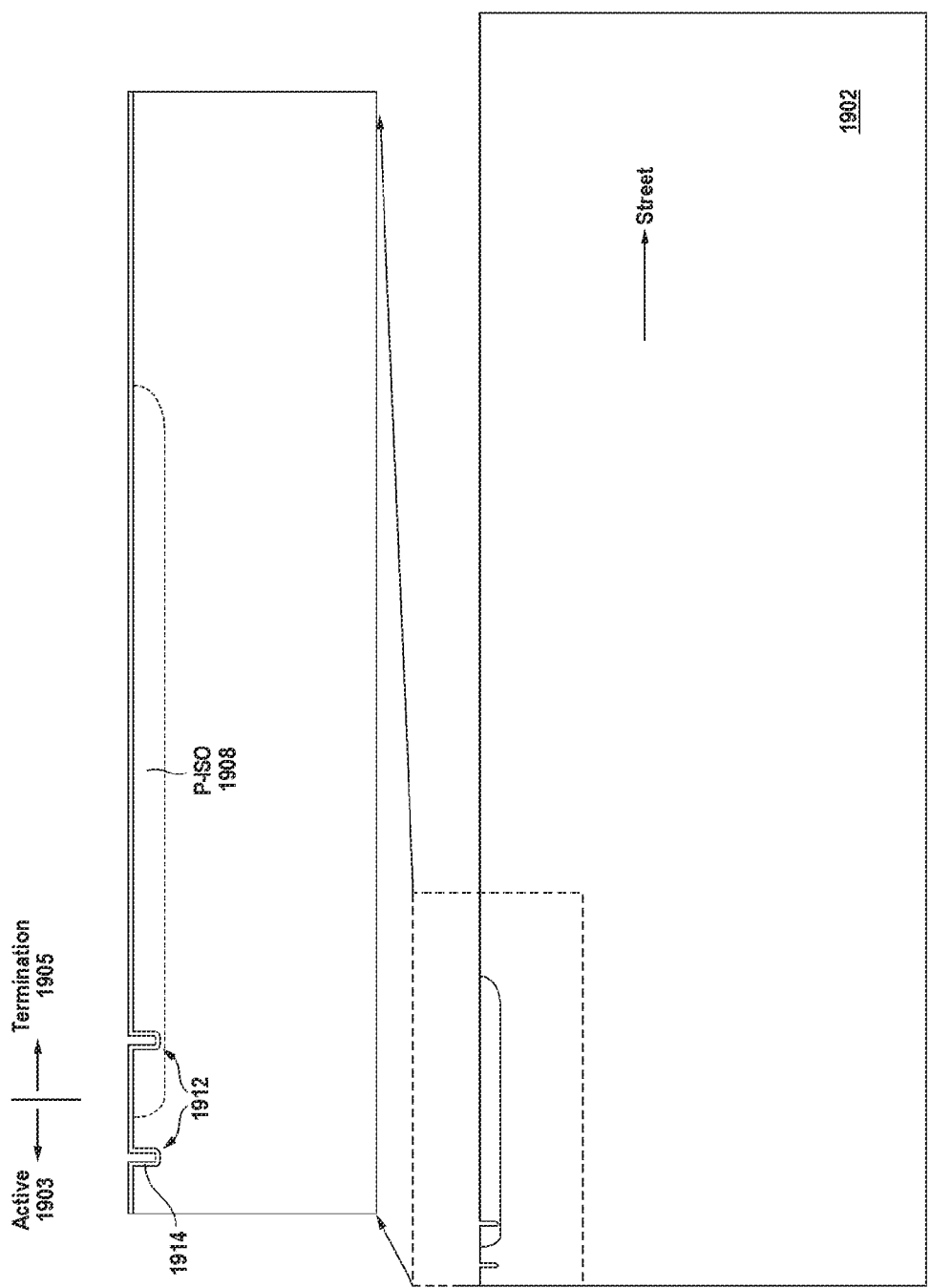

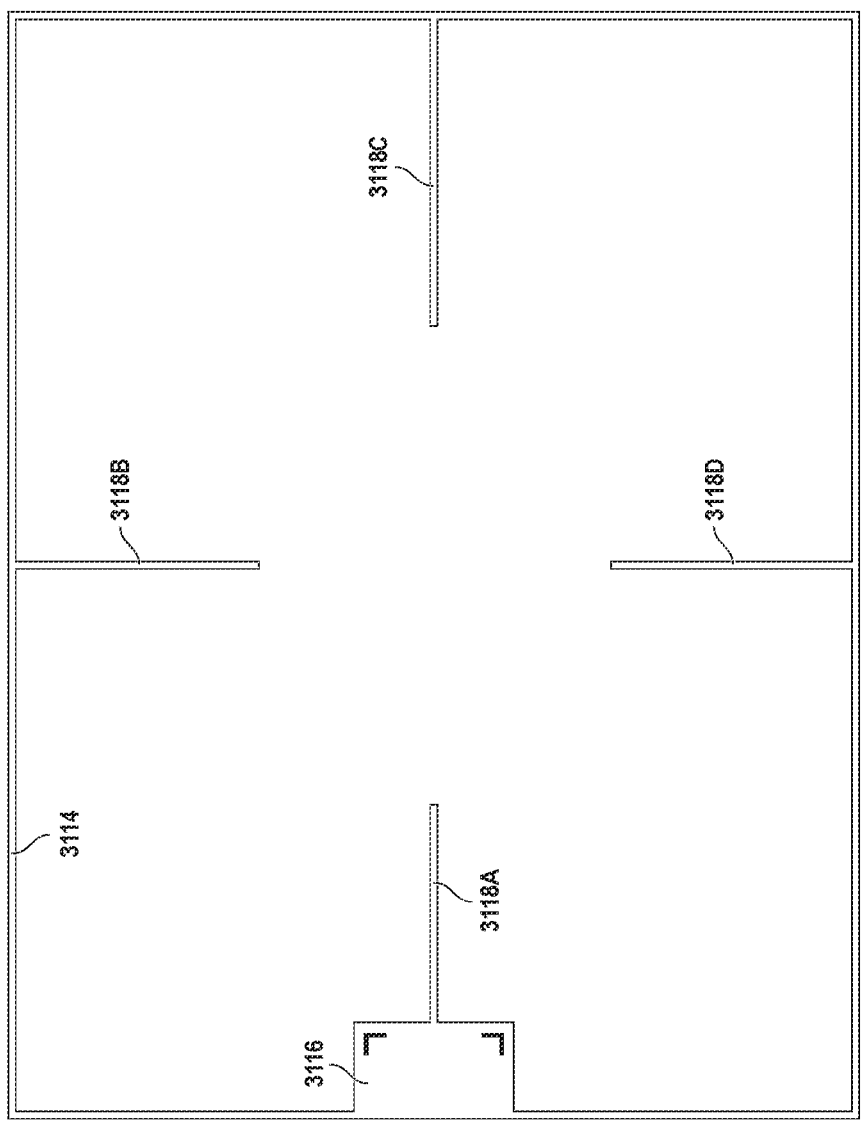

SUPERJUNCTION STRUCTURES FOR POWER DEVICES AND METHODS OF MANUFACTURE

CROSS-REFERENCE TO RELATED APPLICATIONS

The present application is a continuation of U.S. patent application Ser. No. 13/095,652, filed Apr. 27, 2011, which incorporates by reference the commonly assigned U.S. patent application Ser. No. 12/234,549, filed Sep. 19, 2008, entitled "Superjunction Structures for Power Devices and Methods of Manufacture," as if set forth in full in this document, for all purposes.

BACKGROUND

The present invention relates in general to semiconductor technology and in particular to power semiconductor devices such as transistors and diodes and their methods of manufacture.

The key component in power electronic applications is the solid-state switch. From ignition control in automotive applications to battery-operated consumer electronic devices, to power converters in industrial applications, there is a need for a power switch that optimally meets the demands of the particular application. Solid-state switches including, for example, the power metal-oxide-semiconductor field effect transistor (power MOSFET), the insulated-gate bipolar transistor (IGBT) and various types of thyristors and rectifiers have continued to evolve to meet this demand. In the case of the power MOSFET, for example, double-diffused structures (DMOS) with lateral channel (e.g., U.S. Pat. No. 4,682,405 to Blanchard et al.), trenched gate structures (e.g., U.S. Pat. No. 6,429,481 to Mo et al.), and various techniques for charge balancing in the transistor drift region (e.g., U.S. Pat. No. 4,941,026 to Temple, U.S. Pat. No. 5,216,275 to Chen, and U.S. Pat. No. 6,081,009 to Neilson) have been developed, among many other technologies, to address the differing and often competing performance requirements.

Some of the defining performance characteristics for the power switch are its on-resistance, breakdown voltage and switching speed. Depending on the requirements of a particular application, a different emphasis is placed on each of these performance criteria. For example, for power applications greater than about 300-400 volts, the IGBT exhibits an inherently lower on-resistance as compared to the power MOSFET, but its switching speed is lower due to its slower turn off characteristics. Therefore, for applications greater than 400 volts with low switching frequencies requiring low on-resistance, the IGBT is the preferred switch while the power MOSFET is often the device of choice for relatively higher frequency applications. If the frequency requirements of a given application dictate the type of switch that is used, the voltage requirements determine the structural makeup of the particular switch. For example, in the case of the power MOSFET, because of the proportional relationship between the drain-to-source on-resistance Rds-on and the breakdown voltage, improving the voltage performance of the transistor while maintaining a low Rds-on poses a challenge. Various charge balancing structures in the transistor drift region have been developed to address this challenge with differing degrees of success.

Device performance parameters are also impacted by the fabrication process. Attempts have been made to address some of these challenges by developing a variety of improved processing techniques.

Whether it is in ultra-portable consumer electronic devices or routers and hubs in communication systems, the varieties of applications for the power switch continue to grow with the expansion of the electronic industry. The power switch therefore remains a semiconductor device with high development potential.

BRIEF SUMMARY

In accordance with one aspect of the invention, a power device includes a semiconductor region which in turn includes a plurality of alternately arranged pillars of first and second conductivity type. Each of the plurality of pillars of second conductivity type further includes a plurality of implant regions of the second conductivity type arranged on top of one another along the depth of pillars of second conductivity type, and a trench portion filled with semiconductor material of the second conductivity type directly above the plurality of implant regions of second conductivity type.

In accordance with another aspect of the invention, a power device includes: an active region and a termination region surrounding the active region, and a plurality of pillars of first and second conductivity type alternately arranged in each of the active and termination regions, each of the plurality of pillars of second conductivity type in the active and termination regions further including a plurality of implant regions of the second conductivity type arranged on top of one another along the depth of the pillars of second conductivity type, and a trench portion filled with semiconductor material of the second conductivity type directly above the plurality of implant regions of second conductivity type.

In accordance with another aspect of the invention, a method for forming pillars of alternating conductivity type in a power device includes: forming a plurality of epitaxial layers of a first conductivity type over a substrate; forming a plurality of implant regions of a second conductivity type in each of a predetermined number of the plurality of epitaxial layers; forming trenches extending into the uppermost one of the plurality of epitaxial layers; and filling the trenches with semiconductor material of the second conductivity type, wherein the plurality of implant regions of second conductivity type in the predetermined number of the plurality of epitaxial layers are vertically aligned with corresponding ones of the trenches so that the semiconductor material filling the trenches together with the plurality of implant regions of second conductivity type in the predetermined number of the plurality of epitaxial layers form a plurality of pillars of second conductivity type, and those portions of the plurality of epitaxial layers separating the plurality of pillars of second conductivity type from one another form a plurality of pillars of first conductivity type.

In accordance with another aspect of the invention, a method for forming pillars of alternating conductivity type in a power device includes: forming a first epitaxial layer of a first conductivity type over a substrate; forming a lower portion of a plurality of deep trenches in the first epitaxial layer; filling the lower portion of the plurality of deep trenches with semiconductor material of a second conductivity type; forming a second epitaxial layer of first conductivity type over the first epitaxial layer; forming an upper portion of the plurality of deep trenches in the second epitaxial layer directly over the lower portion of the plurality of deep trenches so that each lower portion and a corresponding upper portion of the plurality of deep trenches together form one of the plurality of deep trenches; and filling the upper portion of the plurality of deep trenches with semiconductor material of second conductivity type, wherein the semiconductor material filling the lower and upper portions of the plurality of deep trenches form a plurality of pillars of second conductivity type, and those portions of the first and second epitaxial layers separating the plurality of pillars of second conductivity type from one another form a plurality of pillars of first conductivity type.

In accordance with another aspect of the invention, a method for forming a power field effect transistor includes: forming an N-type epitaxial layer over a substrate; forming one or more P-type epitaxial layers over the N-type epitaxial layer; forming a plurality of trenches extending through the one or more P-type epitaxial layers; filling the plurality of trenches with N-type semiconductor material; forming P-type body regions in the one or more P-type epitaxial layers; forming N-type source regions in the P-type body regions; and forming gate electrodes adjacent to but insulated from the P-type body regions and the N-type semiconductor material, the gate electrodes overlapping with the N-type source regions, wherein the plurality of trenches filled with N-type semiconductor material form N-pillars, and those portions of the one or more P-type epitaxial layers separating the N-pillars form P-pillars.

In accordance with another aspect of the invention, a power field effect transistor (FET) includes: an N-type epitaxial layer over a substrate; one or more P-type epitaxial layers over the N-type epitaxial layer; a plurality of trenches extending through the one or more P-type epitaxial layers, the plurality of trenches being filled with N-type semiconductor material; P-type body regions in the one or more P-type epitaxial layers; N-type source regions in the P-type body regions; and gate electrodes adjacent to but insulated from the P-type body regions and the N-type semiconductor material, the gate electrodes overlapping with the N-type source regions, wherein the plurality of trenches filled with N-type semiconductor material form N-pillars, and those portions of the one or more P-type epitaxial layers separating the N-pillars form P-pillars.

In accordance with another aspect of the invention, a method for forming a power field effect transistor includes: forming one or more epitaxial layers of a first conductivity type over a substrate; forming a plurality of lower trenches extending through the one or more epitaxial layers; filling the plurality of lower trenches with semiconductor material of a second conductivity type; forming one or more epitaxial layers of the second conductivity type over the one or more epitaxial layers of first conductivity type; forming a plurality of upper trenches extending through the one or more epitaxial layers of the second conductivity type; filling the plurality of upper trenches with semiconductor material of the second conductivity type, wherein the plurality of lower trenches and the plurality of upper trenches are off-set from one another along the lateral dimension.

In accordance with another aspect of the invention, a power field effect transistor (FET) includes a semiconductor region including a plurality of alternately arranged pillars of first and second conductivity type, wherein each of the pillars of the first conductivity type has a middle section that is wider than its upper and lower sections, and each of the pillars of the second conductivity type has a middle section that is narrower than its upper and lower sections.

In accordance with another aspect of the invention, a method for forming a super-junction structure in a power device includes: forming one or more epitaxial layers of a first conductivity type over a substrate; forming a plurality of trenches extending in the one or more epitaxial layers; lining the sidewalls and bottom of the trenches with a an epitaxial layer of a second conductivity type; forming a dielectric layer in the plurality of trenches over the epitaxial layer of second conductivity type; and filling the plurality of trenches with conformal material.

In accordance with another aspect of the invention, a method for forming a super-junction structure in a power device includes: forming one or more epitaxial layers of a first conductivity type over a substrate; forming a plurality of trenches extending in the one or more epitaxial layers; filling each trench with an epitaxial layer of a second conductivity type such that only a center portion of each trench along the top of the trench remains unfilled; and filling the center portion of each trench along the top of the trench with a dielectric material.

In accordance with another aspect of the invention, a method for forming a super-junction structure in a power device includes: forming one or more epitaxial layers of a first conductivity type over a substrate; forming a plurality of trenches extending in the one or more epitaxial layers; lining sidewalls and bottom of the plurality of trenches with a first epitaxial layer of a second conductivity type; filling each trench with a second epitaxial layer of the second conductivity type such that only a center portion of each trench along the top of the trench remains unfilled; and filling the center portion of each trench along the top of the trench with a dielectric material.

In accordance with another aspect of the invention, a power device includes a plurality of trenches extending in one or more epitaxial layers of a first conductivity type, the plurality of trenches being filled with a first epitaxial layer of a second conductivity type, a second epitaxial layer of the second conductivity type, and a layer of insulating material, the first epitaxial layer lining the trench sidewalls and bottom, the second epitaxial layer extending over and being in direct contact with the first epitaxial layer, and the layer of insulating material extending over and being in direct contact with the second epitaxial layer, the first epitaxial layer, the second epitaxial layer, and the third layer of insulating material in each trench forming a pillar of second conductivity type, and those portions of the one or more epitaxial layers separating the pillars of second conductivity type forming pillars of first conductivity type such that the pillars of first and second conductivity type form pillars of alternating conductivity type.

In accordance with another aspect of the invention, a power device includes at least first and second N-type epitaxial layers extending over a substrate, and a plurality of trenches extending in the second N-type epitaxial layer, the plurality of trenches being filled with a first epitaxial layer, a second P-type epitaxial layer, and a third layer of conductive material, the first epitaxial layer lining the trench sidewalls and bottom, the second P-type epitaxial layer extending over and being in direct contact with the first epitaxial layer, and the third layer of conductive material extending over and being in direct contact with the second P-type epitaxial layer, the first epitaxial layer, the second P-type epitaxial layer, and the third layer of conductivity type in each trench forming a P-pillar, and those portions of the at least first and second N-type epitaxial layers separating the P-pillars forming N-pillars such that the P-pillars and the N-pillars form pillars of alternating conductivity type.

In accordance with another aspect of the invention, a method for forming pillars of alternating conductivity type in a power device includes: forming at least first and second N-type epitaxial layers over a substrate; forming a plurality of trenches extending in the second epitaxial layer; and filling the plurality of trenches with a first epitaxial layer, second P-type epitaxial layer, and a third layer of conductive material, the first epitaxial layer lining the trench sidewalls and bottom, the second P-type epitaxial layer extending over and being in direct contact with the first epitaxial layer, and the third layer of conductive material extending over and being in direct contact with the second P-type epitaxial layer, the first epitaxial layer, the second P-type epitaxial layer and the third layer of conductive material in each trench forming a P-pillar, those portions of the at least first and second N-type epitaxial layers separating the P-pillars forming N-pillars such that the P-pillars and the N-pillars form pillars of alternating conductivity type.

In accordance with another aspect of the invention, a power device includes: one or more N-type epitaxial layers extending over a substrate; a plurality of trenches extending into the one or more N-type epitaxial layers, the plurality of trenches being filled with P-type silicon material, the P-type silicon material in the plurality of trenches forming P-pillars, those portions of the one or more N-type epitaxial layers separating the P-pillars forming N-pillars such that the N-pillars and the P-pillars form alternating P-N-pillars; and an active region and a termination region surrounding the active region, wherein the alternating P-N-pillars are disposed in both the active region and the termination region, the termination region includes a predetermined number of floating P-pillars, and each N-pillar located between two adjacent ones of the predetermined number of floating P-pillars includes a N-type surface region along its upper surface, the N-type surface region having a lower doping concentration than the rest of the N-pillar in which it is formed.

In accordance with another aspect of the invention, a power device includes: one or more N-type epitaxial layers extending over a substrate; a plurality of trenches extending into the one or more N-type epitaxial layers, the plurality of trenches being filled with P-type silicon material, the P-type silicon material in the plurality of trenches forming P-pillars, those portions of the one or more N-type epitaxial layers separating the P-pillars forming N-pillars such that the N-pillars and the P-pillars form alternating P-N-pillars; an active region and a termination region surrounding the active region, wherein the alternating P-N-pillars are disposed in both the active region and the termination region, the alternating P-N-pillars in the termination region surround the active region in a concentric fashion and include a predetermined number of floating P-pillars, each floating P-pillar includes a P-type ring along its top; a plurality of field plates disposed in the termination region over but insulated from the one or more N-type epitaxial layers, the plurality of field plates surround the active region in a concentric fashion; and a plurality of contacts configured so that each of the plurality of contacts makes contact between one of the plurality of field plates and one or more of the P-type rings, the plurality of contacts being disposed directly above a corresponding one of the predetermined number of floating P-pillars.

In accordance with another aspect of the invention, a power device includes an active region surrounded by a termination region, and a plurality of trenches extending into one or more epitaxial layers of a first conductivity type, the plurality of trenches being filled with silicon material of a second conductivity type, the silicon material of a second conductivity type in the plurality of trenches together with portions of the one or more epitaxial layers separating the plurality of trenches from one another forming a plurality of concentric octagon-shaped pillars of alternating conductivity type extending through the active region and the termination region, wherein four of the eight legs of each of the plurality of concentric octagon-shaped pillars have a different length than the other four legs, and sidewalls of the plurality of trenches along all eight legs of the plurality of concentric octagon-shaped pillars have the same plane direction.

In accordance with another aspect of the invention, a method of forming a power device having an active region surrounded by a termination region, the method comprising: forming a plurality of trenches in one or more epitaxial layers of a first conductivity type; and filling the plurality of trenches with silicon material of a second conductivity type, the silicon material of a second conductivity type in the plurality of trenches together with portions of the one or more epitaxial layers separating the plurality of trenches from one another forming a plurality of concentric octagon-shaped pillars of alternating conductivity type extending through the active region and the termination region, wherein four of the eight legs of each of the plurality of concentric octagon-shaped pillars have a different length than the other four legs, and sidewalls of the plurality of trenches along all eight legs of the plurality of concentric octagon-shaped pillars have the same plane direction.

In accordance with another aspect of the invention, a power device includes an active region surrounded by a termination region, a plurality of stripe-shaped pillars of alternating conductivity type extending through the active region, and a plurality of octagon-shaped pillars of alternating conductivity type extending through the termination region in a concentric fashion, surrounding the active region.

In accordance with another aspect of the invention, a power device includes: an active region surrounded by a termination region; a plurality of pillars of alternating conductivity type arranged in a concentric fashion in the active and termination regions; a plurality of polysilicon gates arranged in concentric fashion in the active region; an outer metal gate runner extending along an outer perimeter of the termination region in a concentric fashion, the outer metal gate runner being connected to a gate pad; and a plurality of supplementary metal gate runners directly connected to the outer metal gate runner, and extending from the outer metal gate runner toward a center of the active region but terminating before reaching the center of the active region, wherein a first group of the plurality of the polysilicon gates directly connects to all of the plurality of supplementary metal gate runners, and a second group of the plurality of the polysilicon gates directly contact only two of the plurality of supplementary metal gate runners.

In accordance with another aspect of the invention, a power device includes: an active region and a termination region surrounding the active region; a plurality of pillars of alternating conductivity type arranged in a concentric fashion in both the active and the termination regions; a plurality of polysilicon gate stripes extending through the active and termination regions; and a gate runner metal extending along an outer perimeter of the termination region, the plurality of polysilicon stripes connecting to the gate runner metal along their opposite ends.

In accordance with another aspect of the invention, a method for forming pillars of alternating conductivity type in a power device, the method comprising: forming one or more N-type epitaxial layers over a substrate; forming P-type body regions in the one or more N-type epitaxial layers; forming gate electrodes extending adjacent to but being insulated from the one or more N-type epitaxial layers by a gate dielectric; after forming the P-type body regions and the gate electrodes, forming a plurality of deep trenches extending in the one or more N-type epitaxial layers; and filling the plurality of deep trenches with P-type silicon to form a plurality of P-pillars, those portions of the one or more N-type epitaxial layers separating the plurality of P-pillars forming N-pillars such that the P-pillars and the N-pillars form pillars of alternating conductivity type.

In accordance with another aspect of the invention, a high voltage device includes: one or more N-type epitaxial layers extending over a substrate; a plurality of trenches extending into the one or more N-type epitaxial layers, the plurality of trenches being filled with P-type silicon material, the P-type silicon material in the plurality of trenches forming P-pillars, those portions of the one or more N-type epitaxial layers separating the P-pillars forming N-pillars such that the N-pillars and the P-pillars form alternating P-N-pillars; a plurality of P-wells each formed in an upper portion of one of the P-pillars; and an anode terminal comprising a Schottky barrier metal directly contacting a top surface of the N-pillars to form a Schottky contact therebetween, the Schottky barrier metal further directly contacting the P-wells.

In accordance with another aspect of the invention, a high voltage device includes: one or more N-type epitaxial layers extending over a substrate; a plurality of trenches extending into the one or more N-type epitaxial layers, the plurality of trenches being filled with P-type silicon material, the P-type silicon material in the plurality of trenches forming P-pillars, those portions of the one or more N-type epitaxial layers separating the P-pillars forming N-pillars such that the N-pillars and the P-pillars form alternating P-N pillars; an N-type epitaxial layer extending over the alternating P-N Pillars; and an anode terminal comprising a Schottky barrier metal directly contacting a top surface of the N-type epitaxial layer to form a Schottky contact therebetween, the N-type epitaxial layer separating the Schottky barrier metal from the P-pillars so that the P-pillars float.

BRIEF DESCRIPTION OF THE DRAWINGS

FIGS. 7A-7D, 8A-8D, 9A-9B and 10A-10B are simulation results illustrating the impact of various process parameters on the degree of electric field concentration along the trench depth;

FIGS. 13A-13B are simplified cross section views showing a three step trench fill process used in forming a super junction device that is free of voids;

FIGS. 14 and 15 show simplified cross section views of superjunction power devices which minimizes formation of voids in the trench fill process;

FIGS. 16A-16C, 17 and 18 are simplified cross section views showing various embodiments of super-junction devices with pillars of alternating conductivity type;

FIGS. 19A-19L are simplified cross section views showing various stages of a process for forming a super junction trench-gate MOSFET;

FIG. 31A shows a top layout view of a fully concentric design with a gate runner design that provides a more balanced gate propagation delay throughout the die;

DETAILED DESCRIPTION

The power switch can be implemented by any one of power MOSFET, IGBT, various types of thyristors and rectifiers and the like. Many of the novel techniques presented herein are described in the context of the power MOSFET and Schottky rectifiers for illustrative purposes. It is to be understood however that the various embodiments of the invention described herein are not limited to the power MOSFET and Schottky rectifiers and can apply to many of the other types of power switch technologies, including but not limited to, for example, IGBTs and other types of bipolar switches and various types of thyristors and rectifiers. Further, for the purposes of illustration, the various embodiments of the invention are shown to include specific P and N type regions (e.g., for an n-channel MOSFET). It is understood by those skilled in the art that the teachings herein are equally applicable to devices in which the conductivities of the various regions are reversed.

Figure 1A:
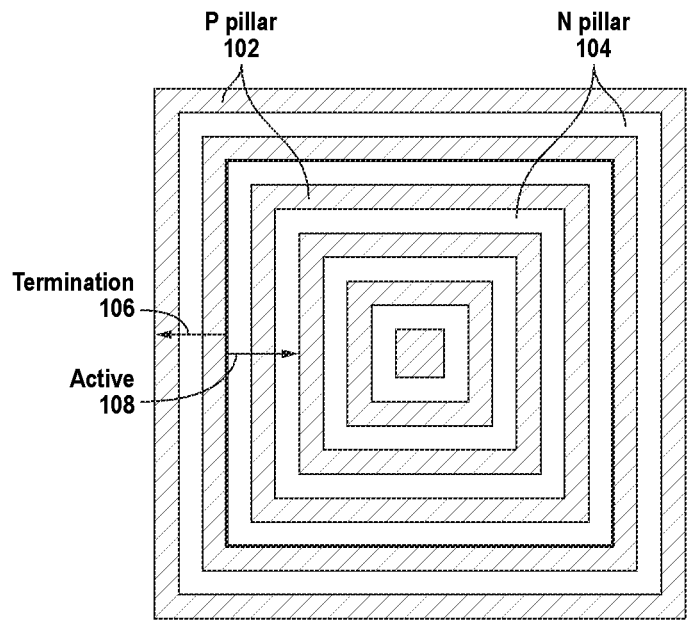
FIGS. 1A-1C show three different layout configurations for a superjunction power devices.
Figure 1B:
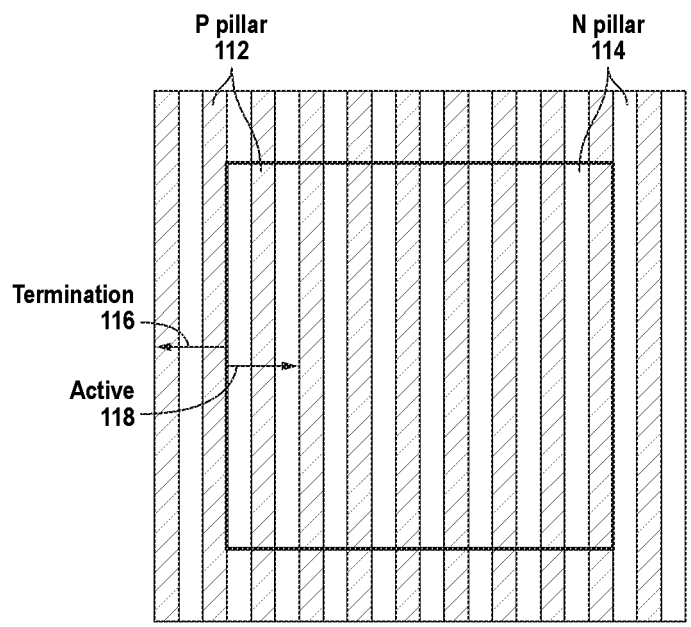
Figure 1C:
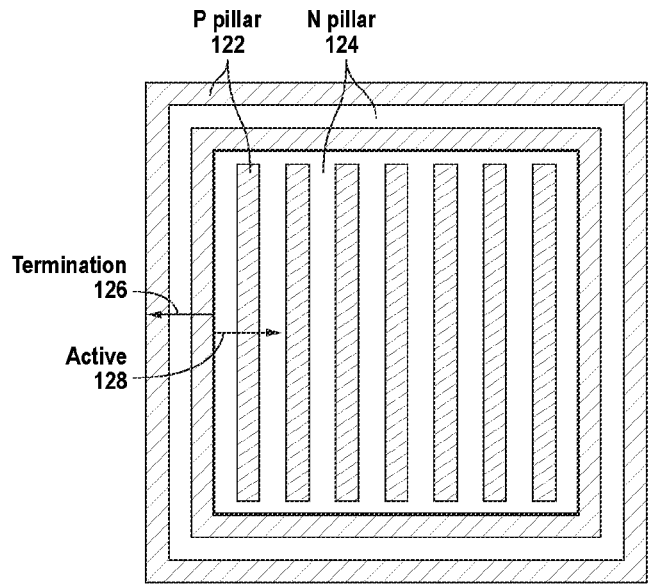

In the super junction technology, the alternating P/N-pillars in the active and termination regions may be arranged in a number of different layout configurations. FIGS. 1A-1C show three such layout configurations. In FIG. 1A, P/N-pillars 102 and 104 in both active region 108 and termination region 106 are arranged in a concentric configuration (hereinafter referred to as "full concentric" configuration); in FIG. 1B, P/N-pillars 112 and 114 in both active region 118 and termination region 116 are arranged in a parallel (or striped) configuration (hereinafter referred to as "full parallel" configuration); and in FIG. 1C, P/N-pillars 122 and 124 in active region 128 are arranged in a parallel (or striped) configuration, and P/N-pillars 122 and 124 in termination region 126 are arranged in a concentric configuration (hereinafter referred to as "parallel-concentric" configuration). Each of these layout configurations has its own merits and drawbacks. Some of the inventions and embodiments described herein address various drawbacks of these layout configurations.

The full concentric configuration in FIG. 1A enjoys uniform charge balance throughout active region 108 and termination region 106, but the active channel area may be reduced because the gate feeds must extend into the interior of active area 108 to feed the concentric active polysilicon gates. The channel may need to be removed at the corners to eliminate areas of lower threshold voltage and prevent parasitic NPN turn-on. Thus, as the die size is reduced, the penalty in on-resistance (Rds-on) attributed to these corners in the active area may become greater.

The full parallel configuration in FIG. 1B also enjoys uniform charge balance throughout the active and termination regions but without the Rds-on penalty of the full concentric configuration. However, the P/N-pillar design in the full parallel configuration may be limited to an N-rich balance condition to insure that the P-pillars extending out into termination area 116 from active area 118 become fully depleted somewhere along their length. By using concentric pillars for the termination, as in FIG. 1C, the electric field can be distributed across the termination region without full pillar depletion.

In the design where pillars (e.g., P-pillars) are formed using a trench etch and fill process, corners of the concentric pillars may be difficult to etch and fill resulting in voids in the epi fill that cause charge imbalance. These corners may thus become areas of high electric field stress. If they are shorted to source potential, either of the FIG. 1A and FIG. 1C layout configurations may have a lower breakdown voltage at these corners. In the parallel-concentric configuration shown in FIG. 1C, these corners may be moved outside active area 128 where they can float and are thus not fixed at source potential thereby minimizing or eliminating them as a source of localized lower breakdown voltage. Also, the active channel area can be maximized and gate feeds used that are more conventional only requiring a perimeter gate runner to make connection to the active polysilicon gates.

Figure 2:
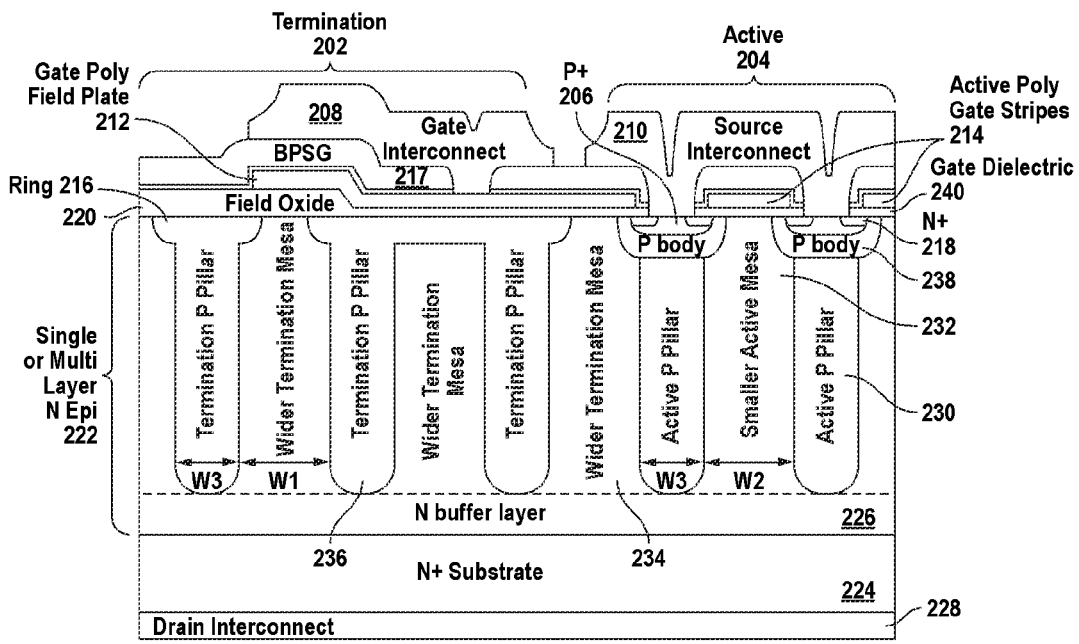
FIG. 2 shows a simplified cross section view of a super-junction FET.

In order to achieve good Unclamped Inductive Switching (UIS) characteristics, it is desirable to design the device so that breakdown first occurs in the active region as opposed to any other region of the device including the termination region. One way to achieve this is to make sure that all regions of the device have sufficiently higher breakdown voltage than the active area by locally modifying the charge balance in these regions. FIG. 2 shows an embodiment where this is achieved. In FIG. 2, P-pillars 230, 236 in both active region 204 and termination region 202 may have the same width W3 and similar doping profiles. N-type mesa regions 232, 234 (alternatively referred to as N-pillars in this disclosure) in active region 204 and termination region 202 may be grown with the same epitaxial layer or layers.

Using known techniques, mesa width W1 and P-pillar width W3 as well as the doping profiles in P-pillars 230, 236 and N-type mesas 232, 234 may be designed to achieve a charge balance condition resulting in termination region 202 having a higher breakdown voltage than active region 204. In contrast, mesa width W2 in active region 204 may be adjusted to obtain a different charge balance condition that results in a lower breakdown voltage than other areas of the device including termination region 202. In one embodiment, mesa width W2 in active region 204 may be made smaller than mesa width W1 in termination region 202 so that active region 204 is more P-rich. In another embodiment, mesa width W2 in active region 204 may be made greater than mesa width W1 in termination region 202 so that active region 204 is more N-rich. These techniques ensure that breakdown occurs in active region 204 first thus resulting in a more stable breakdown characteristic and a more uniformly distributed current flow during a UIS event. Accordingly, both the breakdown and UIS characteristics of the device are improved. Note that an N-rich active region may result in a improved (lower) Rds-on at the expense of UIS performance, and a P-rich active region may provide a better UIS performance at the expense of Rds-on. Depending on the design goals, one approach may be preferred to the other. A number of techniques for achieving various performance improvements are described next.

Figure 3:
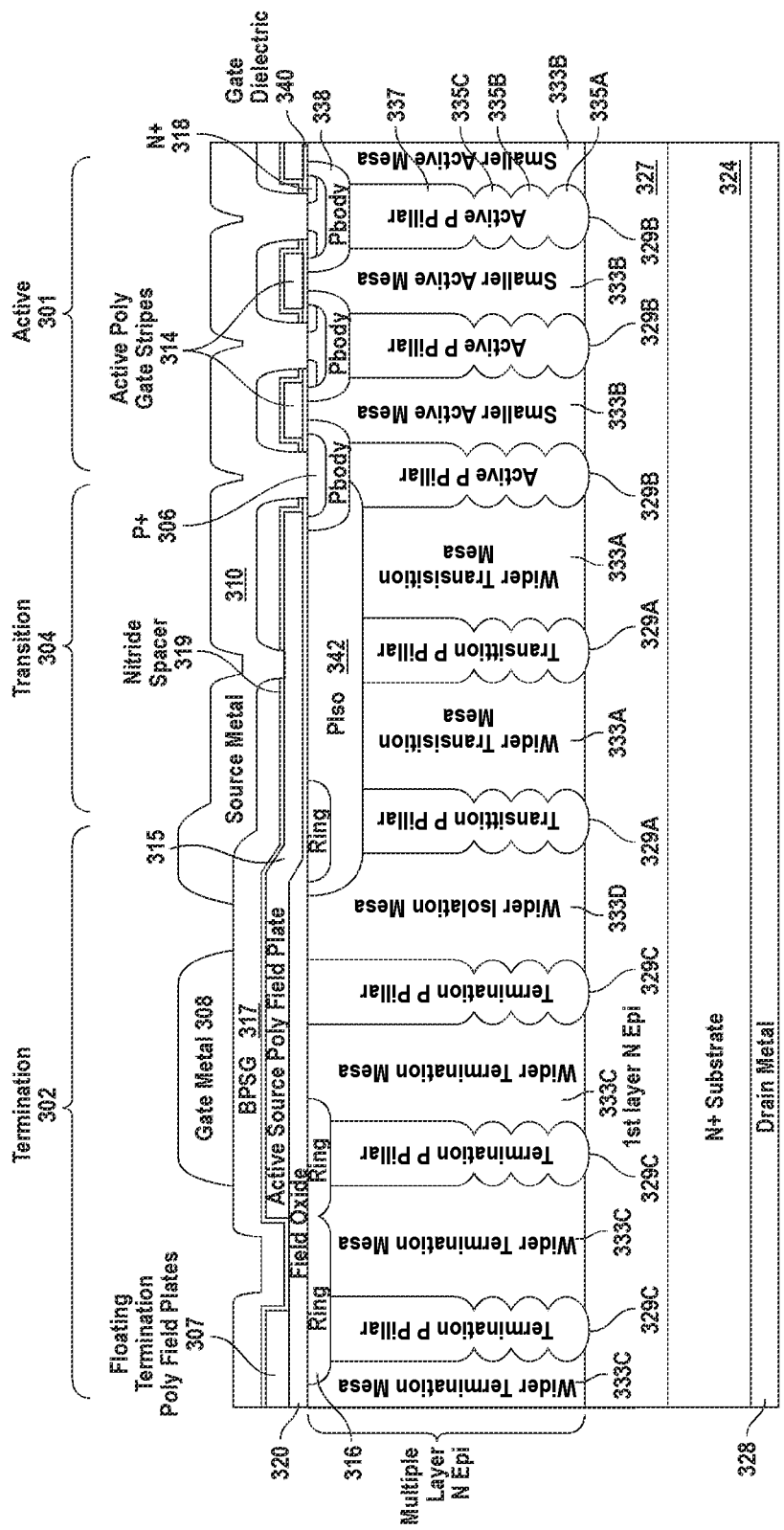
FIG. 3 shows a simplified cross section view along a portion of a die where the active region transitions to termination region through transition region, in accordance with an embodiment of the invention.

FIG. 3 shows a cross section view along a portion of a die where active region 301 transitions to termination region 302 through transition region 304. In this exemplary embodiment, transition P-pillars 329A are bridged to the first contacted P-pillar 329B in active region 301 through a diffusion region 342 marked as PIso. This bridging diffusion may extend over N-type mesa regions 333A. In this and other embodiments disclosed herein, the N-type mesa regions separating the P-pillars may also be referred to as "N-pillars." When N-type mesa regions 333A in transition region 304 have the same or smaller width than active N-pillars 333B, an increase in P charge in transition region 304 occurs. This increase in P charge can reduce the breakdown voltage below that of active area 301. To compensate for this increase in P charge, the width of N-pillars 333A in transition region 304 may be made greater than the width of N-pillars 333B in the active region. This can ensure that the breakdown voltage in transition region 304 remains higher than in active area 301. In the embodiment shown in FIG. 3, transition region 304 is defined by the span of the bridging diffusion 342.

As with the FIG. 2 embodiment, the width of all P-type pillars 329A, 329B, 329C in all regions (the termination, transition and active regions) may be substantially the same, and the width of termination mesa regions 333C may be greater than the width of the active mesa regions 333B. However, the width of termination mesa regions 333C may be greater than, the same as, or smaller than the width of transition mesa regions 333A. In active region 301, in one embodiment, P-pillars 329B may have the same width and may be spaced from one another by the same distance. However, in another embodiment, the width of P-pillars 329B in active region 301 may be smaller than the spacing between them, thus providing a N-rich condition in the active region. In one embodiment, the active and transition N-pillars and P-pillars may be stripe-shaped with termination N-pillars and P-pillars surrounding the active and transition regions in a concentric fashion similar to the layout configuration shown in FIG. 1C. In yet another embodiment, the active, transition, and termination N-pillars may be concentric similar to the layout configuration shown in FIG. 1A.

In the designs where the pillars (e.g., P-pillars) are formed by etching deep trenches and filling them with silicon, as for example in high voltage super junctions designs, process reliability may be directly related to the trench depth to width ratio (i.e., the trench aspect ratio). For higher trench aspect ratios, epi filling of the trenches becomes more difficult. FIG. 3 shows a technique whereby P-pillars that extend deep into the drift region are formed without requiring deep trenches.

In FIG. 3, a multi-epi process with multiple aligned implantations is combined with a trench process to form all P-pillars 329A, 329B, 329C. As can be seen, each P-pillar includes three P-implant regions 335A, 335B, 335C stacked on top of each other, as well as a trench-filled portion 337 along the upper portion of the P-pillar. Along each P-pillar, the three P-implant regions 335A, 335B, 335C and the upper trench-filled portion 337 correspond to separate N-epi layers. That is, in the exemplary embodiment shown in FIG. 3, four N-epi layers are used to form the P-pillars. More or fewer than four epi layers may be used depending on the design goals.

The technique exemplified by the FIG. 3 embodiment provides a number of advantages. First, the trench etch depth is substantially reduced thus allowing for reduced trench CD and easier trench filling. Also, the cell pitch can be reduced due to the trench etch angle. That is, the trenches are etched with a taper from bottom to top, thus resulting in a wider trench width at the top. This allows the trenches to be fully filled without the risk of pinch off at the top creating voids in the pillar. Having a shallower trench etch reduces the width of the trench at the top which is a function of the tangent of the etch angle. Consequently, the width of the pillar at the top is smaller and the shallower trenches can be made with a smaller etch CD because they are easier to fill. Thus a smaller cell pitch and a lower Rds-on can be obtained. Further, as is described more fully in connection with FIGS. 5A through 5G below, this technique advantageously: (1) allows use of different P implant CDs for active and termination P-pillars to insure that break down occurs in the active area first, and (2) allows adjusting the P implant CDs in the active region to insure that the avalanche breakdown occurs well below the junction formed by the P-type body regions and the N-type drift region.

Figure 4A:
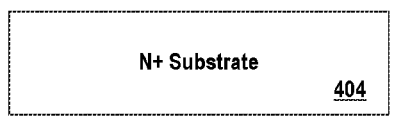
FIGS. 4A-4H are simplified cross section views depicting various steps in an exemplary process for forming the pillar structure shown in FIG. 3.
Figure 4B:
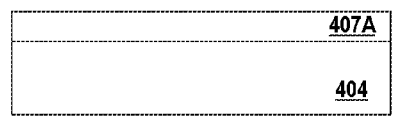
Figure 4C:
Figure 4D:
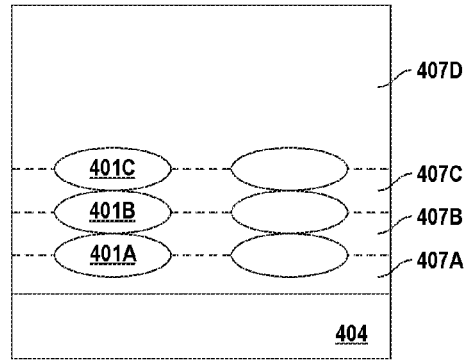

Before turning to FIGS. 5A to 5G, an exemplary process for forming the pillar structure shown in FIG. 3 will be described with references to FIGS. 4A to 4H. FIG. 4A shows N+ starting substrate 404. In FIG. 4B, a first N-epi layer 407A may be grown using conventional techniques. In FIG. 4C, a P-implant may be carried out to form P-implant regions 401A. A conventional masking and implant process may be used to form P-implant regions 401. In FIG. 4D, the steps corresponding to FIG. 4C are repeated two more times to form second and third N-epi layers 407B, 407C and the corresponding P-implant regions 401B, 401C, followed by formation of a fourth and thicker N-epi layer 407D. The second to fourth N-epi layers may be formed using conventional techniques. The second to fourth N-epi layers may be formed with a uniform, stepped, or graded doping concentration. As will be discussed further below, different implant doping concentration and/or energy may be selected in forming each P-implant region 401A, 401B, 401C in order to obtain the desired charged imbalance condition along the pillar length and/or depth.

Figure 4E:
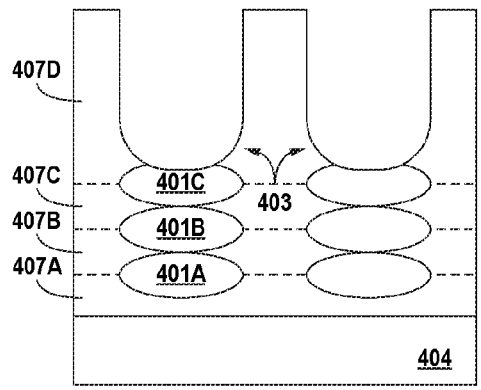
Figure 4F:
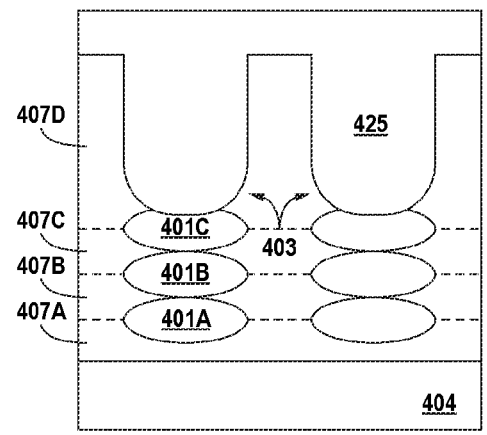
Figure 4G:
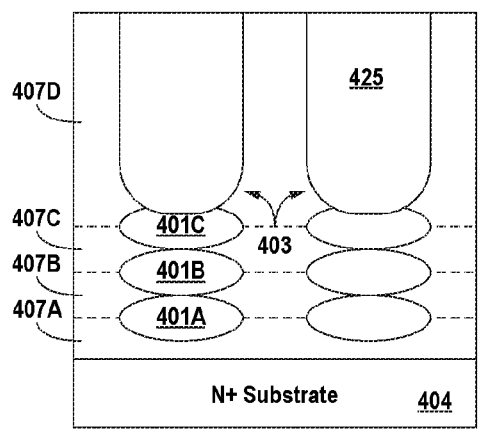
Figure 4H:
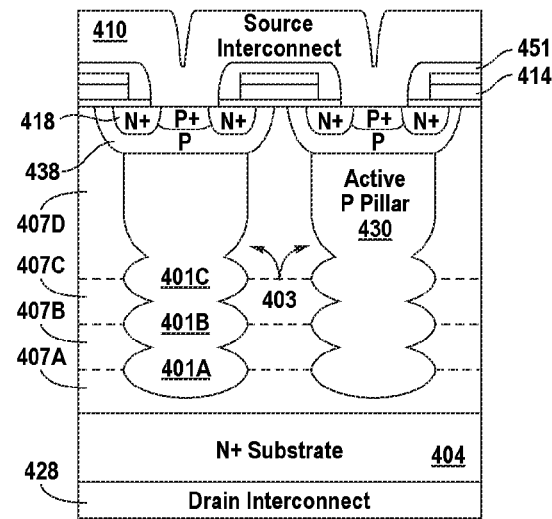

In FIG. 4E, trenches 403 may be patterned and etched deep enough to reach the uppermost P-implant regions 401C. Backside alignment techniques may be used to ensure alignment of trenches 403 with P-implant regions 401C. In FIG. 4F, trenches 403 may be filled with P-epi 425 using known techniques. In FIG. 4G, P-epi 425 may be planarized using, for example, a conventional chemical mechanical polishing (CMP) process. In FIG. 4H, P-type body region 438, N+ source regions 418, the P+ heavy body regions as well as the gate structure and its overlying layers may be formed using known techniques. While in the process depicted by FIGS. 4A-4G, a separate N-type buffer layer is not incorporated between the substrate and the first N-epi layer 407A (as is done in FIG. 3), such buffer layer can be incorporated by forming a suitable N-epi layer before forming N-epi layer 407A in FIG. 4C. Alternatively, N-epi layer 407A can be made thicker to account for the buffer layer.

As can be seen, this process yields a super junction device with P-pillars that are formed from a combination of multiple P-implant regions 401A, 401B, 401C and a relatively shallow trench-filled portion 403. Accordingly, the trench etch depth is substantially reduced thus allowing for reduced trench CD and easier trench filling. This technique also provides a number of other advantages over conventional techniques, some of which will be discussed with reference to the embodiments shown in FIGS. 5A-5G.

Figure 5A:
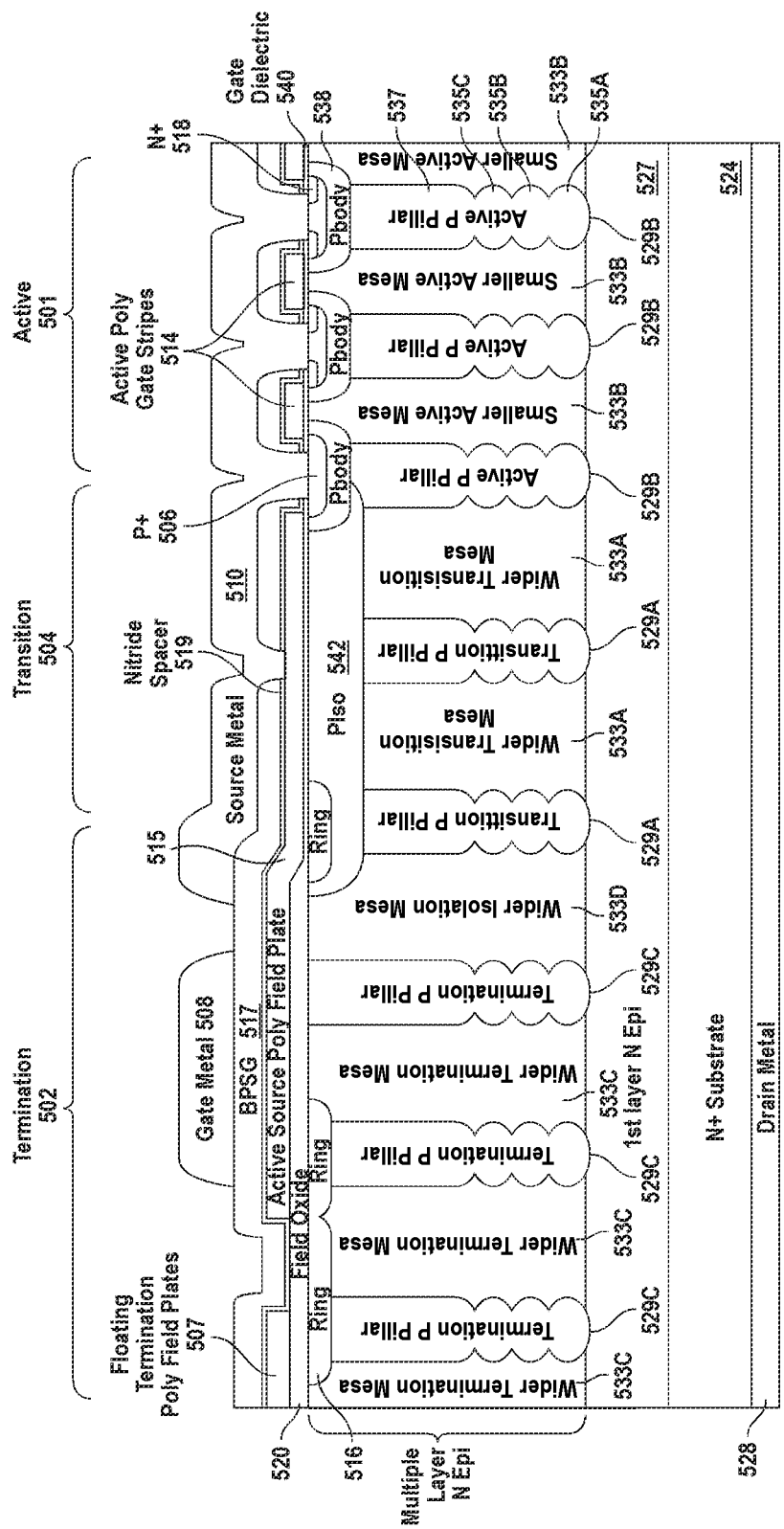
FIGS. 5A-5G are simplified cross section views showing various embodiments in which the flexibility provided by combining the trench-fill process with the multiple Epi and implant process is advantageously exploited to obtain performance improvements.

FIGS. 5A-5G show various embodiments in which the flexibility provided by combining the trench-fill process with the multiple Epi and implant process is advantageously exploited to obtain performance improvements. FIG. 5A is a cross section view that is similar to FIG. 3 except that a larger P-implant CD is used in forming the bottom-most P-implant region 535A of active P-pillars 529B than that used in forming the bottom-most P-implant regions of transition P-pillars 529A and termination P-pillars 529C. In this manner, the charge imbalance at the bottom of the active P-pillars is made greater than the charge imbalance at the bottom of the termination and transition P-pillars, thus ensuring that the break down first occurs in the active region.

Figure 5B:
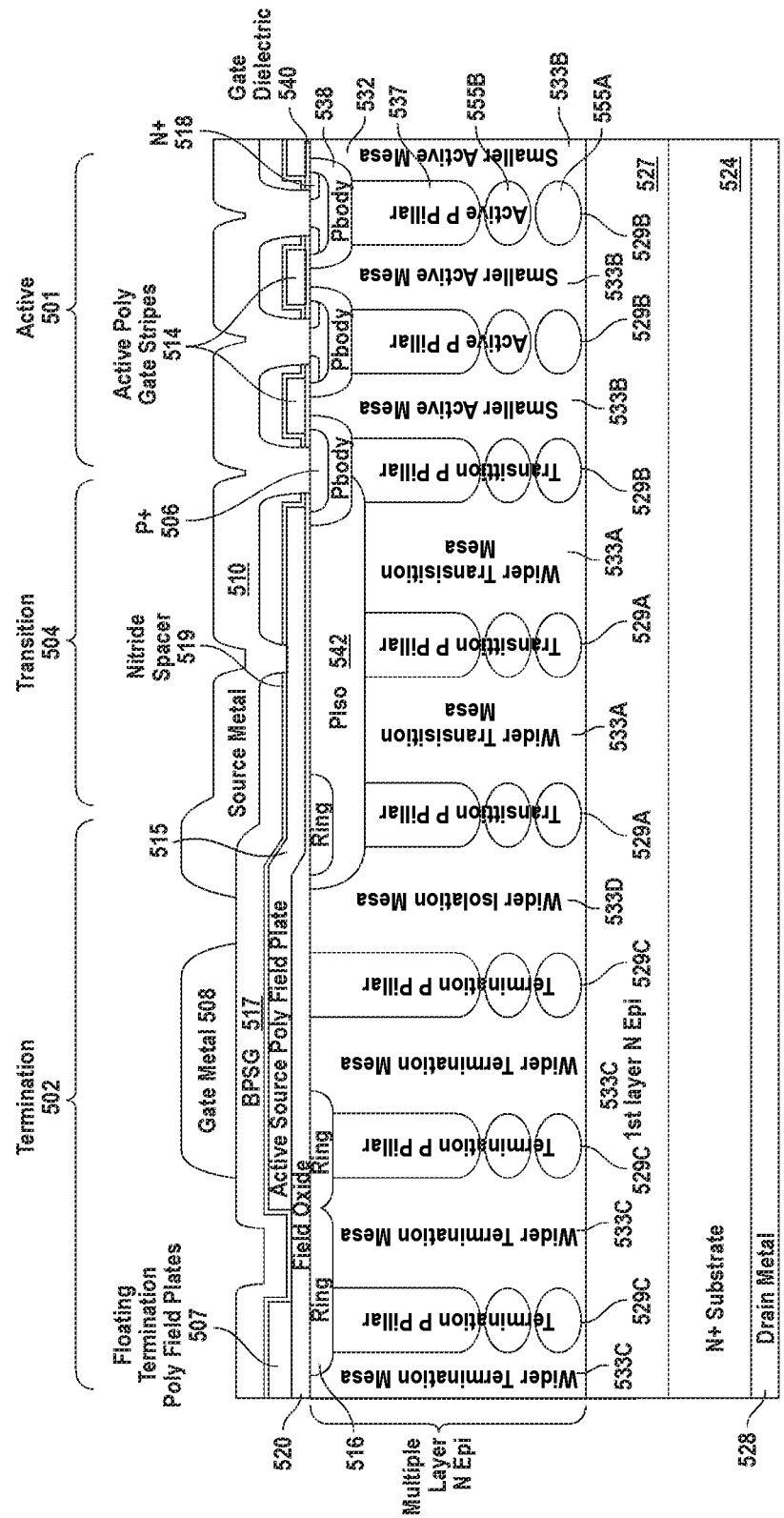
Figure 5C:
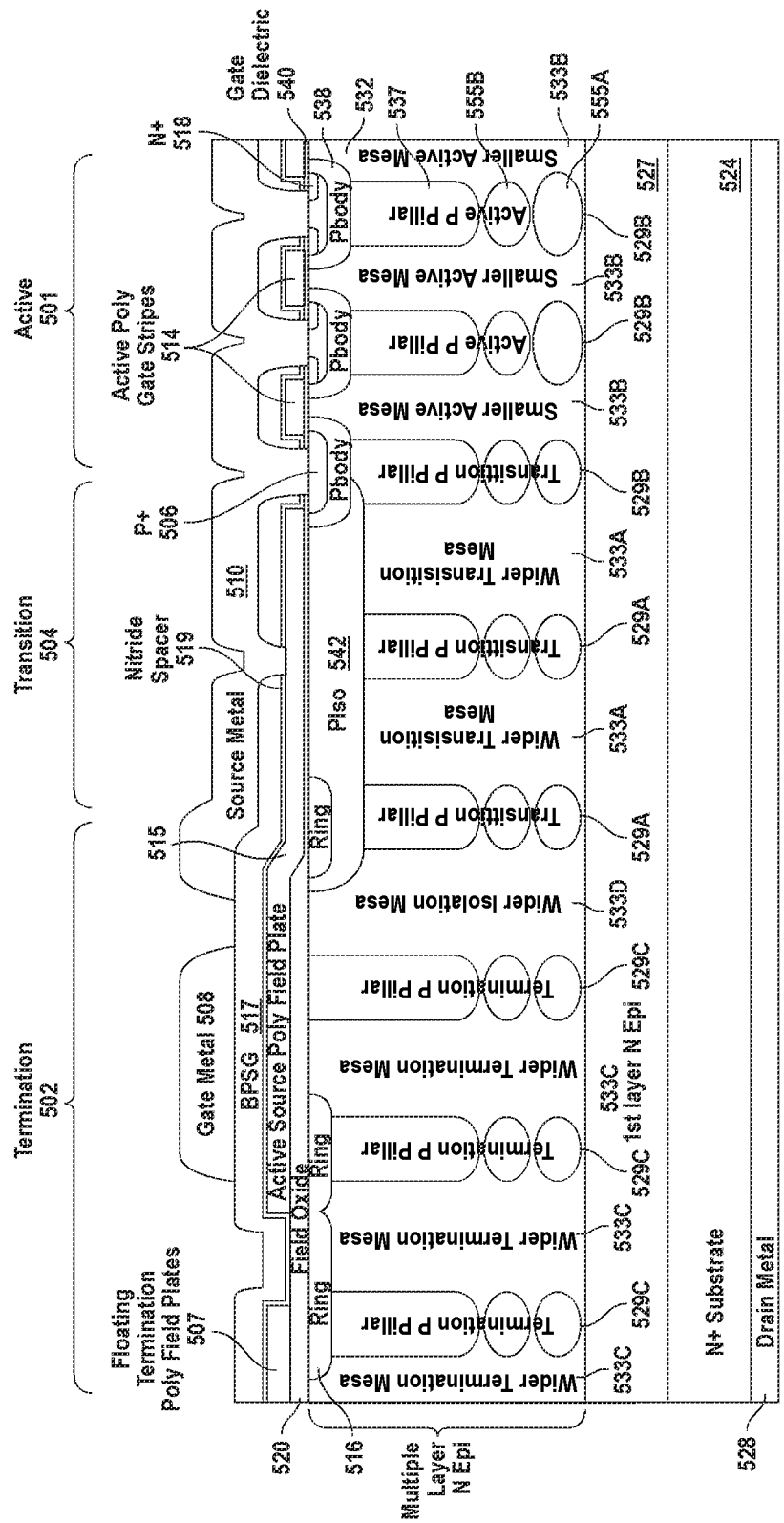

FIG. 5B shows a variation of the FIG. 3 embodiment where P-implant regions 555A, 555B along P-pillars in the active, transition and termination regions are floating (i.e., P-implant regions 555A, 555B do not merge). This can be achieved by carefully controlling the P-implant dose and energy in the process steps corresponding to FIGS. 4C and 4D. Floating the pillar regions allows for reduced charge balance sensitivity because these regions can assume a potential similar to the floating pillar regions in the termination. FIG. 5C shows another embodiment that is similar to that in FIG. 5B except that a larger P-implant CD is used in forming the bottom-most P-implant regions 555A in the active P-pillars as compared to that used in forming the bottom-most P-implant regions 555A in the transition and termination P-pillars. Similar to the FIG. 5A embodiment, the greater charge imbalance in the active region due to the larger P-implant regions 502 forces the break down to occur in the active region.

In the FIGS. 5A and 5C embodiments, the larger P-implant regions may be formed for every other active P-pillar as opposed to all active P-pillars. This technique is advantageous in that the impact of the larger P-implant regions on current flow (e.g., pinching off the current path at the bottom of the P-pillars) is reduced thus improving Rds-on. The larger P-implant regions could also be formed at the bottom of every third active P-pillar or every fourth active P-pillar or some other pattern depending on the avalanche current and as long as breakdown occurs in a uniform manner in the active region.

Figure 5D:
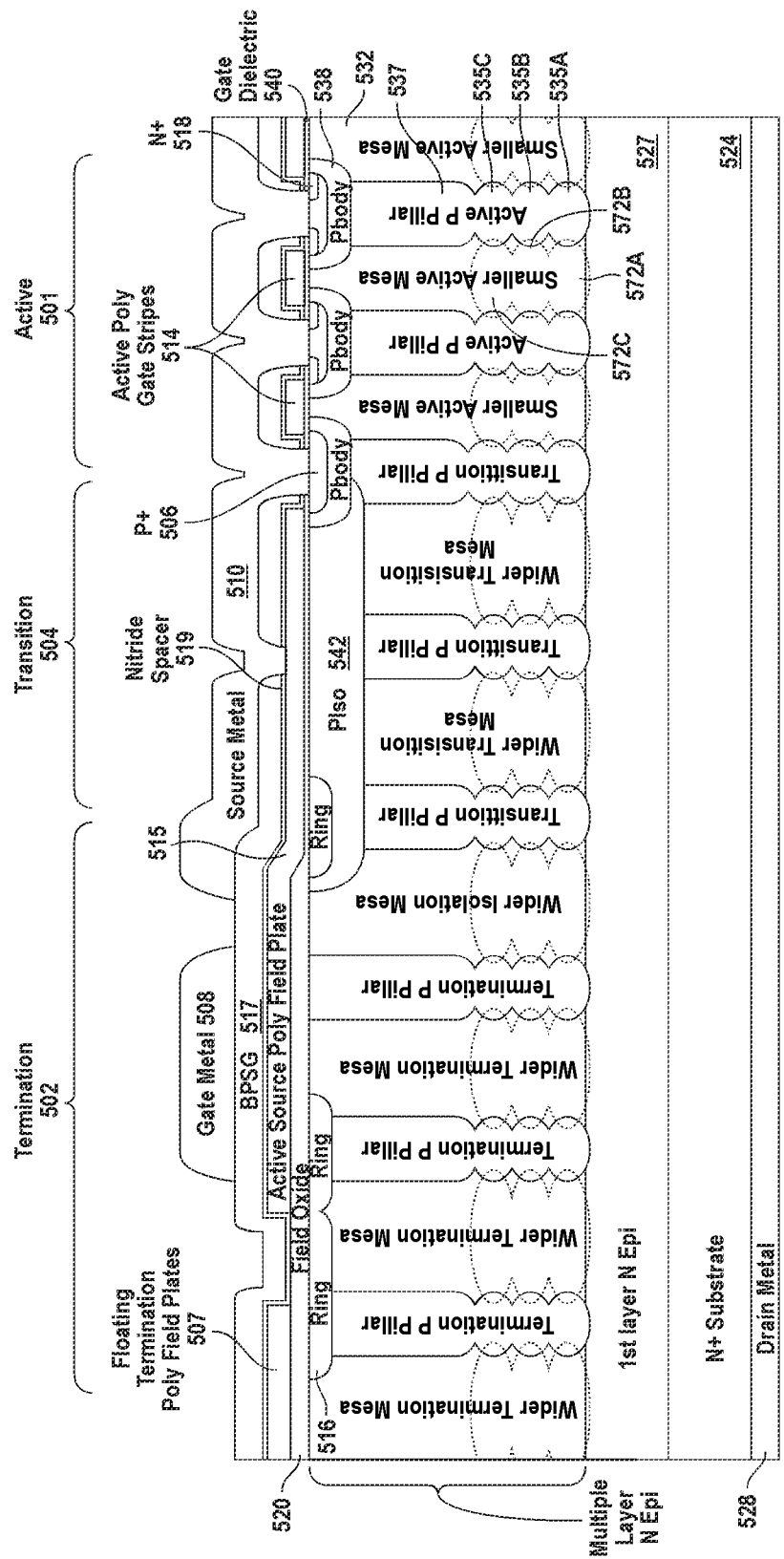
Figure 5E:
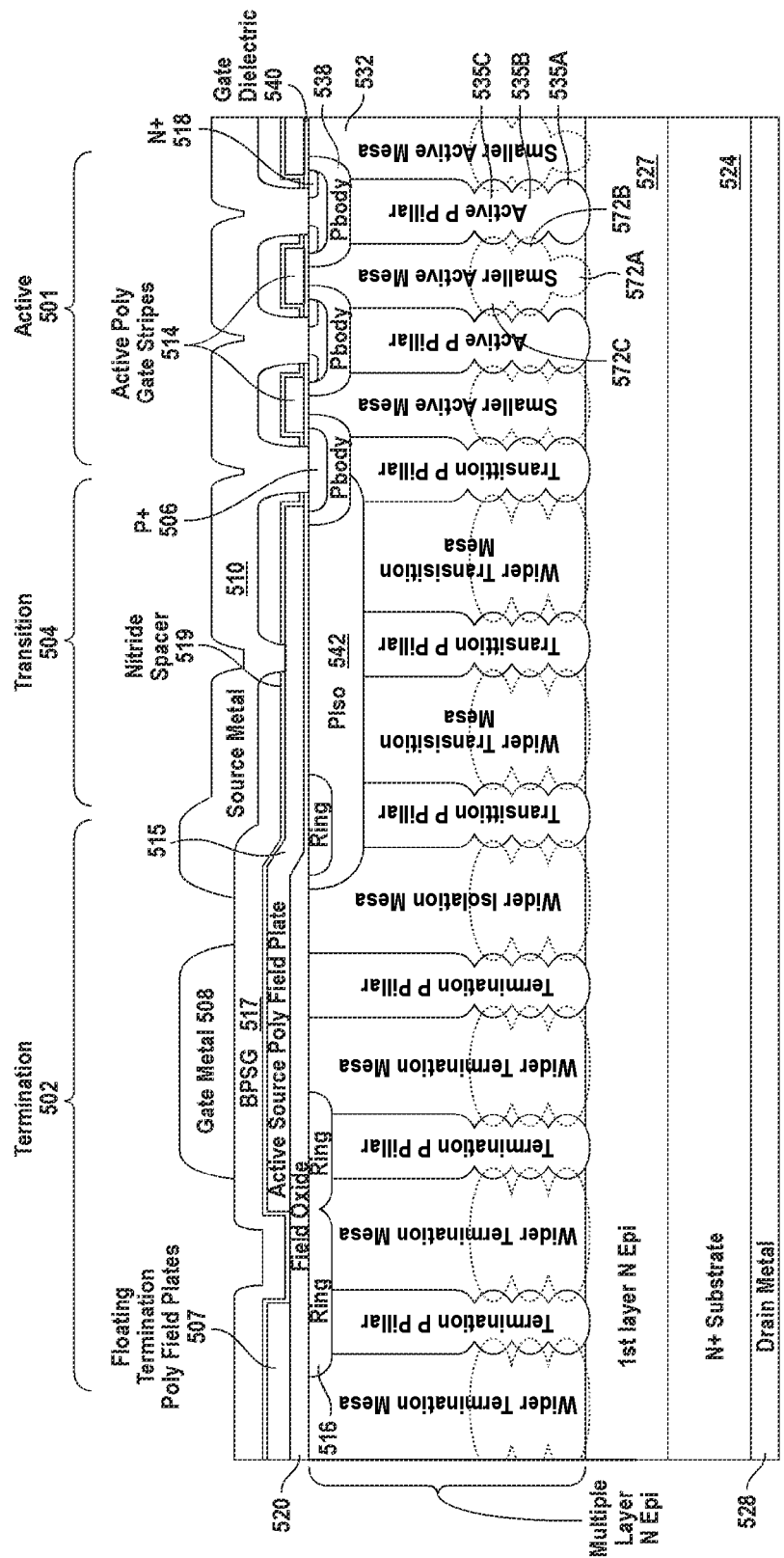
Figure 5F:
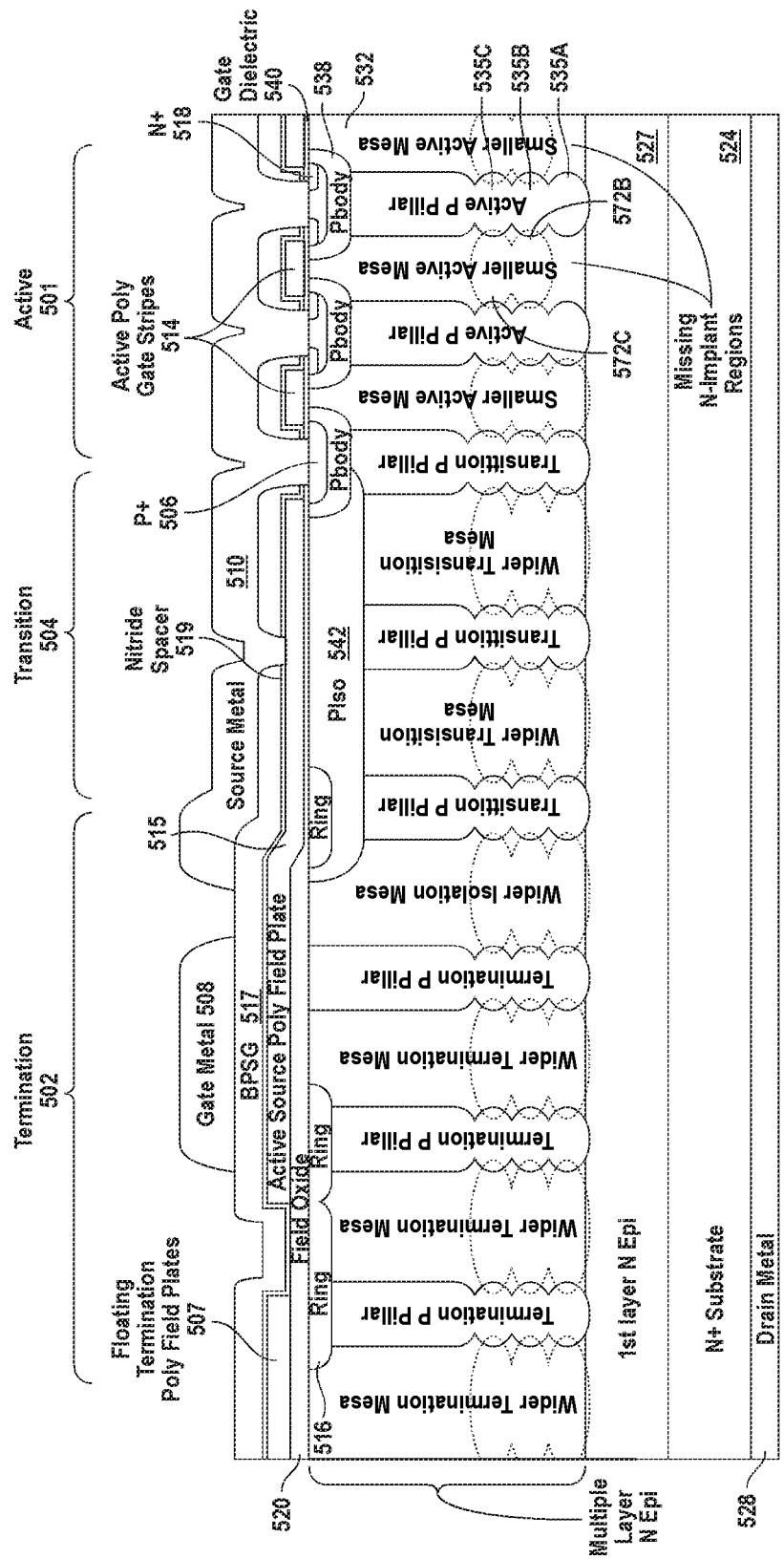

FIG. 5D shows a cross section view of yet another embodiment which is similar to that shown in FIG. 3 except that multiple N-implant regions 572A, 572B, 572C are formed in between the P-implant regions 535A, 535B, 535C. These N-implant regions enable better control of charge balance and imbalance as well as make the pillars N rich at the bottom. Having the N rich imbalance at the bottom is another method of moving the avalanche location deeper in the silicon without penalizing Rds-on as a result of pillar pinch off. Referring to FIGS. 4C and 4D, N-implant regions 572A, 572B, and 572C can be formed immediately before or immediately after forming the corresponding P-implant regions using known techniques. Referring back to FIG. 5D, while the N-implant regions 572A, 572B, 572C and the P-implant regions 535A, 535B, 535C are formed in a manner that provides similar charge balance characteristics in the active, transition and termination regions, in the embodiment shown in the FIG. 5E, a smaller N-implant CD is used in forming the lower-most N-implant regions 572A in the active region as compared to the lower-most N-implant regions 572A in the transition and termination regions, thereby forcing break down in the active region. The smaller N-implant regions 572A in the active region may alternatively be formed at the bottom of every other active N-pillar (instead of each and every active N-pillar as shown in FIG. 5E). In yet another embodiment shown in FIG. 5F, the bottom-most N-implant region may be eliminated altogether in the active region by blocking the N-implant in the active region only. Alternatively, the bottom-most N-implant region may be eliminated from every other active N-pillar.

Figure 5G:
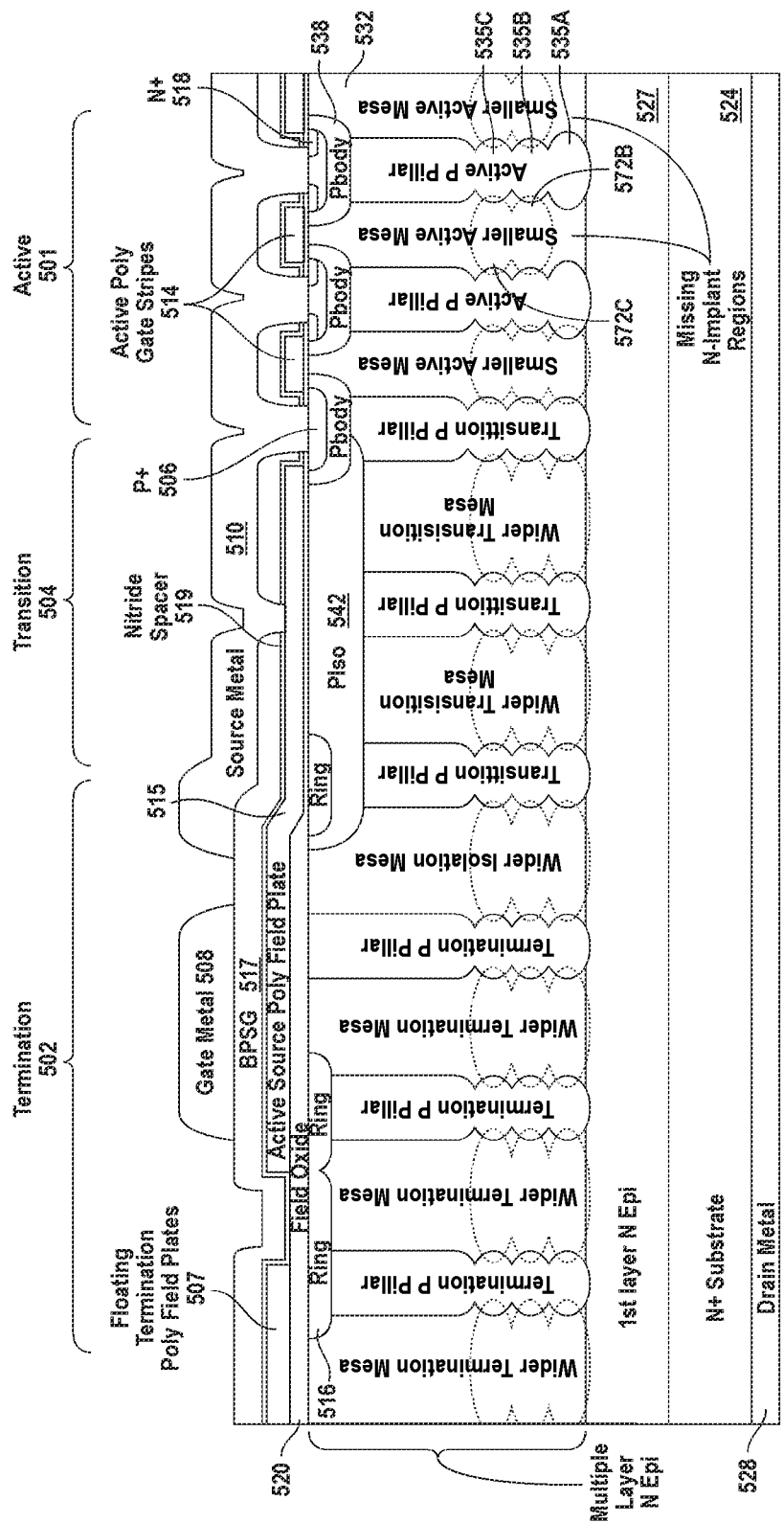

FIG. 5G shows yet another embodiment in which a larger P-implant CD is used for the lower-most P-implant regions 535A in the active P-pillars than that used in the termination and transition regions, and the bottom-most N-implant regions are eliminated only in the active region. Of the various embodiments, this embodiment provides the most P-rich condition at the bottom of the active P-pillars. Other permutations can be envisioned in view of the various embodiments disclosed herein. For example, the larger P-implant regions in FIG. 5G can be formed at the bottom of every other active P-pillar to obtain better Rds-on, or in FIG. 5G, instead of fully eliminating the bottom-most N-implant region, smaller N-implant regions (such as regions 572A in 5E) can be used to improve Rds-on. Further, the P-implant regions and/or N-implant regions, or select groups of them, shown in the various embodiments may be formed so that they do not extend along the full length of the P-pillar (e.g., into the page). Also, while the cross section views in FIGS. 3 and 5A-5G show the mesa widths in the active region to be different than the mesa widths in the transition and termination regions, in one embodiment, all mesa widths in the active, transition and termination regions are the same, and the bottom-most P-implant regions in the active region and/or the bottom-most N-implant regions in the active region are manipulated as outlined in the various embodiments described above to insure that the active region has a lower break down voltage than the termination region. It is also noted that the various embodiments described above may be implemented using any of the three layout configurations shown in FIGS. 1A-1C.

Figure 6B:
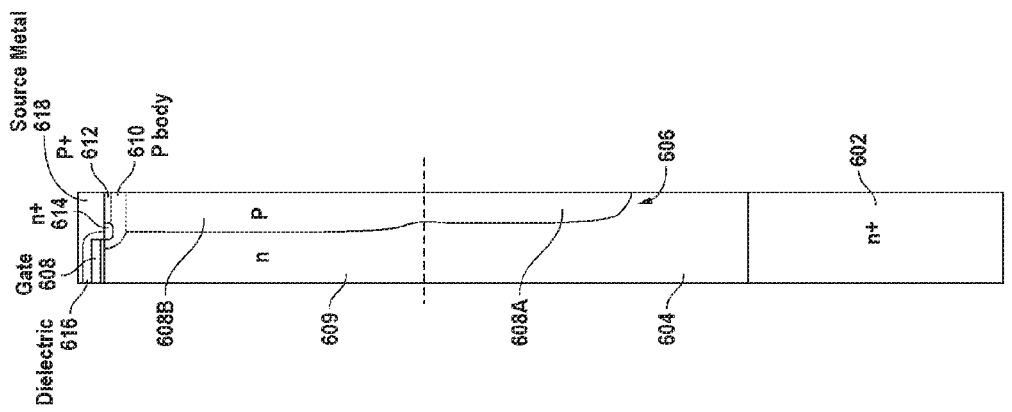
FIGS. 6A-6B are simplified cross section views showing a process for forming P-pillars using a two-step pillar process.
Figure 6A:
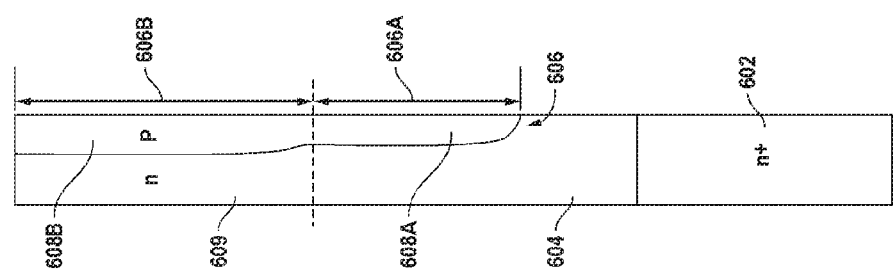
Figure 8B:
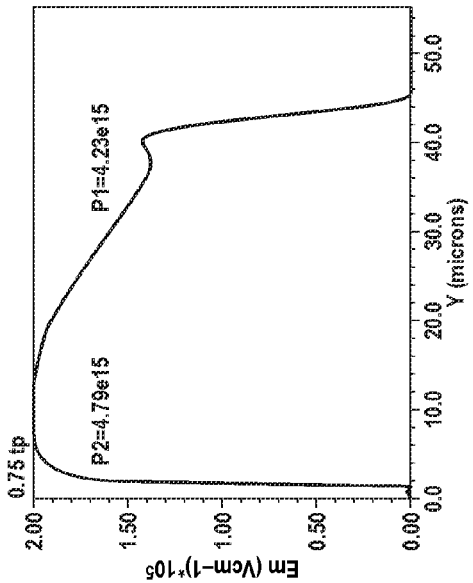
Figure 8D:
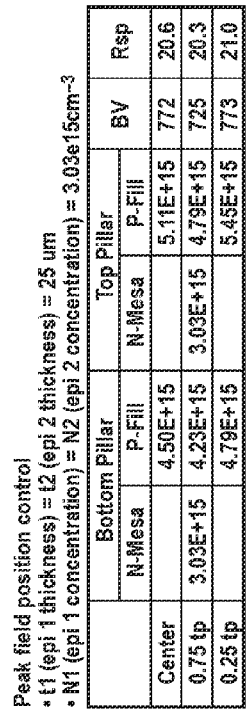
Figure 8A:
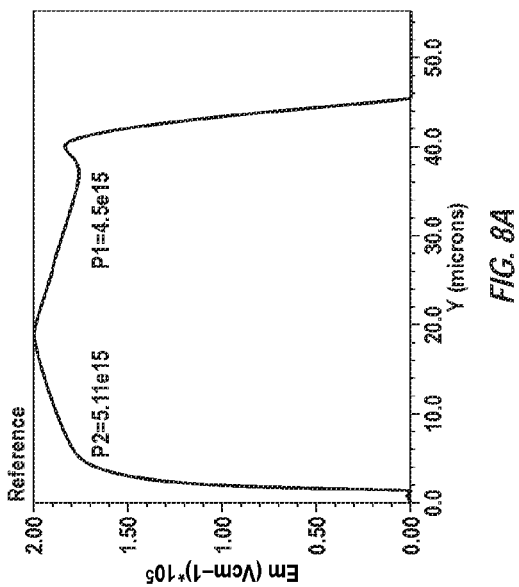
Figure 8C:
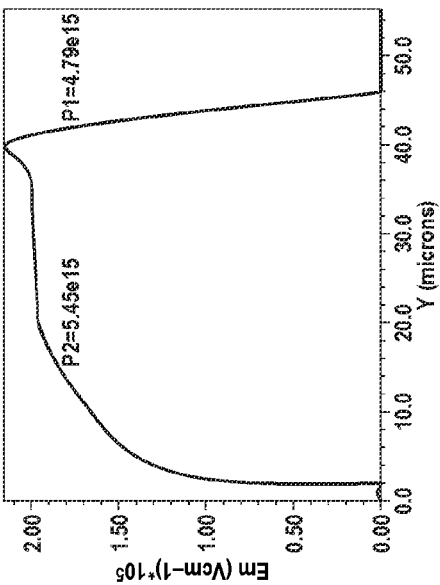

While the embodiments described with reference to FIGS. 3, 4A-4H and 5A-5G disclose techniques whereby the trench etch depth is substantially reduced thus allowing for easier trench filling, another technique for achieving the same is shown in FIGS. 6A-6B.

FIGS. 6A-6B are cross section views showing a process for forming P-pillars using a two-step pillar process. In FIG. 6A, a first N-epi layer 604 is grown over a highly doped substrate 602 using known techniques. A bottom portion 606A of a deep trench 606 is formed in first epi layer 604, and then filled with P-type silicon material 608A using conventional methods. A planarization process (e.g., chemical mechanical polish) may be carried out to planarize the top surface of the silicon before the next process step of forming the second N-epi layer 609 is carried out. Second epi layer 609 is formed over first epitaxial layer 604 using conventional techniques. A top portion 606B of deep trench 606 is then formed in second epi layer 609, and then filled with P-type silicon material 608B using conventional methods. Back-side alignment techniques may be used to ensure that top and bottom trenches 606A, 606B are properly aligned.

Next, A planarization process may be carried out to planarize the top surface of the silicon before the subsequent steps. A post bake (e.g., at temperature of 1200 degree C. and 60 minutes) may be carried out to anneal out the defects in the two epi layers. Further processing may be carried out next to form the surface structures. For example, in the case of a MOSFET, as shown in FIG. 6B, P-type body region 610, N+ source regions 614, P+ heavy body regions 612 as well as the gate structure and its overlying layers may be formed using known techniques. The two-step pillar process depicted by FIGS. 6A-6B may be expanded to include additional epi, trench etch and trench fill steps, for example, for higher voltage devices in which the trenched pillars extend even deeper.

This technique provides a number of advantages. By forming and filling the deep trench in multiple steps, filling the deep trench is made easier. Also, this technique can easily be scaled to accommodate higher voltage devices. That is, depending on the target breakdown voltage and the corresponding trench depth, the number of epi layers and corresponding trench etch and fill steps can be increased. Additionally, this technique provides significant flexibility by allowing independent selection of thicknesses and doping profiles for the two N-epi layers, as well as independent selection of doping profiles for the two trench fills. This flexibility enables more precise control of the electric field characteristics along the depth of deep trenches 600. For example, the degree of field concentration, as well as the electric field profile (e.g., flat or double peak) and the position of the peak electric field, can be controlled by adjusting the thicknesses of the epi layers and the doping profiles of the epi layers and the trench fill material.

For example, the simulation results in FIGS. 7A-7D illustrate the impact of the doping concentration of the trench fills on the degree of electric field concentration along the trench depth (in these simulations, the thicknesses and doping concentration of the two N-epi layers are not changed). In these figures, t1 and t2 indicate the thicknesses of the bottom epi 604 (FIG. 6A) and top epi 609 (FIG. 6), respectively; N1 and N2 indicate the doping concentrations of the bottom epi 604 and top epi 609, respectively; and P1 and P2 indicate the doping concentration of the P-type silicon material 608A in the bottom portion 606A of deep trench 606 and the P-type silicon material 608B in the top portion 606B of deep trench 606, respectively. As another example, the simulation results in FIGS. 8A-8D illustrate the impact of the doping concentration of the trench fills on the location of the peak electric field (in these simulations, similar to those in FIGS. 7A-7D, the thicknesses and doping concentration of the two N-epi layers are not changed). The simulation results in FIGS. 9A-9B illustrate yet another example where the various parameters and physical dimensions are manipulated to create a double peak in the electric field, thus increasing the break down voltage. The simulation results in FIGS. 10A-10B illustrate still another example where an even higher breakdown voltage can be obtained by using the appropriate thicknesses for the epi layers and doping concentrations for the trench fill material (it is noted that this particular simulation result shows that, as compared to standard 900V MOSFETs, the parameters and dimensions identified in the table in FIG. 10B yield a substantially lower Rds-on—a factor of 10—for the same break down voltage). Thus, the location of peak impact ionization and the avalanche point along the depth of the pillar can be controlled so as to be below the body junction.

Figure 11B:
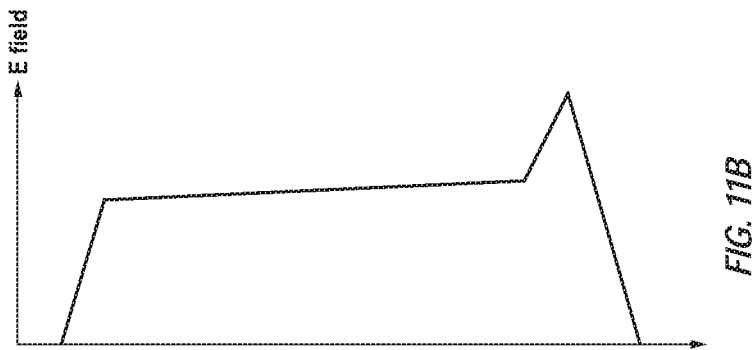
FIGS. 11A and 11B show a simplified cross section view where N-enrichment regions are formed at the bottom of N-filled trenches to create a local charge imbalance, and the corresponding electric field curve, respectively.
Figure 11A:
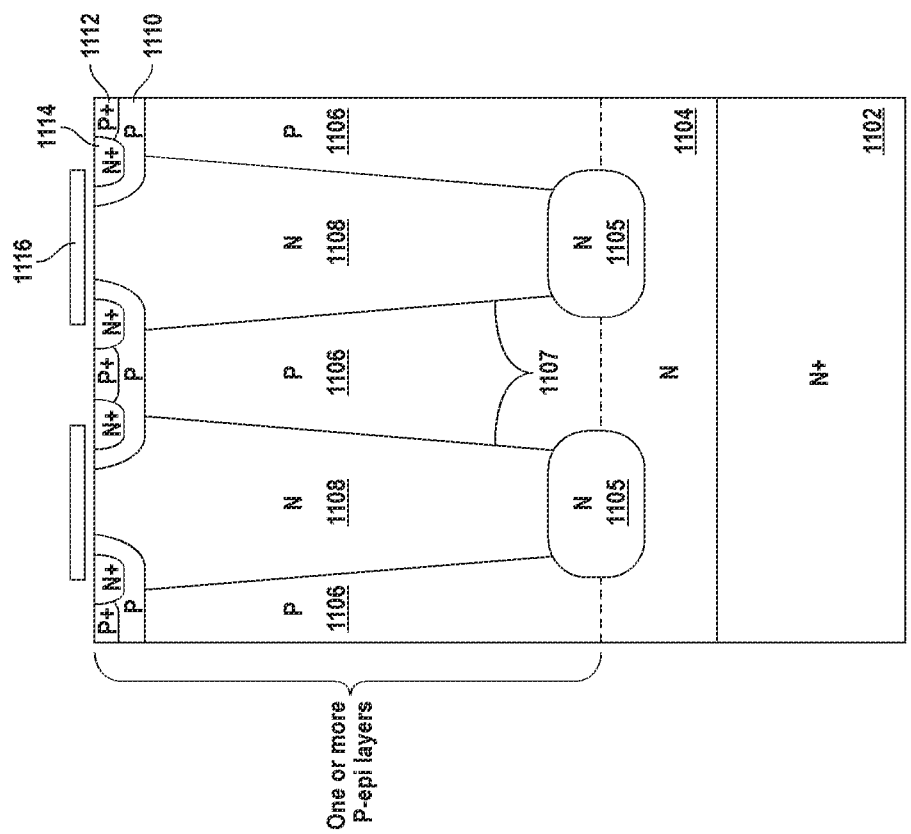

As discussed above, it is advantageous to induce the onset of avalanche breakdown along the bottom half of the pillars away from the body-drift junction. FIG. 11A shows a cross section view in accordance with an exemplary embodiment of the invention where N-enrichment regions 1105 may be formed at the bottom of N-filled trenches 1107 to create a local charge imbalance thereby inducing the onset of avalanche breakdown at the pillar bottoms. This characteristic of the FIG. 11A structure can be seen from the electric field curve shown in FIG. 11B. The electric field curve shows the electric field profile along the depth of the cross section view in FIG. 11A. As can be seen, N-enrichment regions 1105 cause the electric field peak to occur near the bottom of the pillars. N-enrichment regions 1105 preferably have a higher doping concentration than N-pillars 1108 to create the charge imbalance. Since the electric field profile and thus the breakdown voltage is a function of the total N-type and P-type charge in both pillars, the N-pillars can be more heavily doped and made narrower thus reducing the pitch. This benefit is realized because the impact of the lateral diffused compensation from the P-pillar doping into the N-pillar is minimized.

The structure in FIG. 11A may be formed as follows. An N-epi layer 1104 may be grown over N+ substrate 1102 using conventional techniques. An N-enrichment implant may be carried out to form N-enrichment regions 1105 where bottoms of N-pillars 1108 will terminate. A conventional masking and implant process may be used to form N-enrichment regions 1105. The implant doping concentration and energy may be set in accordance with the target charge imbalance condition at the pillar bottoms. An alternate method for forming N enrichment regions 1105 is to grow an N-type epi layer, etch the pillar trenches and then implant the bottom of the trenches with N enrichment dopants.

One or more P-epi layers 1106 may be grown over N-epi layer 1104 using conventional techniques. The one or more P-epi layers 1106 may be formed with a uniform, stepped, or graded doping concentration. Trenches 1107 may be patterned and etched deep enough to reach N-enrichment regions 1105. Backside alignment techniques may be used to ensure alignment of trenches 1107 with N-enrichment regions 1105. Trenches 1107 may be filled with N-epi using known techniques. The N-epi used to fill the trenches need not be fully planarized since any portions of N-epi remaining over the P-epi 1106 can be used in forming the top structure of the power device. Alternatively, the N-epi used to fill the trenches may be planarized using, for example, a conventional chemical mechanical polishing (CMP) process. P-body regions 1110, N+ source regions 1114, P+ heavy body regions 1112 as well as gate structure 1116 and its overlying layers (not shown) may be formed using known techniques. In one implementation, P-body regions 1110, source regions 1114 and heavy body regions 1112 are all formed after gate structure 1116 is formed.

Figure 12B:
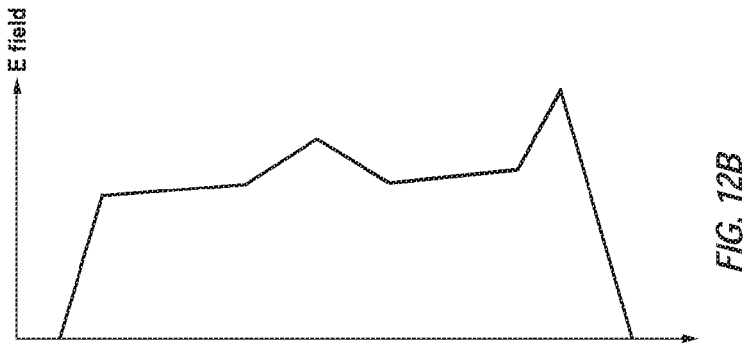
FIGS. 12A and 12B show another simplified cross section view with N-enrichment regions at the bottom of N-pillars to create a local charge imbalance, and the corresponding electric field curve, respectively.
Figure 12A:
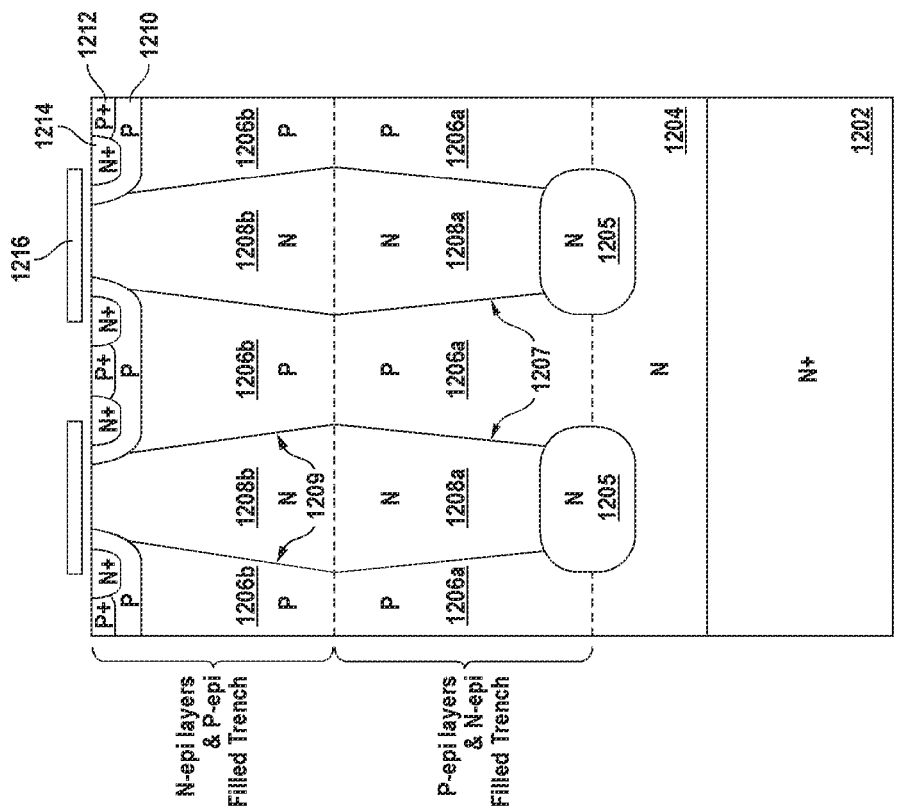

In another embodiment shown in FIG. 12A, one or more P-epi layers 1206a may be grown over N-epi layer 1204 using convention techniques. The one or more P-epi layers 1206a may have a uniform, stepped, or graded doping concentration. Lower trenches 1207 may be patterned and etched deep enough to reach N-enrichment regions 1205. Lower trenches 1207 may be filled with N-epi 1208a using know techniques. One or more N-epi layers 1208b is then grown over the one or more P-epi layers 1206a and the N-epi filled lower trenches 1207, using conventional techniques. The one or more N-epi layers 1208b may have a uniform, stepped, or graded doping concentration. Upper trenches 1209 maybe patterned and etched deep enough to reach the one or more P-epi layers 1206a. Upper trenches 1209 may be filled with P-epi 1206b using know techniques. The upper trenches may be aligned to the lower trenches using backside alignment techniques or can be run perpendicular to the lower trenches.

As can be seen, N-pillars 1208 have a reverse taper along their upper half. P-epi 1206b used to fill upper trenches 1209 may be planarized using, for example, a conventional CMP process. P-body regions 1210, N+ source regions 1214, P+ heavy body regions 1212 as well as gate structure 1216 and its overlying layers (not shown) may be formed using known techniques. In one implementation, P-body regions 1210, source regions 1214 and heavy body regions 1212 are all formed after gate structure 1216 is formed. An advantage of this structure is that the wider P-pillar at the surface pushes the avalanche point down so that avalanche occurs below the surface P-body region and the increased electric field at the bottom due the N-enrichment causes the peak electric field to occur at the bottom. This characteristic of the FIG. 12A structure can be seen from the electric field curve shown in FIG. 12B. The electric field curve shows the electric field profile along the depth of the cross section view in FIG. 12A. The Wider N-Pillar with the N-enrichment at the bottom increases the peak current at which pinch-off occurs due to JFET effects and lowers Rds-on.

The N-enrichment regions 1105 in FIG. 11A and 1205 in FIG. 12A advantageously induce avalanche breakdown at the bottom of the pillars and thus result in a device with improved UIS capability. The N-enrichments may be used in other advantageous ways as well.

As discussed above, device ruggedness can be improved in trench epi fill charge balance devices by initiating breakdown in the active area and having the breakdown voltage be substantially lower than other areas, such as termination regions, gate runner areas, and other areas that are likely to be a potential source of charge imbalance. In one embodiment, N-enrichment regions may be formed at the bottom of N-pillars in the active region only. In another embodiment, N-enrichment regions may be formed at the bottom of every other active N-pillar. In other embodiments, N-enrichment regions may be wider than or narrower than the active N-pillars or distributed along length of a N-pillar in an uniform or non-uniform pattern. In yet another variation, the distribution of N-enrichment may not need to be the same for every P-pillar. In yet another embodiment, the N-enrichment regions may be formed in a blanket manner (i.e., adjacent N-enrichment regions merge together) in the active region. Alternatively, the N-enrichment regions may be formed in a blanket manner across both the active and termination regions.

In accordance with other variations of the FIGS. 11A and 12A technique, regions of P-enrichment (not shown) are formed at the bottom of the P-pillars or at the bottom of the N-pillars to disrupt charge balance and thereby create a location of lower breakdown voltage so that avalanche initiates at this localized area. The P-enrichment regions may be implemented in both the active and termination regions, thus ensuring that breakdown occurs near the bottom of the pillars and is far from the silicon surface. Alternatively, the P-enrichment regions may be implemented in the active region only, so that the charge balance is disrupted in the active region to ensure breakdown in the active region. The P-enrichment regions may be wider or narrower than the P-pillars or distributed along length a of a P-pillar in a uniform or non-uniform pattern. In another variation, the P-enrichment regions may be formed at the bottom of every other P-pillar in the active region. In yet another variation, the distribution of P-enrichment may not need to be the same for every P-pillar.

The technique depicted in FIGS. 11A, 12A and its various embodiments described above may be implemented using any of the three layout configurations shown in FIGS. 1A-1C.

In the super junction approach where P-pillars are formed using deep trenches, it is difficult to prevent formation of voids in the epi material that is typically used to fill the deep trenches. Such voids are undesirable because they can lead to reliability and leakage problems. FIGS. 13A-13B are cross section views showing a three step trench fill process used in forming a super-junction device that is free of voids.

In FIG. 13A, one or more N-type epitaxial layers, marked in the figure as N epi 1302, is (are) formed over a suitable substrate (not shown). Trenches 1304 are etched in N epi 1302 using known techniques. P-type epitaxial layer 1306 lining the trench sidewalls and bottom is formed using conventional methods. Next, dielectric layer 1308 (e.g., grown or deposited oxide) is formed over P-epi layer 1306 in trenches 1304 using known methods. Finally, the central remaining portion of trenches 1304 is filled with a conformal material such as amorphous silicon or polysilicon that is doped or undoped using known methods. This technique eliminates formation of voids since epi is used to only partially fill the trench, and a conformal material, such as polysilicon, is used to fill the difficult-to-fill central portion of deep trenches. The void-free filling of deep trenches is achieved while preserving the ability to carefully set the P-charge for charge balance purposes via P-liner 1306. That is, using conformal material 1310 to fill the central portion of the trenches eliminates formation of voids while P epi liner 1306 enables accurate control of the P-charge. Dielectric layer 1308 in turn, advantageously, serves as a cap layer preventing out-diffusion of P-dopants from P-epi liner 1306 to poly fill 1310. Thus charge balance becomes independent of trench width.

In FIG. 13B, the surface structure of the device, in this case a planar gate MOSFET, is formed. Incorporating the three step trench fill process in other MOSFET structures (e.g., trench gate variation) or other types of super junction devices (e.g., planar gate or trench gate IGBTs) would be obvious in view of this disclosure. In FIG. 13B, P-type body regions 1312, N+ source regions 1314 and P+ heavy body regions 1316 are formed in N epi 1302 using conventional techniques. The gate structure, including gate dielectric 1318 and gate electrodes 1320 are formed using known processes. Source metal 1322, contacting source regions 1314, heavy body regions 1316 and poly fill 1310, is formed using known techniques. A back-side drain metal (not shown) contacting the substrate (not shown) is formed in accordance with conventional methods.

As stated earlier, it is difficult to fill deep trenches with epi without formation of voids. Voids can lead to reliability and leakage issues and are thus undesirable. FIG. 14 shows a simplified cross section view of a superjunction power device which minimizes formation of voids in the trench fill process. Trenches 1408 (one of which is shown in FIG. 14) are formed in one or more layers of N-epi 1402. Those portions of the one or more N-epi layers 1402 that separate adjacent trenches 1408 from one another, form N-pillars. A thick P-epi liner 1404 is grown in trenches 1408. P-epi liner 1404 sets the P charge for the P-pillars. Most of trench 1408 is filled by P-epi liner 1404, and its thickness is selected so that the top of trenches 1408 remain open after the epi growth process. A dielectric material 1406 is then used to fill the rest of the trench. In one embodiment, dielectric material 1406 comprises high quality thermal oxide. The thermal oxide fill helps improve reliability. Also, the P charge can be easily controlled by P-epi liner 1404. The remaining structural details of the power device (not shown), and the manner of forming them, may be similar to those shown in FIG. 13B.

Another embodiment directed to eliminating formation of voids in deep trenches is shown in FIG. 15. This embodiment is similar to the FIG. 14 embodiment except that the fill process includes forming an additional epi layer in the trenches. In FIG. 15, trenches 1508 (one of which is shown in FIG. 15) are formed in one or more layers of N-epi 1502. Those portions of the one or more N-epi layers 1502 that separate adjacent trenches 1508 from one another, form N-pillars. A first P-epi liner 1510 lining the trench sidewalls and bottom is formed in trenches 1508. Trenches 1508 are then mostly filled by another lighter doped P-epi layer 1504. The thicknesses of P-epi layers 1510 and 1504 are selected so that the top of trenches 1408 remain open after the epi fill process. A dielectric material 1506 is then used to fill the rest of the trench. In one embodiment, dielectric material 1506 comprises high quality thermal oxide. The remaining structural details of the power device (not shown), and the manner of forming them, may be similar to those shown in FIG. 13B.

FIG. 16A shows a cross section view of yet another super junction device with pillars of alternating conductivity type. In this embodiment, the P-pillars include 2 differently doped P epi layers: an outer P-epi layer 1610A, and a center P epi layer 1610C. These two epi layers may be formed by successively filling the trench with P epi layers of increasing doping concentration. An advantage of such P-pillar structure is that the width of the N-pillars is kept intact since the outer P epi layer 1610A is lightly doped and thus the lateral diffusion of P-type dopant into adjacent N-pillars has minimal or no impact on the increase in the N-pillar resistivity. Keeping the width and resistivity of the N-pillars intact improves Rds-on.

The FIG. 16A structure further includes a retro-graded N-pillar. As can be seen, the N-pillar includes, from bottom to top, N+ region 1618, N epi layer 1606 and N-epi layer 1608. Such retro-graded N-pillar advantageously reduces the peak electric at the P-N junction formed by the P-body and N-drift regions, and lowers the Rds-on. The N+ region 1618 of the N-pillar can be formed as follows. Prior to forming N-epi layer 1604 over substrate 1602, a heavy dose of arsenic is implanted into region 1604 of substrate 1602 using a mask. During subsequent heat cycles, the arsenic in heavily implanted region 1604 up-diffuses into N-epi layer 1604, thus forming N+ region 1618.

The remaining portions of the FIG. 16A structure may be formed as follows. N epi layer 1606 and N-epi layer 1608 are formed over N-epi layer 1604 using conventional techniques. Deep trenches extending into N-epi layer 1608 and N epi layer 1606 are formed using known methods. The deep trenches terminate in or prior to reaching N-epi layer 1604. The deep trenches are then filled with P epi layers 1610A and 1610C using conventional epi processes. The remaining surface structures of the super junction device, in this case a trench gate MOSFET, are formed using known techniques. The gate trenches housing gate electrodes 1612 are formed in N-epi 1608, followed by forming a thick bottom oxide along the trench bottom. Gate dielectric 1616 is formed along the trench sidewalls followed by forming recessed gate electrodes 1612 in the gate trenches. Source regions 1614 are formed adjacent the gate trenches, and a source metal contacting source regions 1614 and P epi layers 1610A, and 1610C is formed along the top surface of the structure. A drain metal (not shown) contacting substrate 1602 is formed along the backside.

FIG. 16B shows a cross section view of another super-junction device with pillars of alternating conductivity type. In this embodiment, the P-pillars include 2 differently doped epi layers: an outer P+ epi layer 1611A and a center P− epi layer 1611C. An advantage of such P-pillar structure is that the P-pillar charge is set by the outer P+ epi layer 1611A which lines the trench. Thus, the effect of the charge variation of the P-pillar at the top and the bottom remains consistent and is independent of the trench angle which makes the trench wider at the top. Keeping the P-pillar charge the same from top to bottom of the trench reduces the variation in charge imbalance resulting from the trench angle, which in turn results in less variation of breakdown voltage.

FIG. 16C shows a cross section view of yet another super junction device with pillars of alternating conductivity type. In this embodiment, the P-pillars include 3 differently doped P epi layers: outer P− epi layer 1613A, center P− epi layer 1613C and middle P epi layer 1613B sandwiched by outer epi layer 1613A and center epi layer 1613C. These three epi layers may be formed by successively filling the trench with P epi layers of different doping concentrations. Such P-pillar structure provides a compromise between FIGS. 16A and 16B. This structure offers the advantage of the FIG. 16A structure, namely, the lateral diffusion of P-type dopants into the N-pillars is substantially reduced thus minimizing or eliminating the impact on the N-pillar resistivity. The FIG. 16C structure also offers the advantage of the FIG. 16B structure in that the effect of the charge variation of the P-pillar at the top and the bottom remains consistent and is independent of the trench angle because the P-pillar charge is set by the middle P+ epi layer 1613B. Thus, the FIG. 16C structure has the advantages of reduced breakdown voltage variation and reduced Rds-on.

Figure 17:
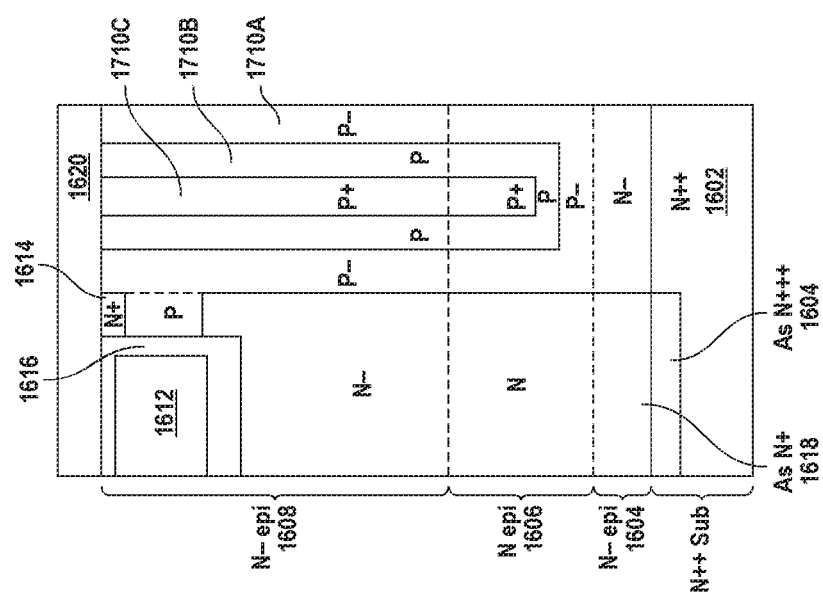

FIG. 17 shows a cross section view of yet another super junction device with pillars of alternating conductivity type. In this embodiment, the P-pillars include 3 differently doped P epi layers: outer P− epi layer 1710A, center P+ epi layer 1710C and middle P epi layer 1710B sandwiched by outer epi layer 1710A and center epi layer 1710C. These three epi layers may be formed by successively filling the trench with P epi layers of increasing doping concentration. An advantage of such P-pillar structure is that the width of the N-pillars is kept intact since the outermost P epi layer 1710A is lightly doped and thus out-diffuses minimally. Keeping the width of the N-pillars intact improves Rds-on.

Figure 18:
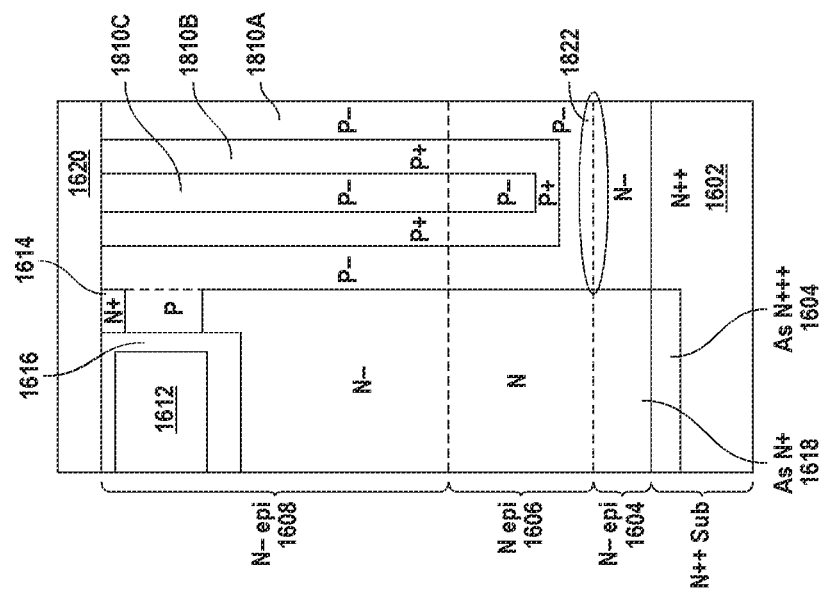

In another embodiment shown in FIG. 18, P-enrichment region 1822 is formed at the bottom of each P-pillar using similar techniques to those described above for forming N-enrichment regions 1105 in FIG. 11. Such P-enrichment regions advantageously compensate up-diffusion of dopants from N-epi layer 1604. Many of the same variations discussed above in connection with N-enrichment regions 1105 in FIG. 11 may be applied to the FIG. 18 embodiment. Also, enrichment region 1822 can be formed along the bottom of the P pillars in the embodiments shown in FIGS. 16A-16C and 17.

Although epi layer 1610A in FIG. 16A, epi layer 1611C in FIG. 16B, epi layers 1613A, 1613C in FIG. 16C, epi layer 1710A in FIG. 17, and epi layers 1810A and 1810C in FIG. 18 are all shown as P-epi, they could be lightly doped N- or intrinsic epi silicon. Further, center layer 1611C in FIG. 16B, center layer 1613C in FIG. 16C and center layer 1810C in FIG. 18 embodiments need not be from epi, and can instead be from another material such as polysilicon.

Figure 19A:
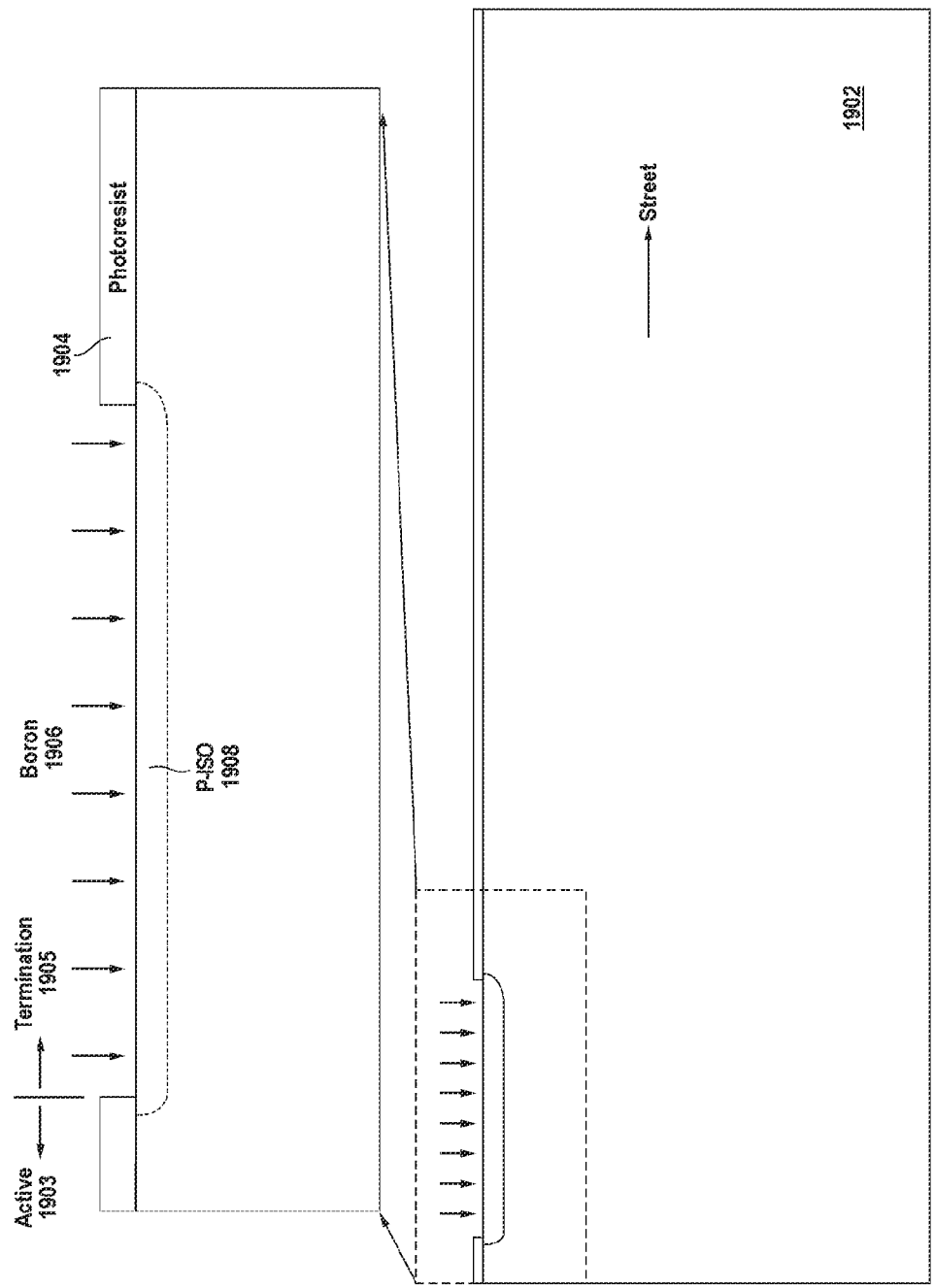

FIGS. 19A-19L are cross section views showing various stages of a process for forming a super junction trench-gate MOSFET. These figures show a portion of the die where active region 1903 transitions into termination region 1905. In FIG. 19A, N-epi 1902 is formed over a suitable substrate (not shown) using conventional techniques. N-epi 1902 may comprise multiple epi layers with different doping concentrations, or may be a single epi layer with graded or uniform doping concentration. Using masking layer 1904 (e.g., comprising photoresist), a boron implant process 1906 is then carried out to form P-Iso region 1908 in N-epi layer 1902. P-iso region 1908 extends in the transition and termination regions, and is incorporated for reasons stated above in connection with FIG. 3, and is formed in a similar manner to that in FIG. 3.

Figure 19B:
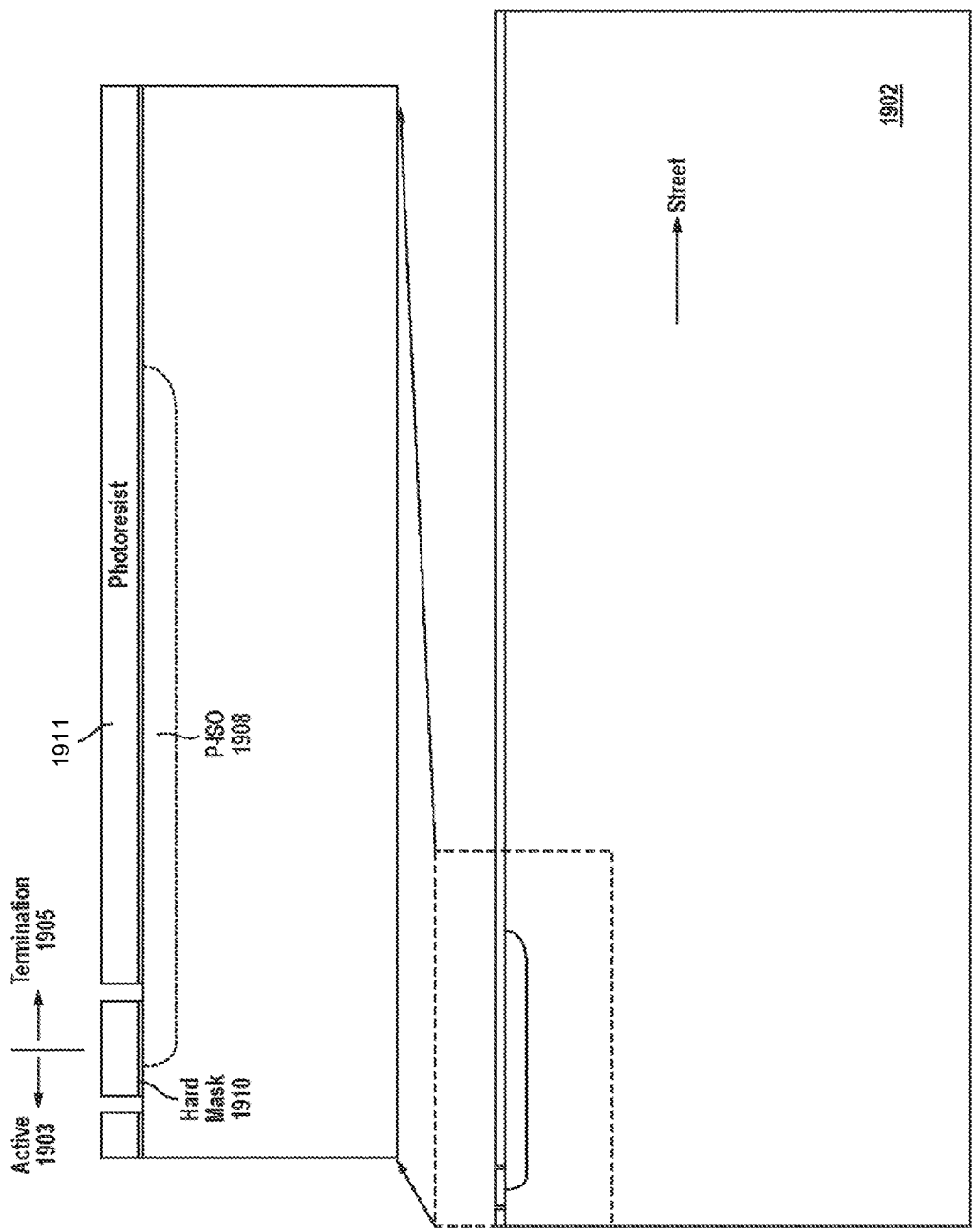
Figure 19D:
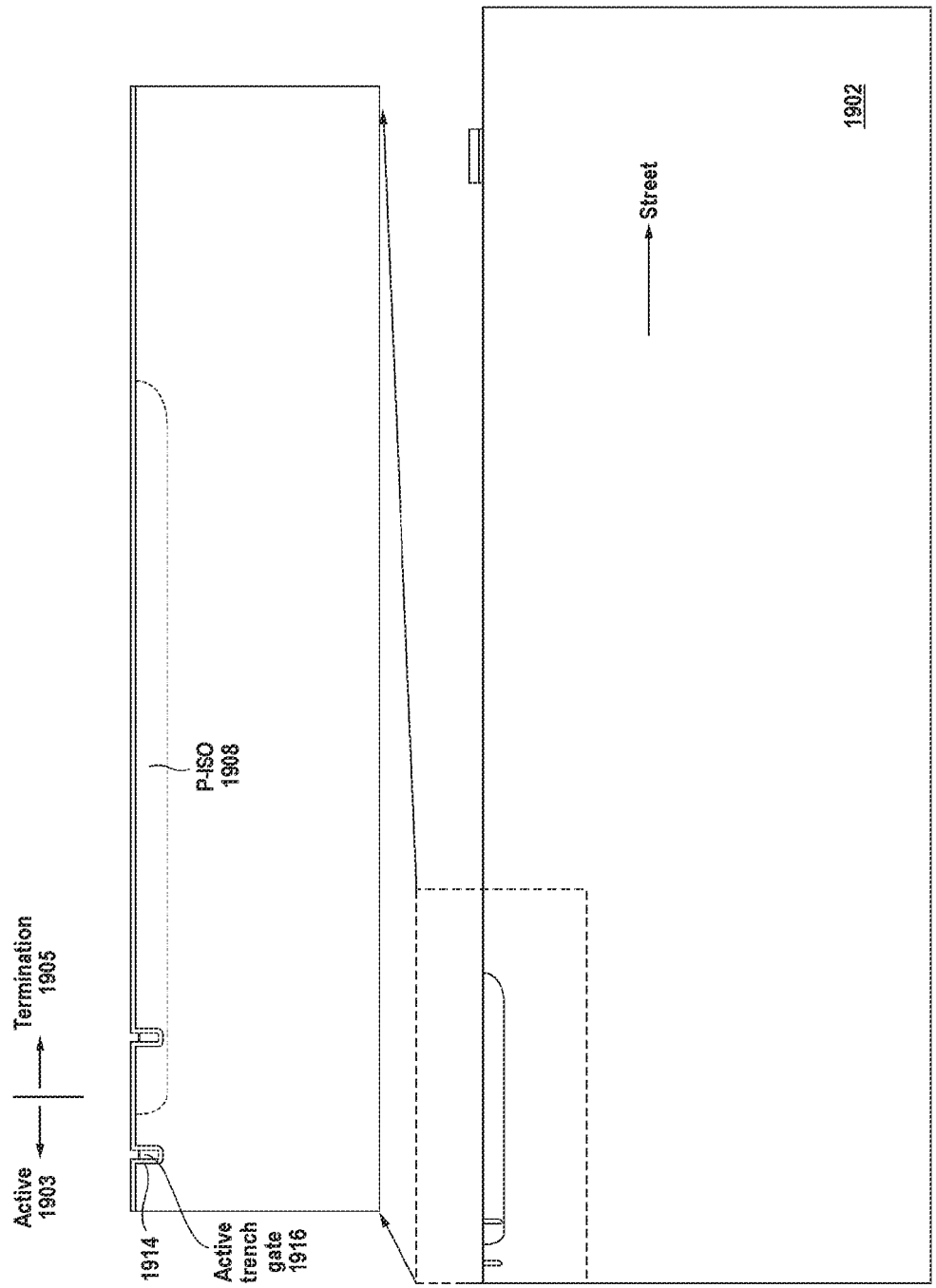

In FIG. 19B, P-iso drive and trench hard mask oxidation are carried out in one process step. Hard mask 1910 (comprising oxide) is then formed over the top surface. Trenches 1912 are defined using photoresist 1911. In FIG. 19C, trenches 1912 are formed in N-epi layer 1902 using known techniques. Gate dielectric 1914 is then formed along trench sidewalls and bottom using conventional techniques (e.g., gate oxidation). Prior to forming gate dielectric 1914, a thick bottom dielectric may optionally be formed along trench bottoms to reduce the gate to drain capacitance. In FIG. 19D, conventional polysilicon deposition and etch back steps are carried out to form recessed gate electrodes 1916 in trenches 1914.

Figure 19E:
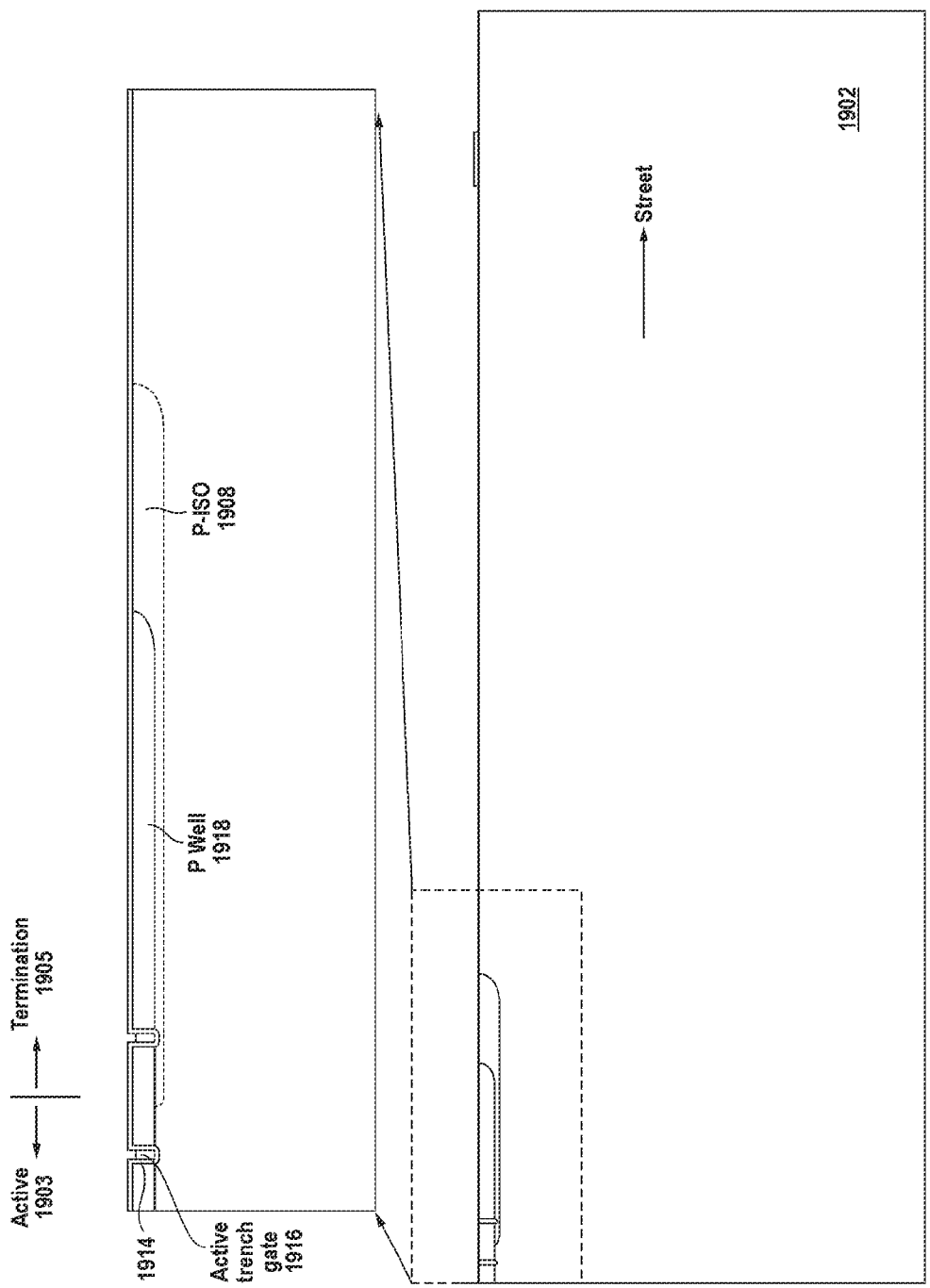
Figure 19F:
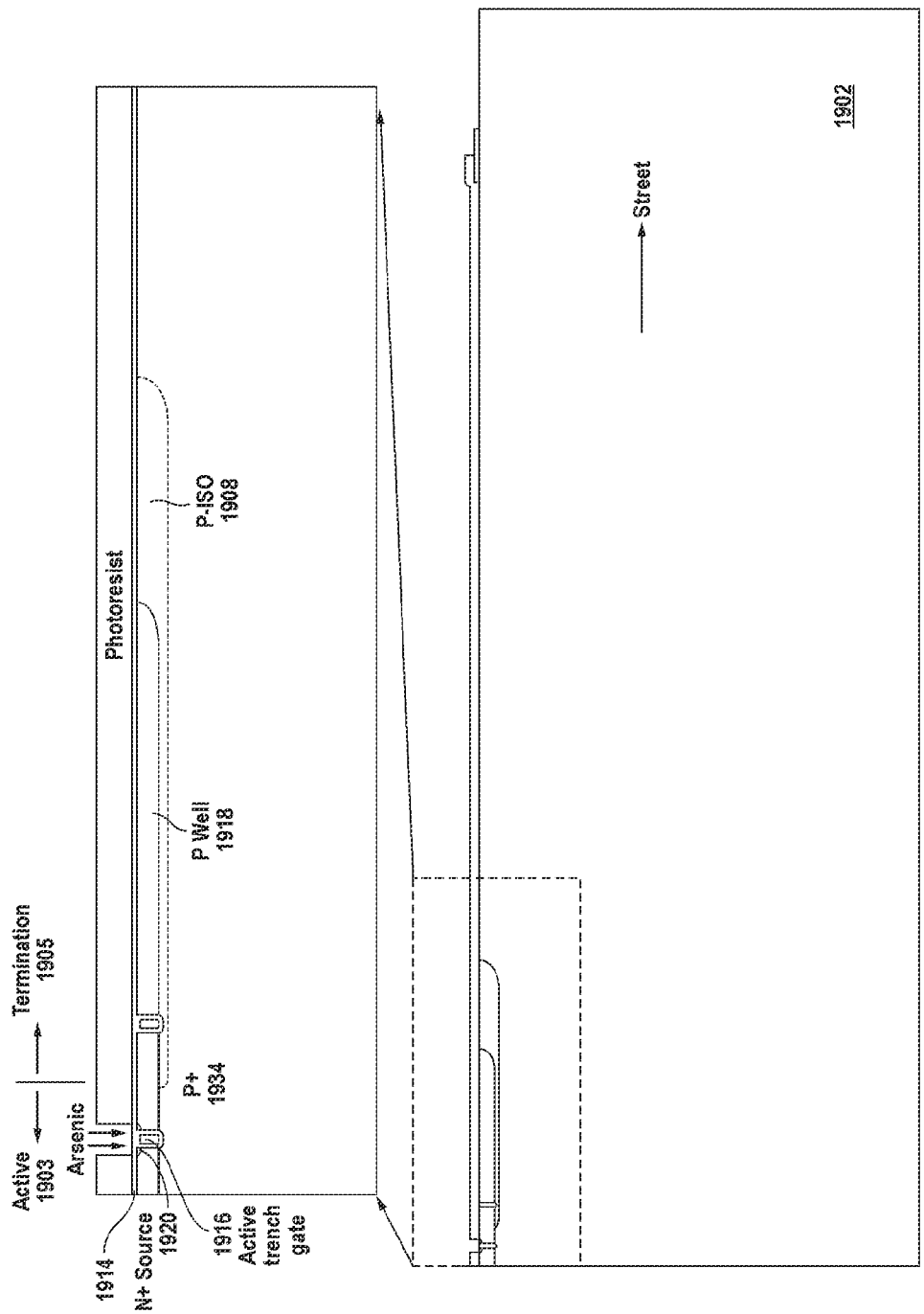
Figure 19G:
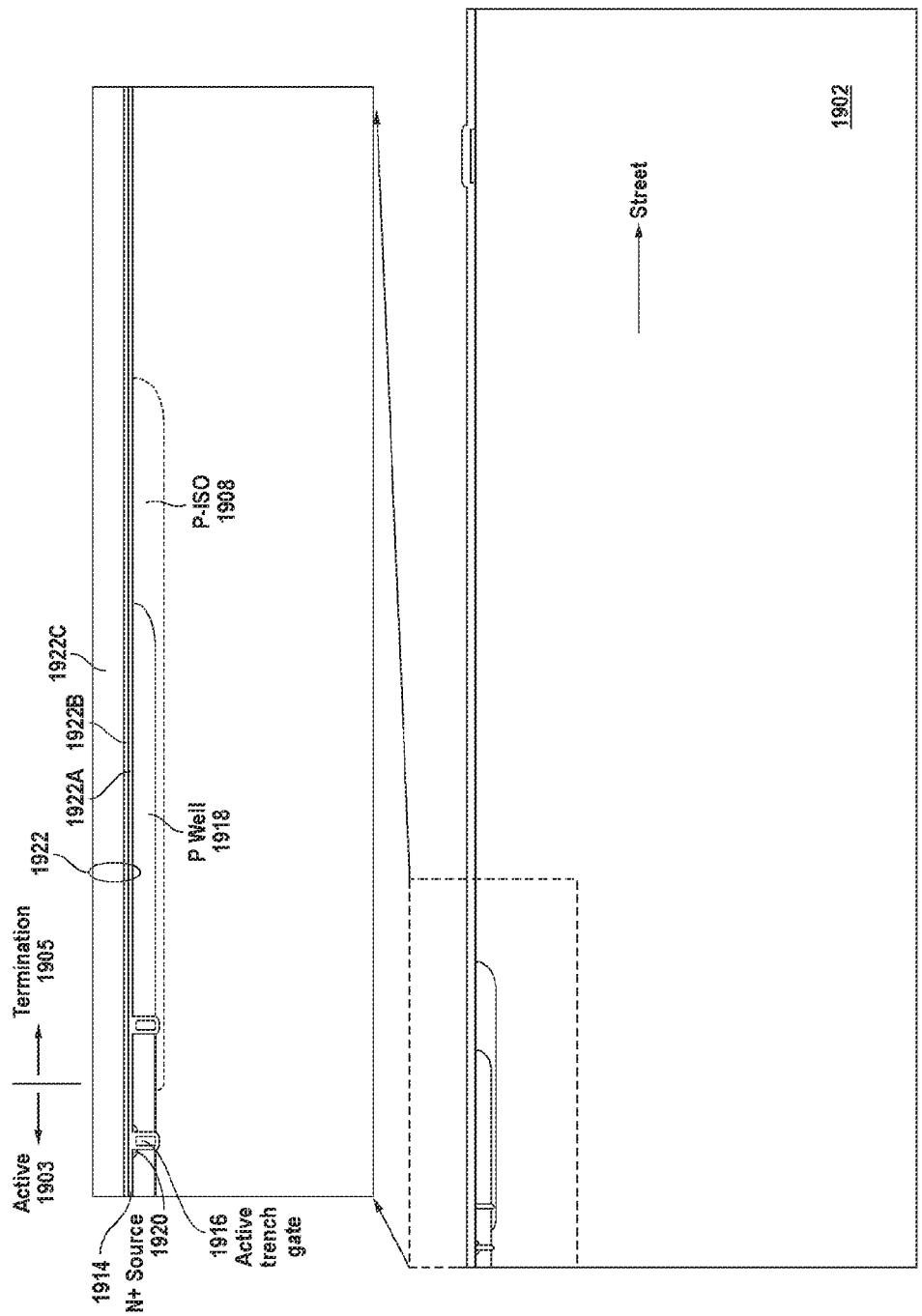
Figure 19H:
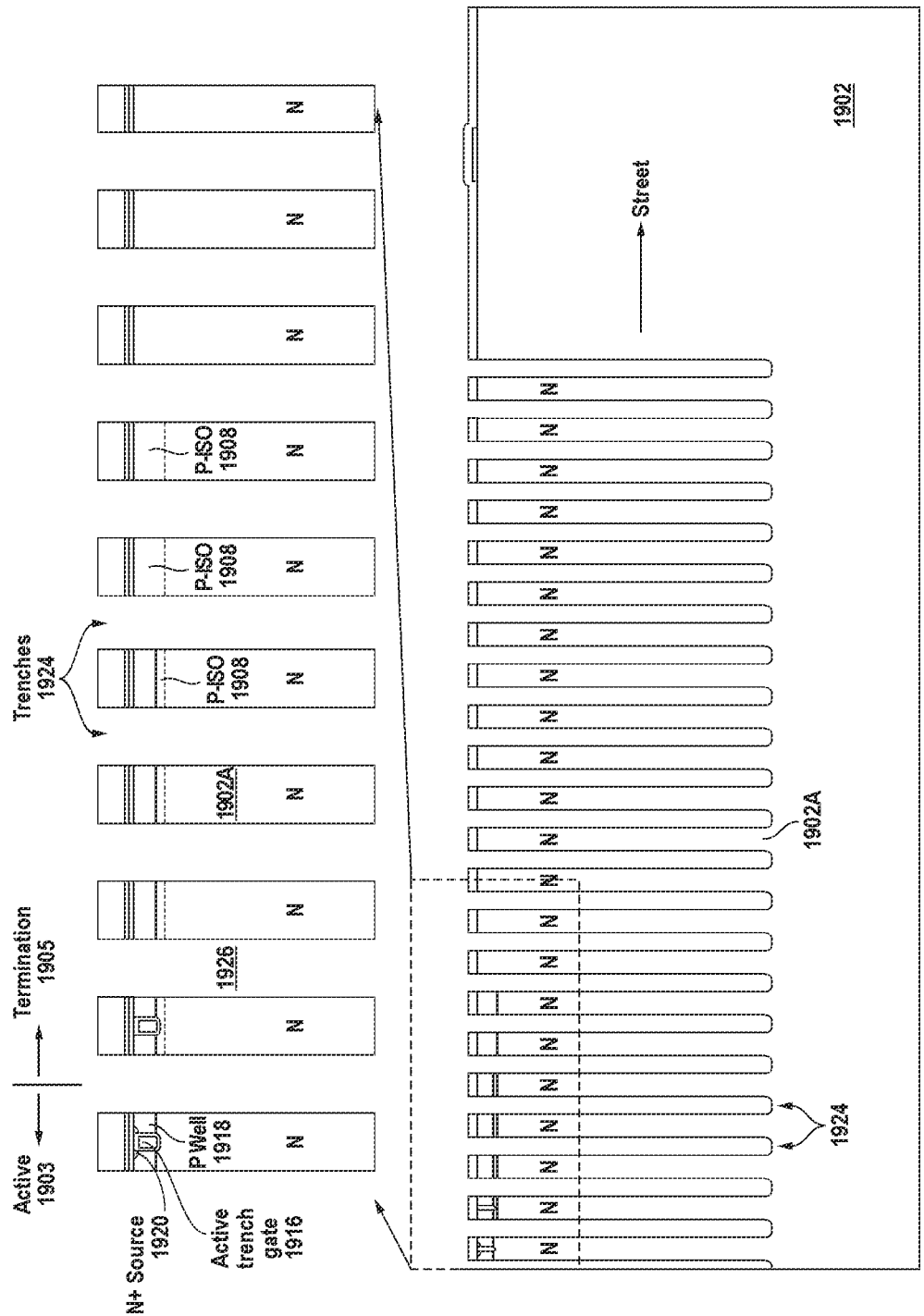

In FIG. 19E, P-type body regions 1918 are formed in N-epi 1902 using conventional implant and drive processes. In FIG. 19F, source regions 1920 are formed in the active region adjacent active trenches using conventional implant and drive processes. In FIG. 19G, an oxide-nitride-oxide (ONO) composite layer 1922 is formed using known techniques. In one embodiment, the ONO comprises from bottom to top: pad oxide 1922A, nitride 1922B, and thick LTO 1922C. Pad oxide 1922A serves as a nitride etch stop in a later process step. In FIG. 19H, deep trenches 1924 are defined and etched into N-epi 1902 using techniques described in this disclosure, or using known techniques.

Figure 19I:
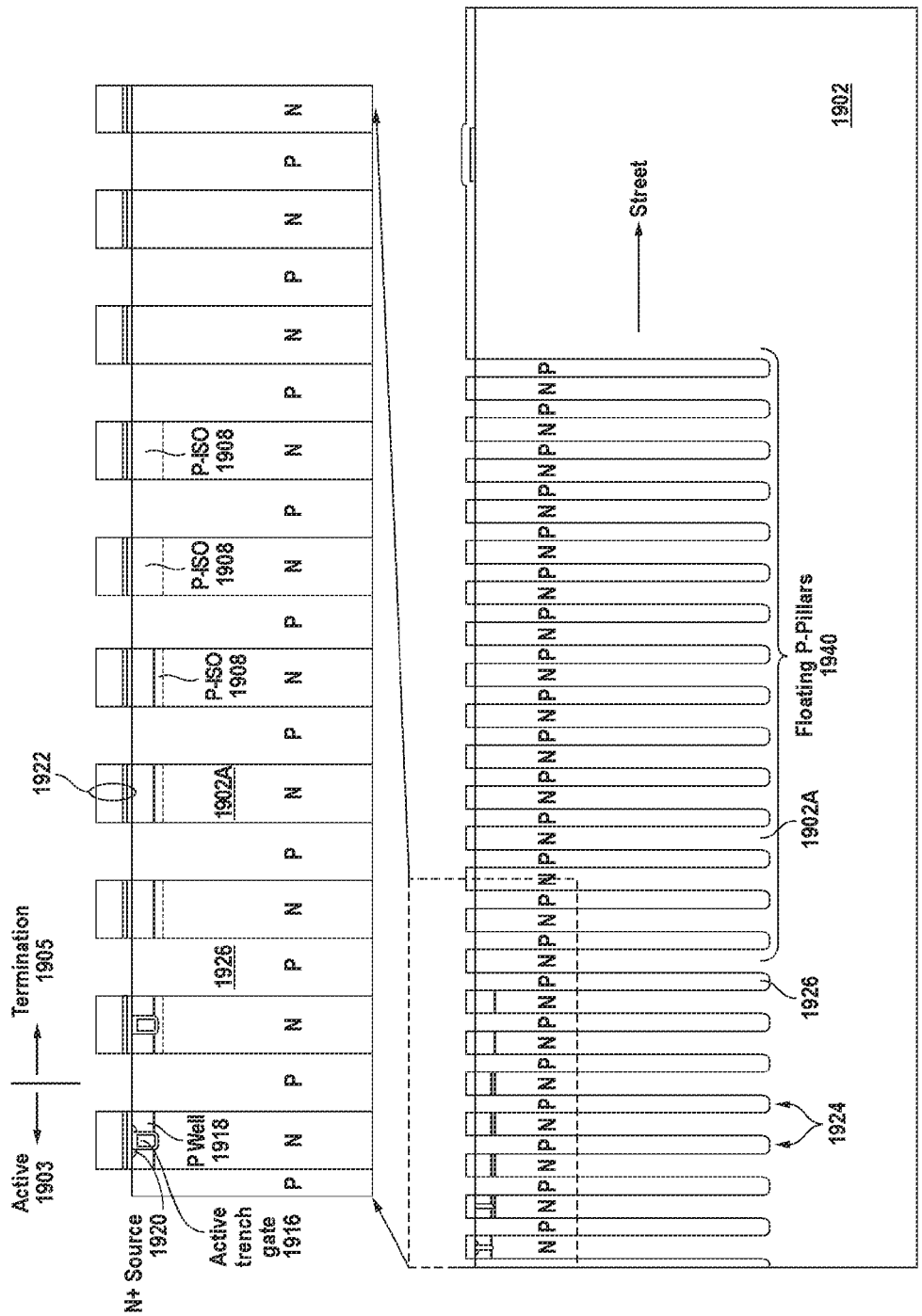
Figure 19J:
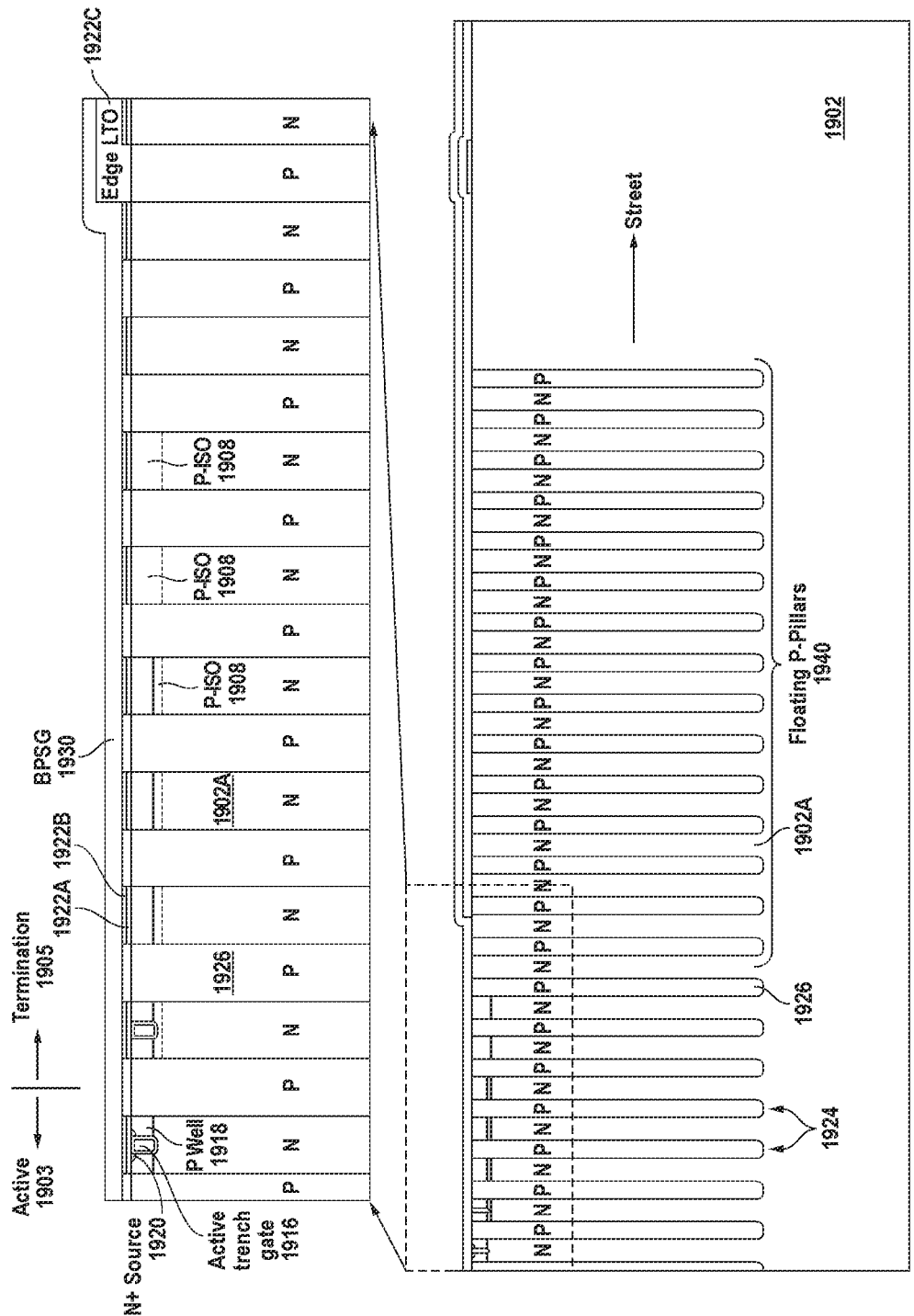
Figure 19K:
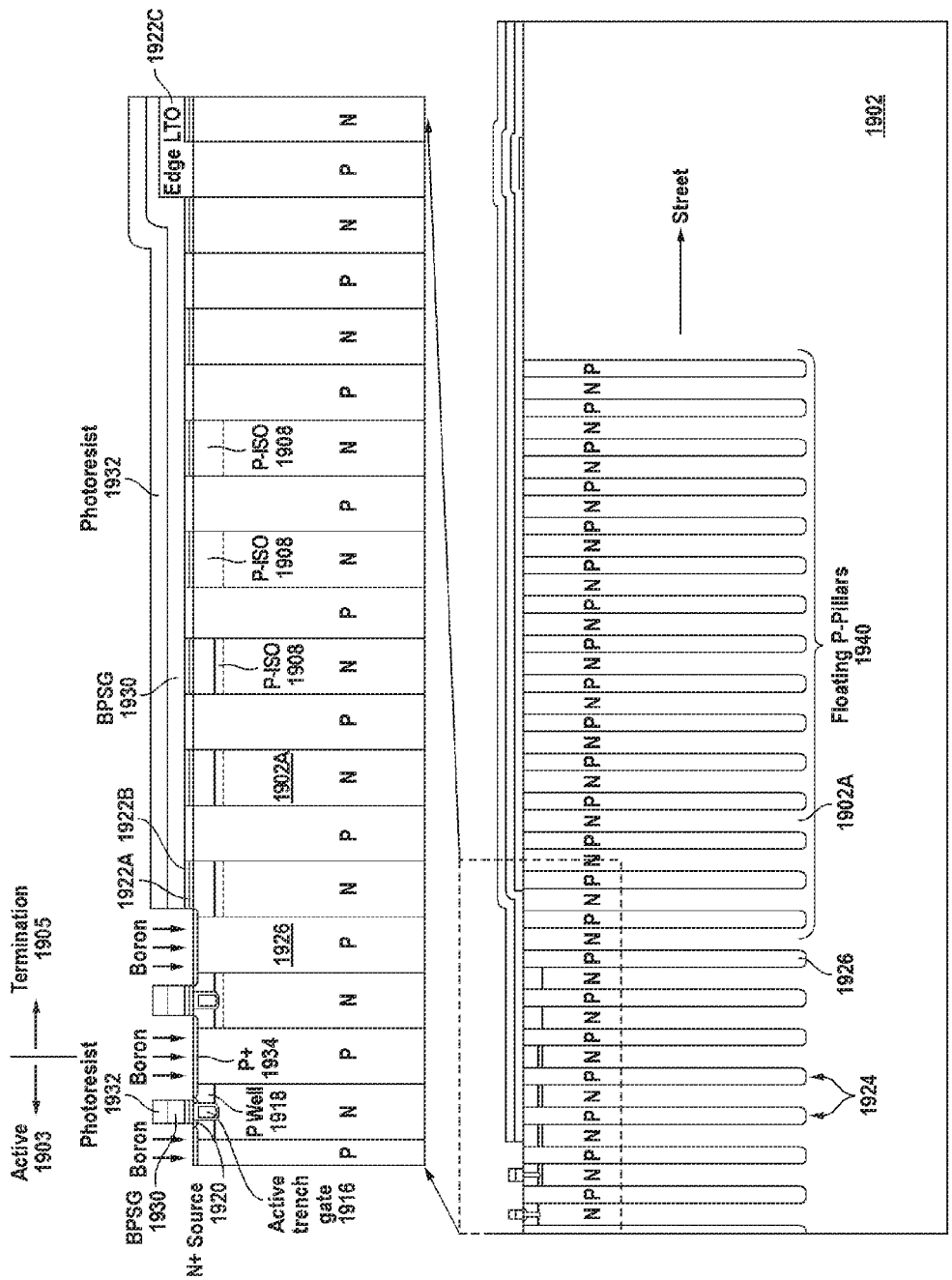
Figure 19L:
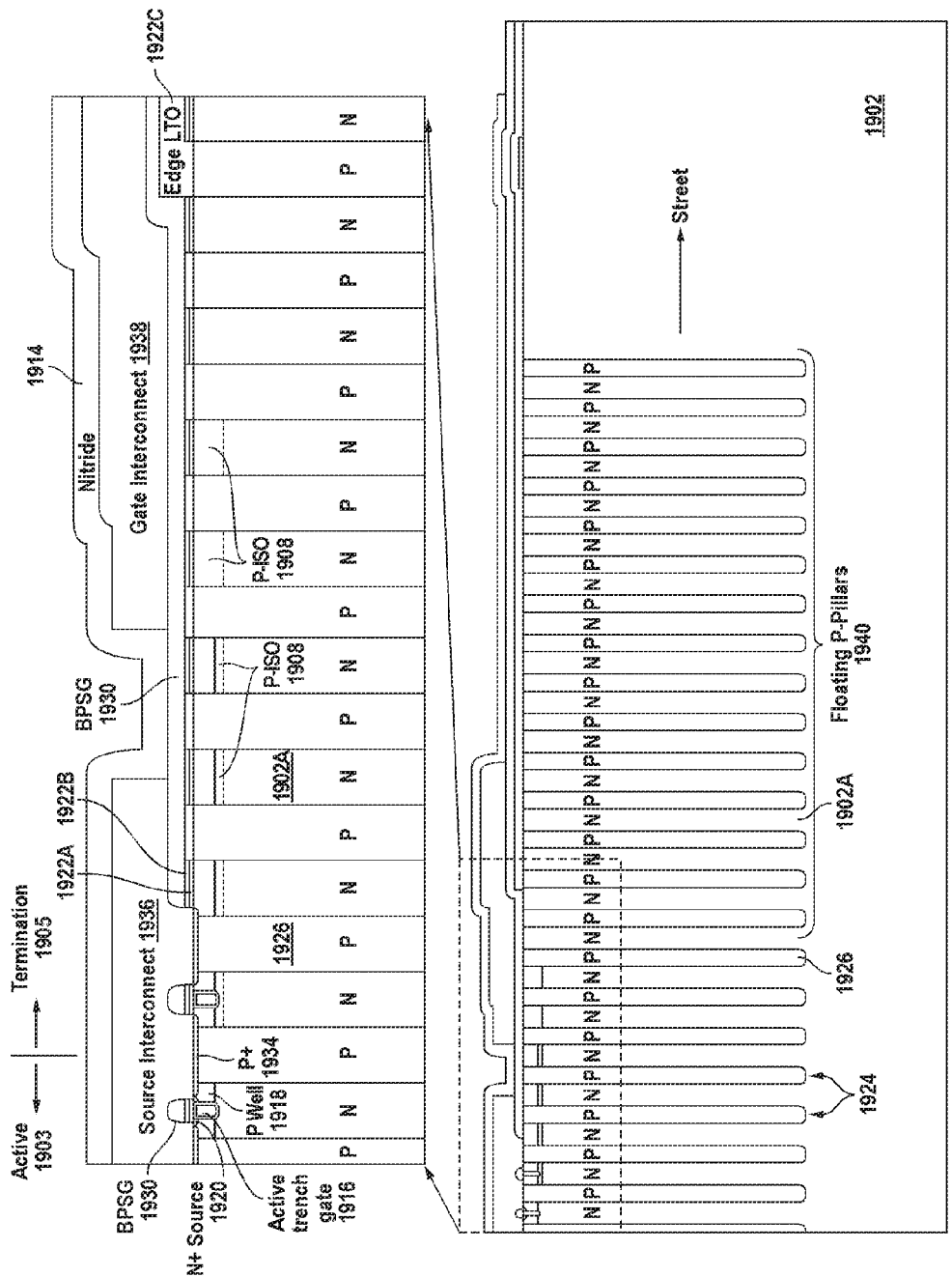

In FIG. 19I, known techniques are used to fill trenches 1924 with P-type silicon 1926. As can be seen, vertically extending portions 1902A of N-epi 1902 between adjacent P-filled pillars 1926, form N-pillars. N-pillars 1902A and P-pillars 1926 thus form the super-junction structure, namely, the alternating pillars of opposite conductivity type. In FIG. 19J, the top oxide layer in ONO composite layer 1922 is removed, defining edge LTO 1922A, and BPSG 1930 is formed over the surface of the device using conventional processes and then annealed. In FIG. 19K, BPSG 1930 is defined and etched using masking layer 1932 (e.g., comprising photoresist) to form contact openings in BPSG 1930. The remaining portions of BPSG 1930 cover the gate electrodes and extend over source regions 1920. A conventional heavy body implant is carried out to form P+ heavy body regions 1934 through the contact openings. Alternatively, dimples may be etched in body regions 1918, and P-type dopants may then be implanted along the bottom of the dimples to form P+ heavy body regions in body regions 1918. The dimples also expose sidewalls of the source regions to which contact can be made by the later formed source metal. In FIG. 19L, a conventional BPSG reflow is carried out to round the corners of the dielectric, followed by formation of the various metal layers (e.g., source metal layer 1936 and gate metal layer 19368). A backside metal (e.g., drain metal, not shown) contacting the substrate on the backside of the die is formed using known techniques.

In termination region 1905, the P-Iso region 1908, which is electrically connected to source metal 1936, connects a number of the P-pillars together and thus biases these P-pillars along their tops to the source potential. All termination P-pillars located to the right of P-Iso region 1908 float, and are marked in FIG. 19L as "floating P-pillars 1940."

As can be seen, P-pillars 1926 are formed relatively late in the process as compared to conventional trenched pillar processes where the P-pillars are formed early in the process. Because the P-pillars are formed late in the process after most of the thermal budget has been completed, the out-diffusion of the P-pillar dopants is advantageously minimized. This enables use of tighter pitch for P-pillars and results in lower Rds-on without compromising breakdown voltage.

Figure 20:
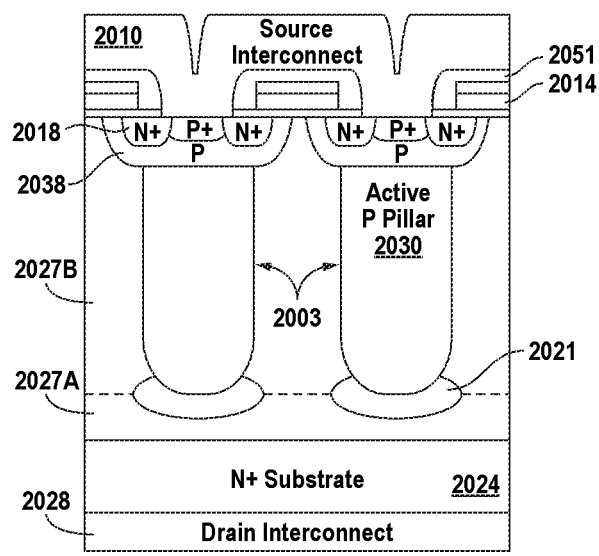
FIG. 20 is simplified cross section view used to illustrate the process for forming the planar-gate variation of the trench-gate MOSFET in FIGS. 19A-19L.

The process embodiment depicted by FIGS. 19A-19L is directed to a trench gate MOSFET however, this process can be modified to implement a planar gate MOSFET with the same advantages, as described next. This process will be described with reference to FIG. 20, which is a cross section view of a planar gate MOSFET that is formed using the process that is described next. One or more N-type epitaxial layers 2027A, 2027B are formed over a suitable substrate 2024 using know techniques. P-type enrichment regions 2021 may optionally be formed in epi layer 2027A prior to forming epi layer 2027B. As described in connection with other embodiments, P-enrichment regions 2021 advantageously create more of a charge imbalance at the bottom of the P-pillars, thereby inducing the onset of avalanche breakdown at the bottom of the P-pillars and away from the body-drift junction.

The gate dielectric and the overlying planar gate electrodes 2014 are defined and formed over N-epi 2027B using known techniques. P-type dopants are then implanted with planar gate electrodes 2014 serving as a blocking layer, followed by a drive step, thus forming P-type body regions 2038 in N-epi 2027B. After the drive step, the P-type body regions laterally extend under the gate electrodes. Using known techniques, source regions 2018 are then defined and formed in body regions 2038 adjacent each edge of gate electrodes 2014. A conformal layer, e.g., a nitride layer, (not shown) extending over the gate electrodes and stepping down between adjacent gate electrodes over the body and source regions is formed using known techniques. A thick layer of LTO (not shown) is then formed over the nitride layer. The LTO is then defined and etched to expose silicon surfaces between adjacent gate electrodes where deep trenches 2003 are to be formed. The LTO would cover the source regions 2018. A conventional silicon etch is then carried out to form deep trenches 2003.

Next, the trenches are filled with P-type silicon using conventional techniques. The LTO is removed using the conformal (e.g., nitride) layer as an etch stop. The conformal layer may then be removed or may be left intact and used as a self alignment spacer to space off a high energy P+ implant from the poly gate edges. Dielectric cap 2051 (e.g., comprising BPSG) covering gate electrodes 2014 is formed using conventional techniques. Dielectric cap 2051 form contact openings between adjacent gate electrodes. A heavy body implant is carried out through the contact openings to form the P+ heavy body regions in body regions 2038 between adjacent source regions 2018. The remaining process steps would be similar to those shown in FIG. 18L and thus will not be described. As can be seen, in this planar gate process, as in the trench gate process of FIGS. 18A-18L, the P-pillars are formed late in the process after much of the thermal budget is used, thus minimizing out-diffusion of P-pillar dopants.

Figure 21:
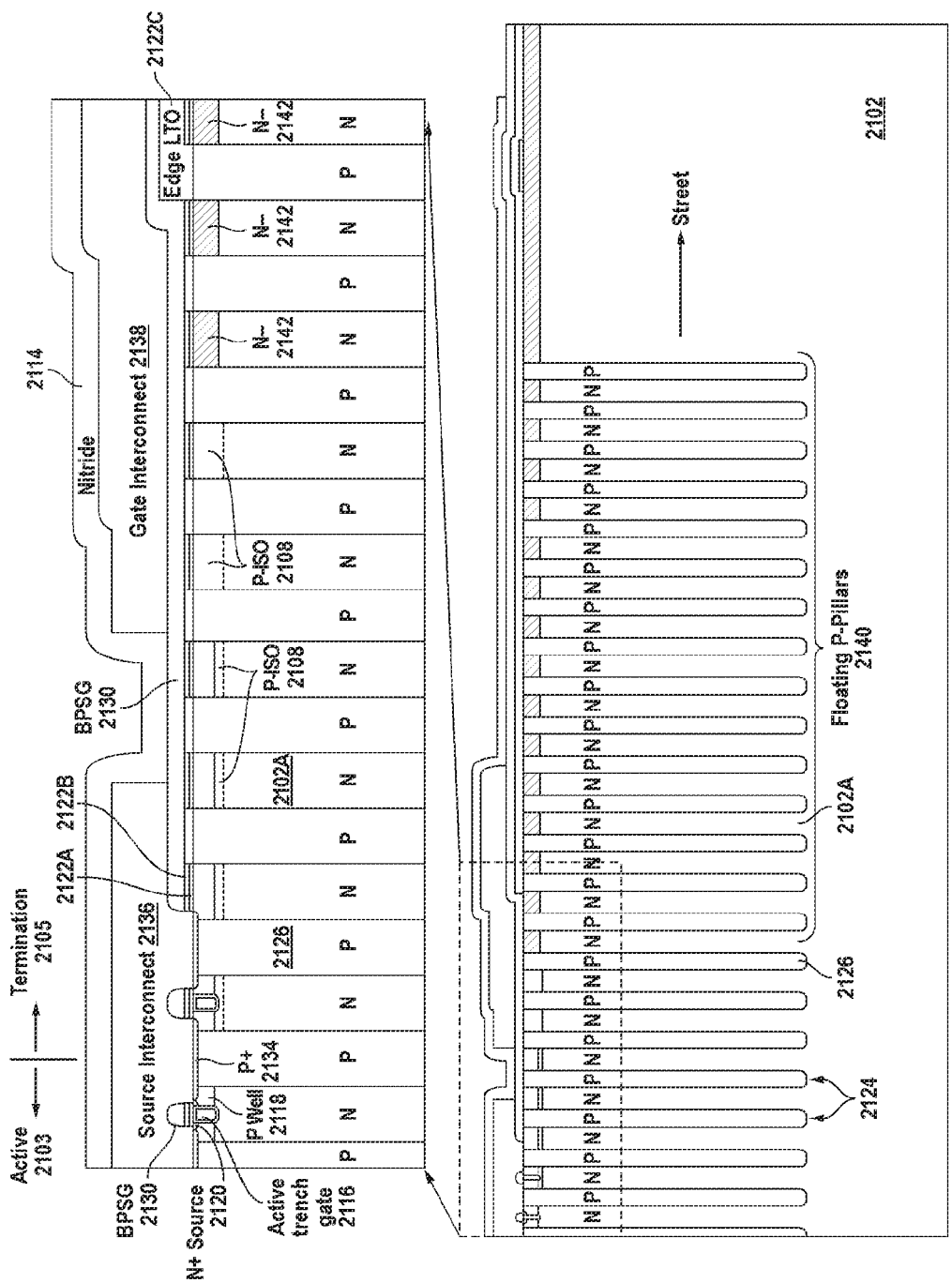
FIGS. 21 and 22 are simplified cross section views along a portion of the die where the active region transitions into the termination region.
Figure 22:
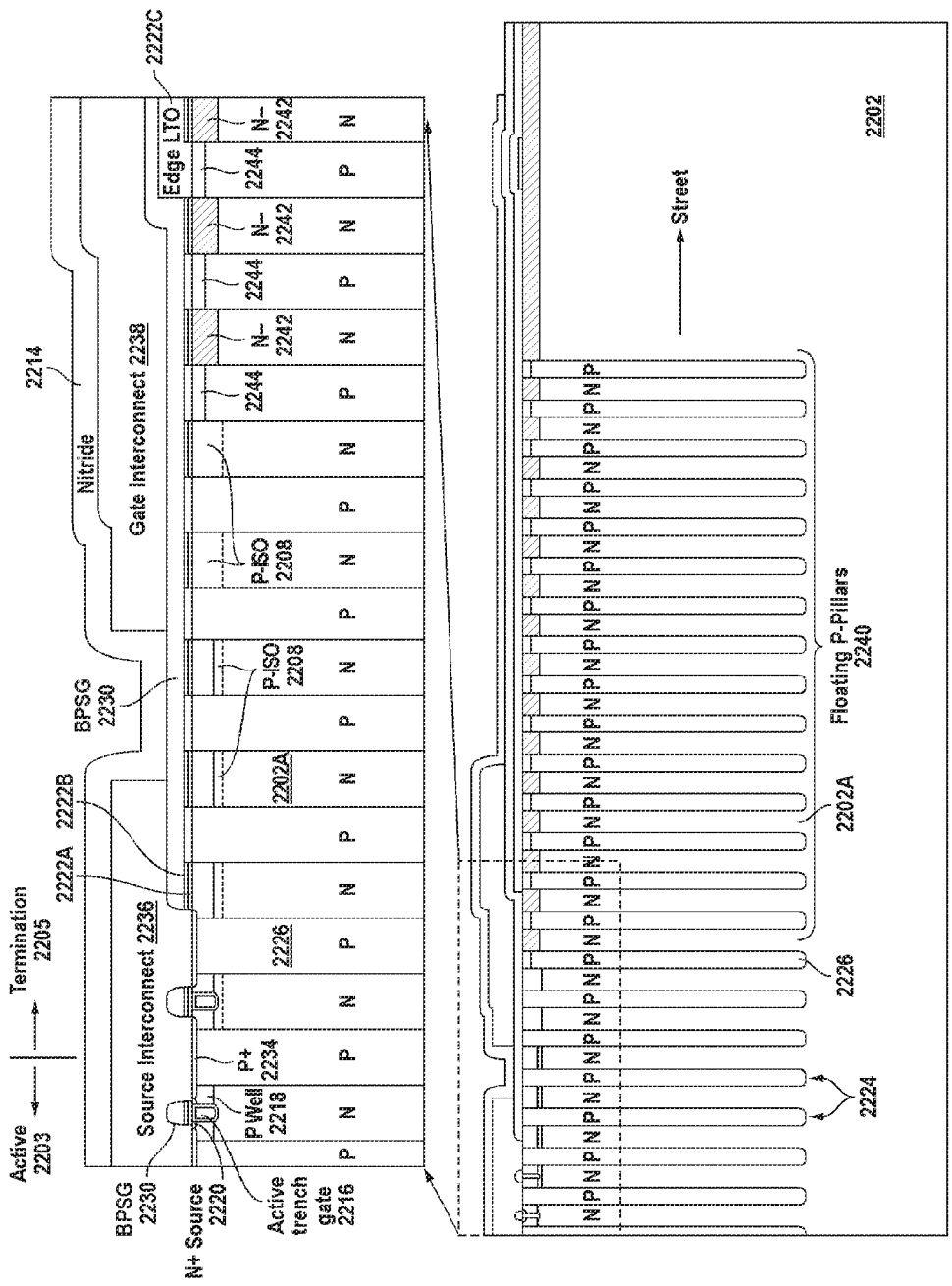

In the process technology where pillars are formed by etching trenches and filling them with silicon (rather than using the multi-epi process), varying the mesa width is undesirable as it results in non-uniform trench etch and filling. Therefore, center-to-center pillar spacing needs to be maintained constant to the extent possible. However, with a constant pillar spacing other provisions need to be made to obtain the desired surface electric field profile. FIGS. 21 and 22 are cross section views showing exemplary embodiments where the desired surface electric profile is obtained using surface N regions and/or surface P regions.

FIG. 21 shows a cross section view along a portion of the die where the active region transitions into the termination region. The cross section view in FIG. 21 is similar to that shown in FIG. 19L except N− surface regions 2142 are formed along the top of those N-pillars 2102A located between floating P-pillars 2140 in termination region 2105. N− surface regions 2142 advantageously serve to spread the surface electric field thus improving the break down voltage in the termination region. All other structural features in the FIG. 21 cross section view are similar to those in FIG. 19L and thus will not be described.

The process steps for forming N− surface regions 2142 can be incorporated in the process sequence depicted by FIGS. 19A-19L as follows. In FIG. 19A, prior to forming any of the regions along the top surface, N− surface region 2142 may be formed by growing a lightly doped N− epitaxial layer over N-epi 1902. The N− epitaxial layer 2142 would have a lower doping concentration than N-epi 1902. Alternatively, N− surface region 2142 may be formed by performing a blanket compensation P-implant into N-epi 1902 so that a top layer of N-epi 1902 is converted to a lighter doped N− layer. The process sequence as depicted in FIGS. 19A-19L would then be carried out to form the MOSFET.

In FIG. 21, the top regions of floating P-pillars 2140 in termination region 2105 together with their adjacent N-surface regions 2142 make an already P-rich condition along the pillar tops even more P-rich, thus potentially lowering the break down voltage in termination region 2105. The surface regions of floating P-pillars 2140 can be compensated to improve the charge balance along the pillar tops. In one embodiment, after forming the P-pillars as depicted by the process steps corresponding to FIG. 19I, and before the process steps corresponding to FIG. 19J (i.e., while the top surfaces of all P-pillars are exposed), a blanket compensation N implant is carried out to compensate the top regions of all P-pillars in the active and termination regions. Thus, the blanket compensation N implant into the top regions of all P-pillars ensures that the termination region has a higher break down voltage than the active region.

While FIG. 21 shows implementation of the N− surface regions in a trench gate MOSFET, the N− surface regions may also be incorporated in the planar gate variation. In the planar gate embodiment however, a JFET implant carried out only in the active region may be necessary to increase the doping concentration in the JFET regions which would otherwise be made up of the lightly doped N− surface region. The JFET implant enhances the transistor Rds-on which would otherwise be adversely impacted by the N− surface region. In the process described above in connection with the planar gate embodiment shown in FIG. 20, the JFET implant may be incorporated after forming the N− surface region but before forming the gate structure.

In the FIG. 22 embodiment, surface P-enrichment regions 2244 are formed along top surfaces of the P-pillars in termination region 2205. The active P-body regions 2218 may extend deeper than P-enrichment regions 2244, and may have a higher doping concentration than P-enrichment regions 2205. The doping and depth of P-enrichment regions 2244 as well as the doping and depth of N− surface regions 2242 may be designed to obtain a charge balance state resulting in a high breakdown voltage with a low peak electric field and substantially evenly distributed electric field across the termination region. In one embodiment, it is desirable to have the charge of P-enrichment regions 2244 higher than the charge of the N surface regions to minimize the peak surface electric field.

In any of the above embodiments, the P-pillars in both the active and termination regions may be equally spaced from one another so that all N-pillars have the same width.

Figure 23:
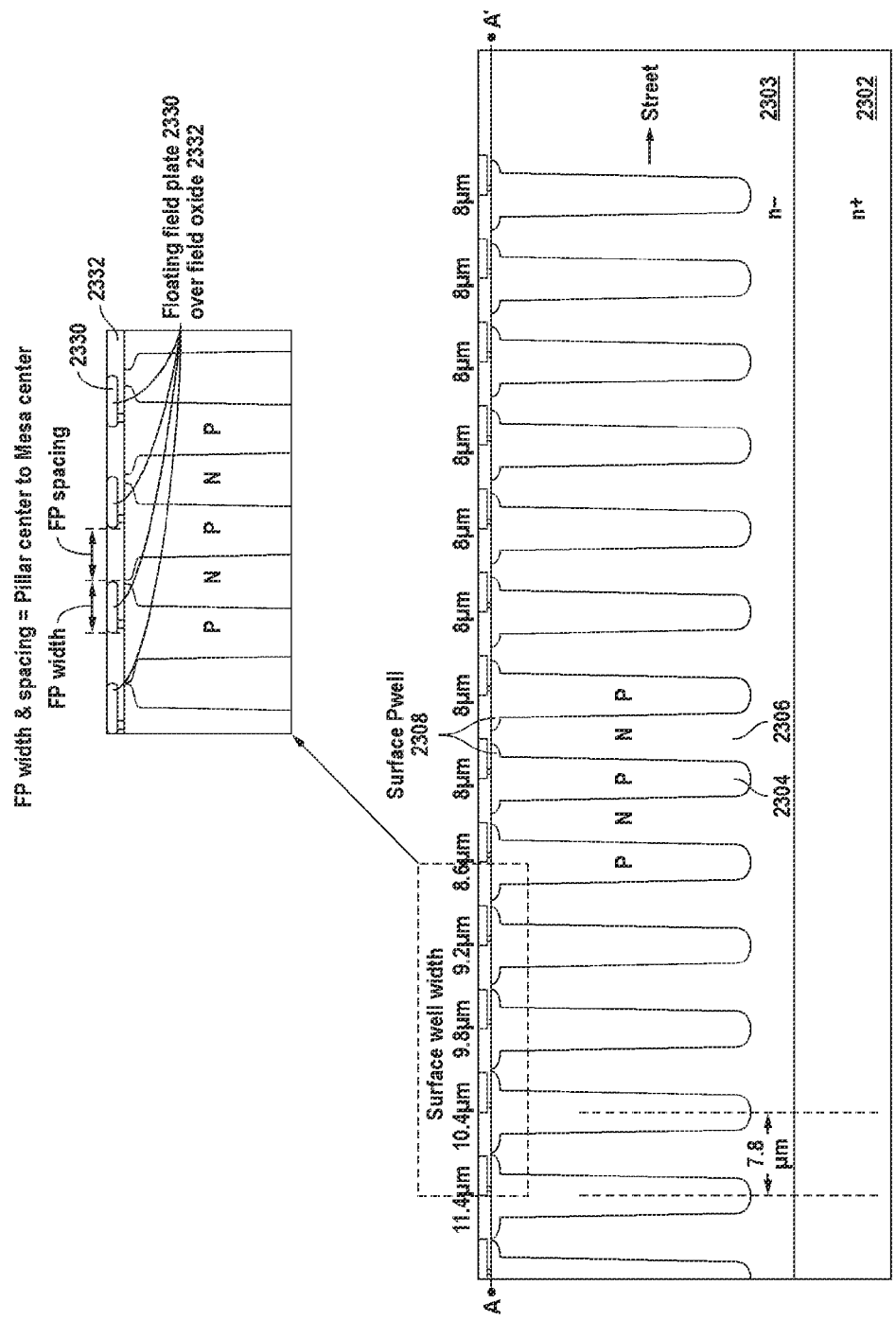
FIG. 23 is a simplified cross section view of a superjunction power device where field plates are electrically connected to their corresponding floating P-pillars.
Figure 24A:
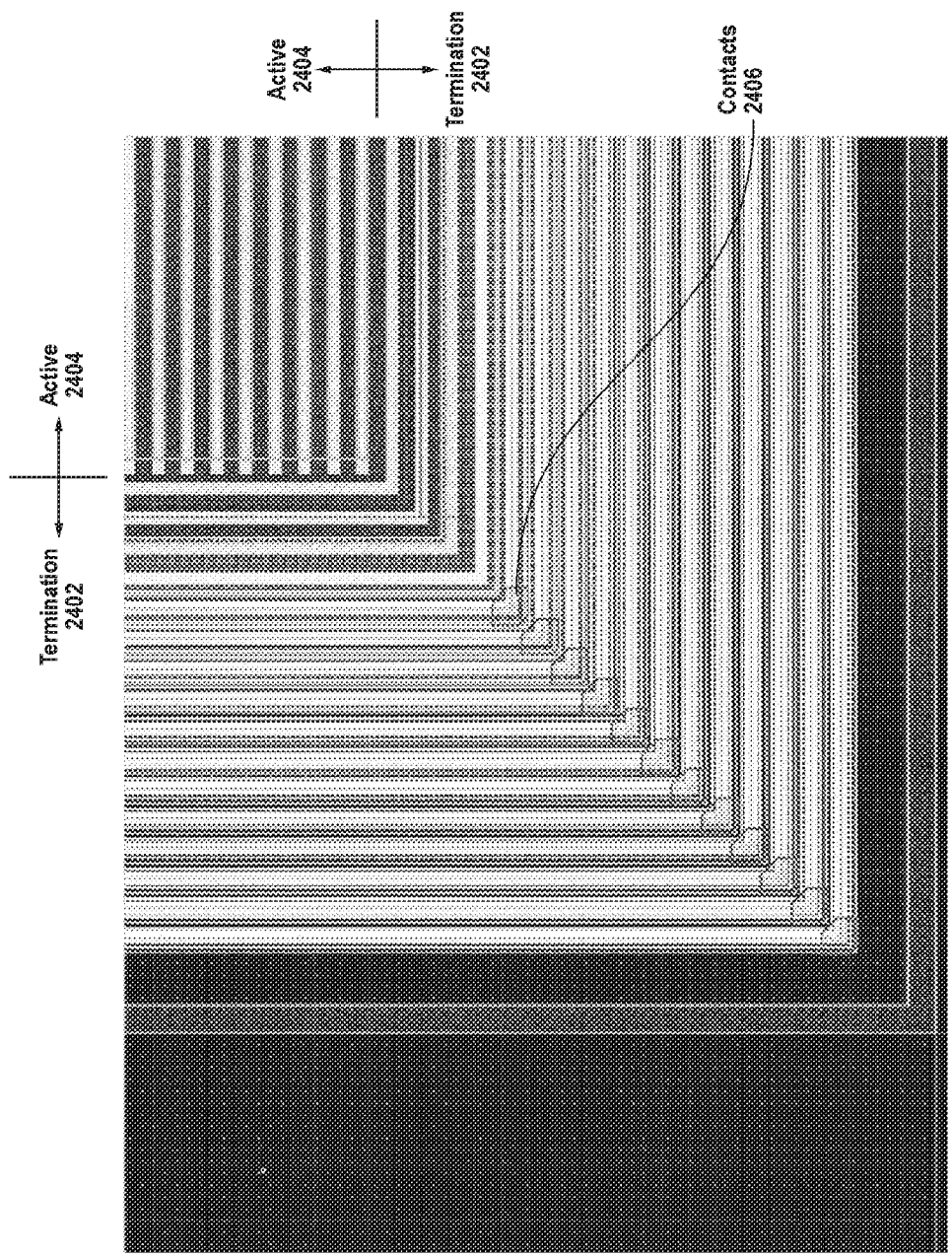
FIG. 24A is a top layout view of a corner region of a super-junction power device.
Figure 24B:
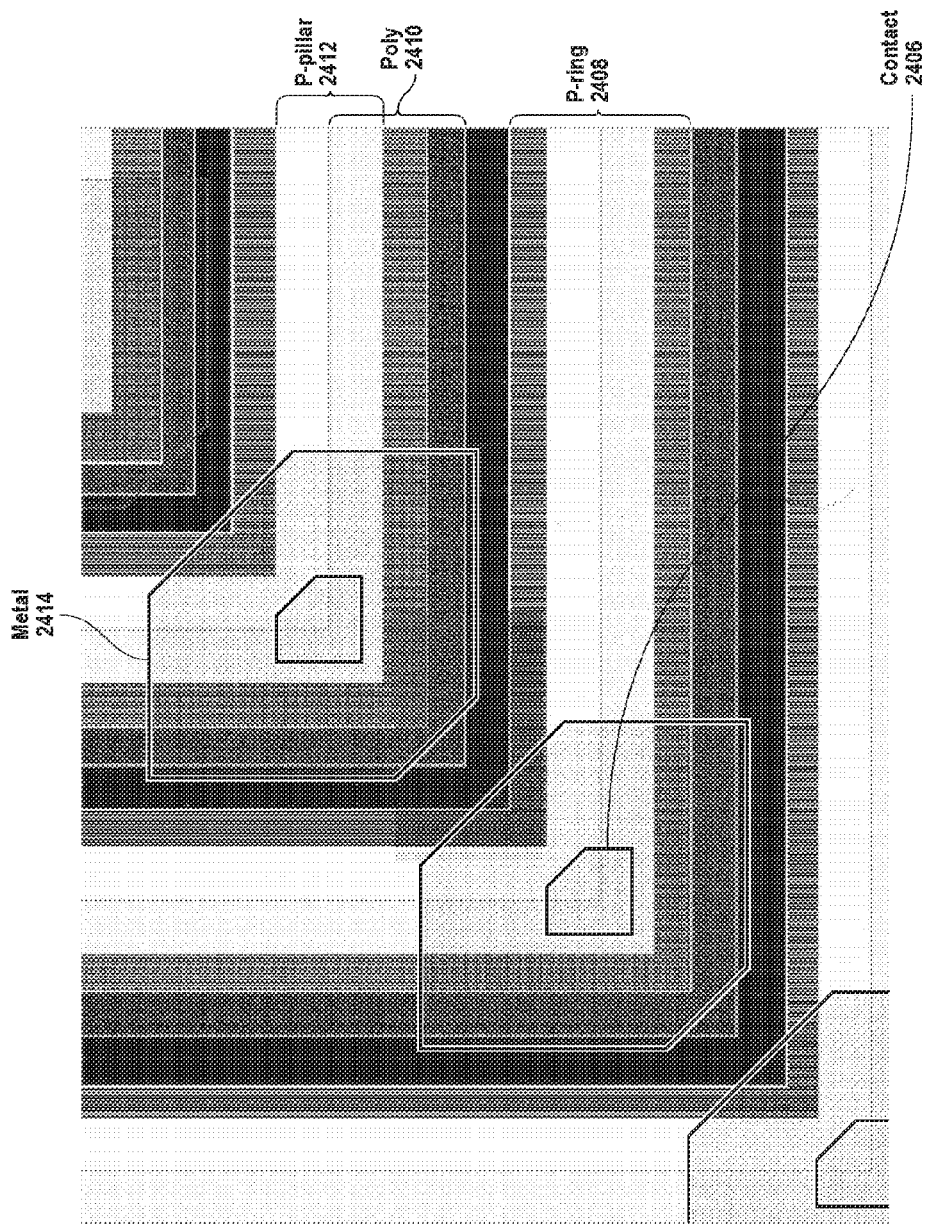
FIG. 24B is an expanded view of the corner of the termination region of the top layout view in FIG. 24A.

Conductive field plates are used to spread the electric field more uniformly in the termination region. It is desirable to electrically connect the field plates to the underlying pillars so that they can assume the potential of their corresponding pillar. FIG. 23 shows a cross section view of a super junction power device where field plates 2330 are electrically connected to their corresponding floating P-pillars 2304 through surface well regions (also referred to as "P rings") formed along tops of P-pillars 2304. These electrical connections are made by forming contacts between field plates 2330 and corresponding well regions through one or more dielectric layers 2332. However, as cell pitch is reduced, forming a contact between the field plates and their underlying pillars becomes more difficult. FIG. 24A is a top layout view of a corner region of a super-junction power device showing a technique for contacting field plates to the underlying pillars for small cell pitches. FIG. 24B is an expanded view of the corner the termination region of the top layout view in FIG. 24A.

In FIG. 24A, active region 2404 and termination region 2402 are delineated. The pillar configuration is similar to the parallel-concentric configuration shown in FIG. 1C. That is, the P-pillars in active region 2404 extend parallel to each other, while the P-pillars in termination region 2402 extend in a concentric fashion around the active region. As shown, contact structures 2406 for electrically connecting the field plates to the underlying floating P-pillars are advantageously located directly over the P-pillars where the P-pillars make a 90 degrees turn. FIG. 24B will be used to show and describe contact structures 2406 in more detail.

In FIG. 24B, P-pillars 2412 are spaced equally from one another in the active and termination regions. P-rings 2408 are formed along the tops of corresponding P-pillars, and extend in a concentric fashion around the active region similar to the floating P-pillars in which they are formed. In one embodiment, the width of P-rings 2408 gradually decreases in the direction away from the active region. Field plates 2410 (e.g., comprising polysilicon) extend over but are off-set relative to corresponding P-pillars and P-rings so that each of them extends partially over a corresponding P-pillar and partially over an adjacent mesa region (or N-pillar). Field plates 2410 surround the active region in a concentric fashion similar to P-rings 2408. While the P-rings are shown in FIGS. 23, 24A and 24B to be centered about the corresponding P-pillars, the P-rings may be off-set to the right or the left relative to the corresponding P-pillar. The offset P-rings can be advantageously used to merge two adjacent P-pillars along the surface.

Contacts 2406 are formed directly above corresponding P-pillars 2412 in the corner regions where the P-pillars make a 90 degree turn. The corner regions provide additional space in which contacts 2406 can be formed. A conductive or semiconductive material 2414 (e.g., a metal) is used to make the connection between each P-pillar 2412 and the corresponding polysilicon field plate 2410 through contacts 2406.

In one embodiment, two or more P-rings 2408 physically touch thereby merging the corresponding P-pillars at the surface. This advantageously provides a larger surface area for forming the contacts. This technique is particularly useful in designs with tighter cell pitches where forming one contact per P-pillar can be difficult. In another embodiment, the termination N-pillars located between the floating P-pillars include a lightly doped N-region along their tops similar to those shown in FIGS. 21 and 22. In yet another embodiment, highly doped P+ regions are formed in the P-rings to ensure a more robust contact between the field plates and the corresponding P-rings. The P+ regions may be formed at the same time the P+ heavy body regions are formed in the active area of device.

The technique described in connection with FIGS. 23 and 24A, 24B may be used in the design of edge termination for any superjunction or non-superjunction power semiconductor device (e.g., MOSFET, IGBT, diode).

Figure 25A:
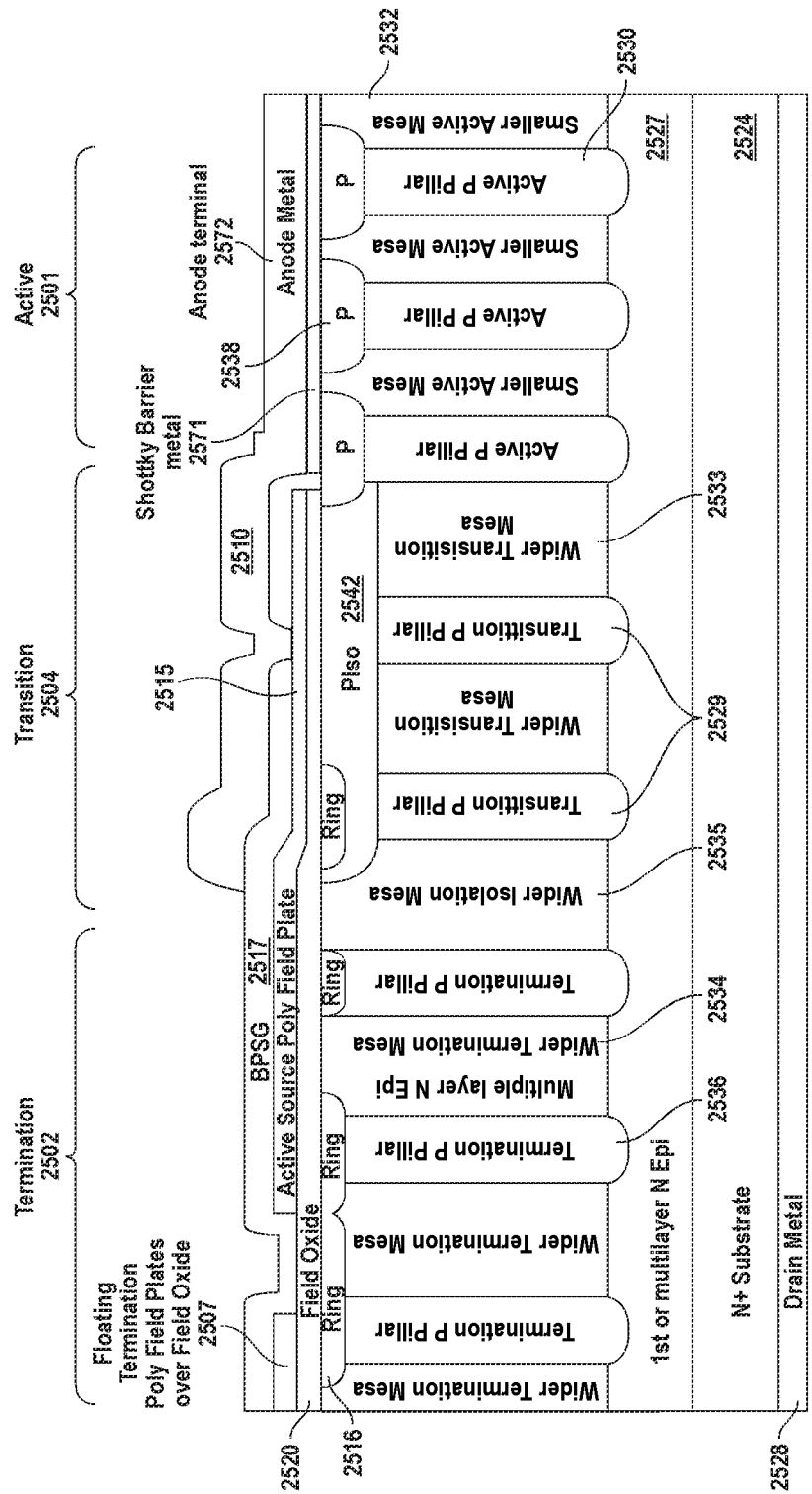
FIGS. 25A-25D are simplified cross section views showing various embodiments of super-junction high voltage merged PiN Schottky rectifiers.

FIGS. 25A-25D are cross section views showing various embodiments of super-junction high voltage merged P-N Schottky rectifiers. These figures show a portion of the die where the active region transitions to the termination region. In FIG. 25A, active region 2501 includes alternating P-N pillars 2530, 2532. P-pillars 2530 are trench-filled pillars, similar to various other embodiments described herein. P-wells 2538 extend along a top side of corresponding P-pillars 2530. P-wells 2538 are wider than P-pillars 2530 and extend to a predetermined depth from the top silicon surface. A Schottky barrier metal 2571 together with an overlying metal layer 2572 (e.g., comprising aluminum) extend along the top surface of the top epitaxial layer. Schottky barrier metal 2571 and metal layer 2572 together form the anode terminal of the Schottky rectifier. As can be seen, the anode terminal contacts both the top surface of N-pillars 2532 and the top surface of P-wells 2538. Where the anode terminal makes contact with N-pillars 2532, Schottky contacts are formed.

During operation, the alternating P-N pillar structure keeps the high electric field away from the Schottky surface area, thus reducing the reverse leakage. Additionally, the P-N pillars can support high voltages thus allowing use of low resistivity N pillars (where the current flows), thereby reducing the series resistance component of the diode forward voltage. Moreover, P-wells 2538 serve to pinch off the active N-pillars near the surface at a lower voltage, which helps to further reduce the reverse leakage current. Thus, a high voltage Schottky rectifier with low forward voltage and low reverse leakage is obtained.

In one embodiment, the active and transition P-N pillars may be stripe-shaped with termination P-N pillars surrounding the active and transition regions in a concentric fashion similar to the layout configuration shown in FIG. 1C. In yet another embodiment, the active, transition, and termination P-N pillars may be concentric similar to the layout configuration shown in FIG. 1A. In the latter layout configuration, the gate feed issues associated with MOSFETs is not present since there are no gate structures in the Schottky rectifier.

Figure 25B:
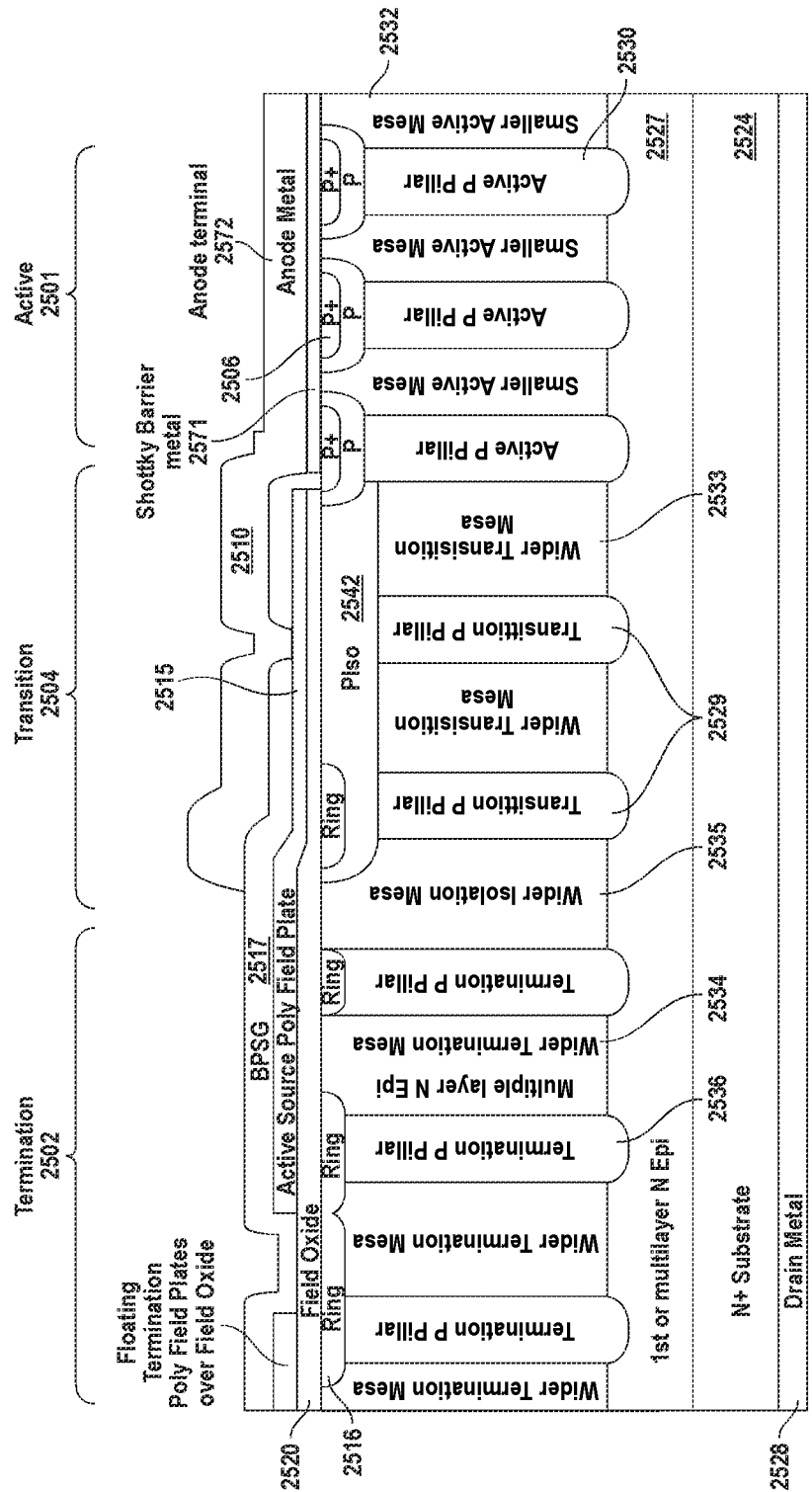

FIG. 25B shows a variation of the FIG. 25A embodiment in which P+ contact regions 2506 are formed in P-wells 2538. The anode terminal forms an ohmic contact with P-wells 2538 through P+ contact regions 2506. This allows the diode to operate at high current density with lower conduction voltage due to the parallel conduction of the PN diode when the forward voltage exceeds the built in potential.

Figure 25C:
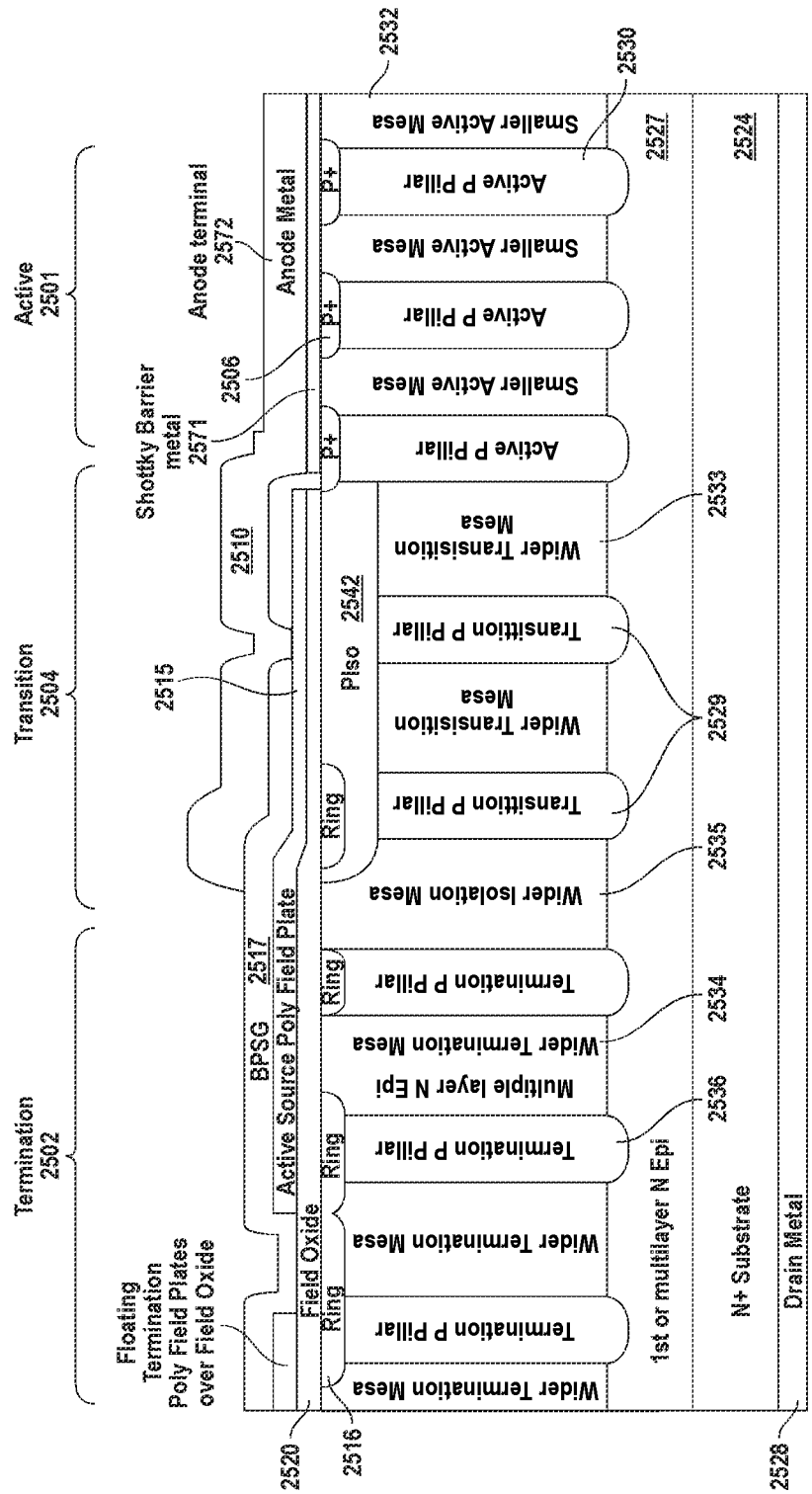

FIG. 25C shows a variation of the FIG. 25B embodiment where P-wells 2538 are not included, but P+ contact regions 2506 are included so that the anode terminal makes ohmic contact with P-pillars 2530 along their tops through the P+ contact regions 2538. This variant trades off lower forward voltage for increased leakage resulting from the higher electric field at the barrier.

Figure 25D:
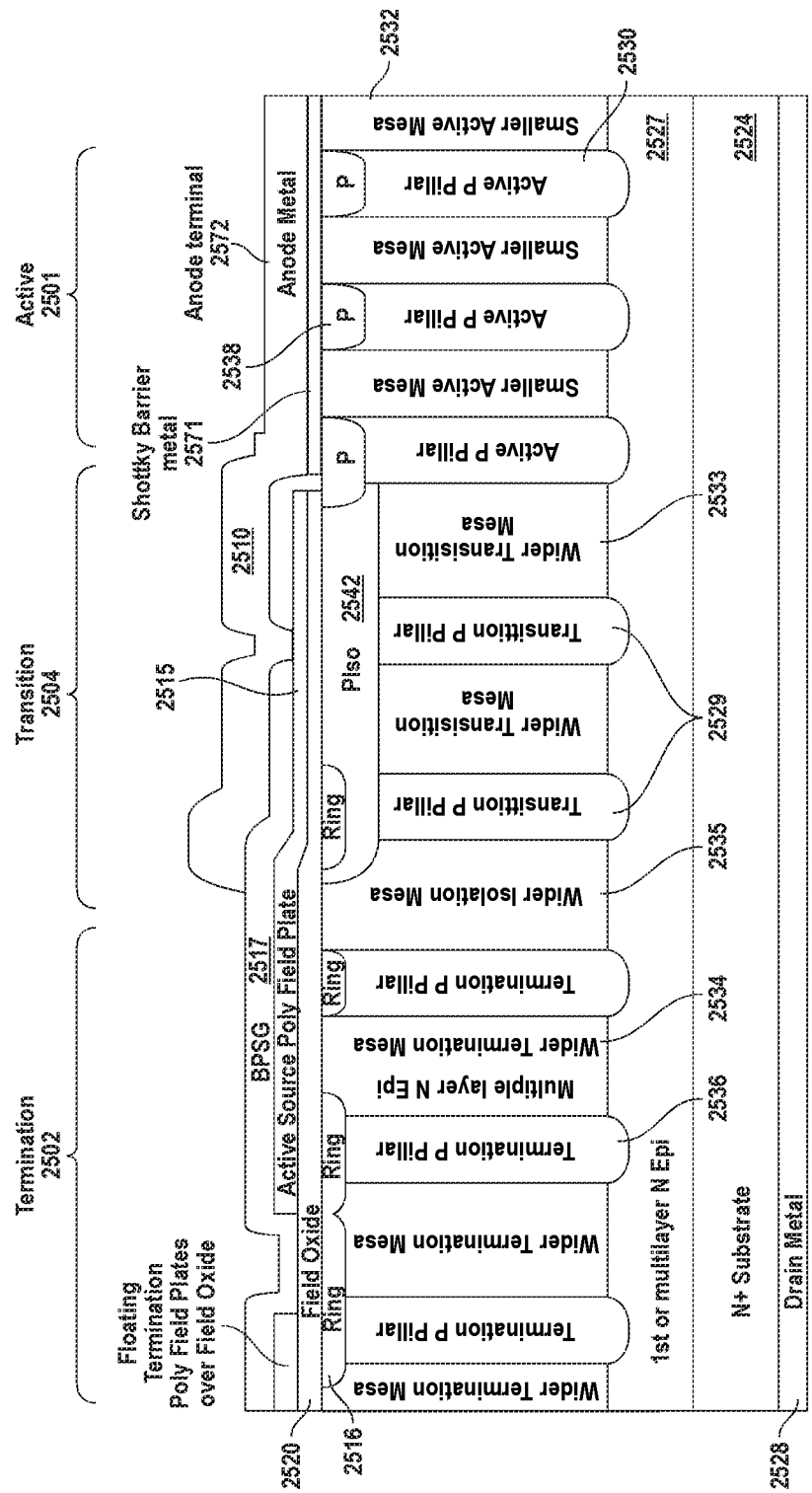

FIG. 25D shows a variation of the FIG. 25A embodiment where P-wells 2538A have approximately the same width as the P-pillars in which they are formed. With the width of P-well regions reduced as compared to the FIG. 25A embodiment, the mesa width (N-pillar width) near the surface is increased thus lowering the forward voltage of the Schottky rectifier.

The MOSFET process described above can be modified in simple ways to form the Schottky rectifiers in FIGS. 25A-25D. For example, the FIG. 25A embodiment may be obtained by eliminating the source implant from the MOSFET process. The P+ regions in FIGS. 25B and 25C correspond to the heavy body region of the MOSFET. Because of the compatibility between the processes for the MOSFET and the Schottky rectifier, MOSFET (e.g., FIG. 3) and Schottky rectifier (e.g., FIG. 25A) can be easily integrated in a single die to thereby obtain a SynchFET.

Figure 26A:
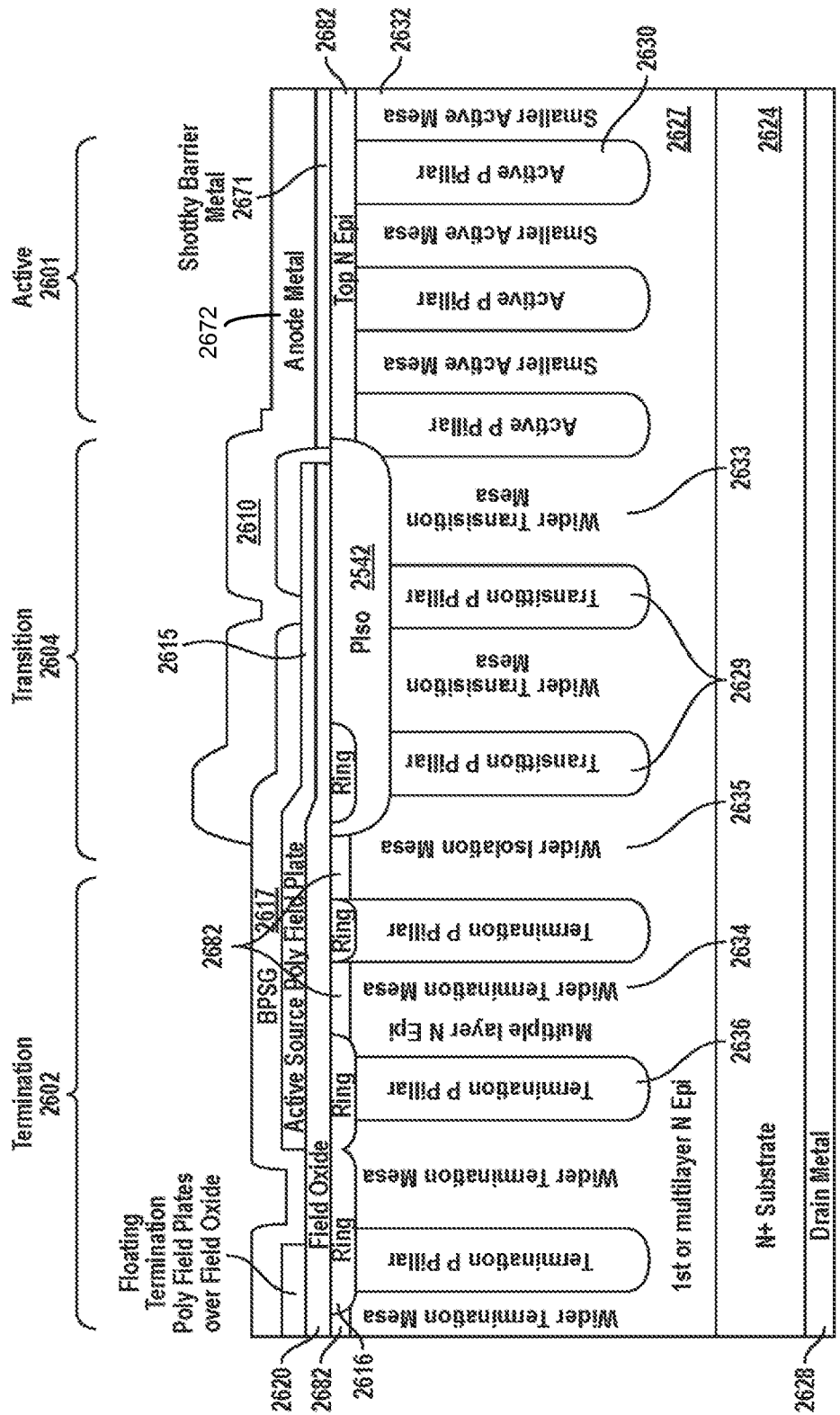
FIGS. 26A-26B are simplified cross section views showing two additional embodiments of super junction high voltage Schottky rectifiers.
Figure 26B:
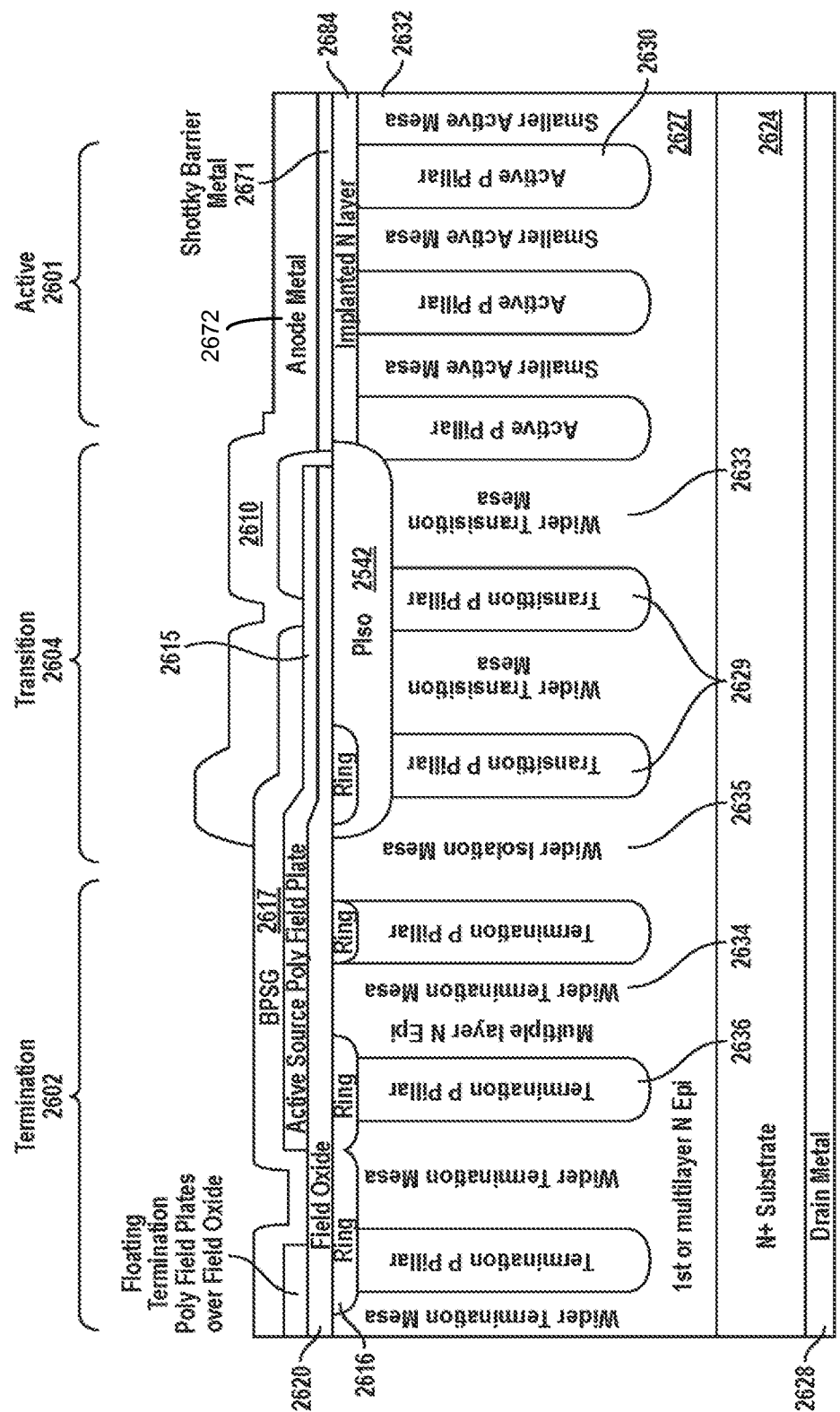

FIGS. 26A and 26B are cross section views showing two additional embodiments of super-junction high voltage Schottky rectifiers. In FIG. 26A, after trench-filled P-pillars 2630 are formed, an N-type epitaxial layer 2682 is formed over the P-N pillar structure, after which the anode terminal comprising Schottky barrier metal 2671 and an overlying metal layer 2672 (e.g., comprising aluminum) is formed over and directly contacts N-type epitaxial layer 2682. In this embodiment, P-pillars 2630 are not connected to the anode terminal and thus float. This embodiment advantageously lowers the forward voltage of the Schottky rectifier by increasing the Schottky contact area, and reduces leakage current by using the floating pillars to deplete the active N-pillars at a low voltage.

FIG. 26B shows a variation of the FIG. 26A embodiment where instead of N-epi layer 2682, an N-implant is performed to thereby form N-implant region 2684 along the top surface of the P-N pillars. As shown, the anode terminal comprising Schottky barrier metal 2671 and an overlying metal layer 2672 (e.g., comprising aluminum) directly contacts N-implant region 2684.

In FIGS. 25A-25D and 26A-26B, while the P pillars are shown as being of the trench filled variety, the pillars can have a lower portion that is made up of multiple bubble-shaped P-regions, and an upper portion that is trench filled, similar to P-pillars 329A, 329B, 329C shown in FIG. 3. Furthermore, the transition region 2504, 2604 and termination regions 2502, 2602 in FIGS. 25A-25D and 26A-26B are similar to the corresponding regions in FIG. 3, and thus will not be described. The same advantages obtained in integrating these regions with the active region of the MOSFET in FIG. 3 are realized with the Schottky structure of FIGS. 25A-25D and 26A-26B.

Figure 27A:
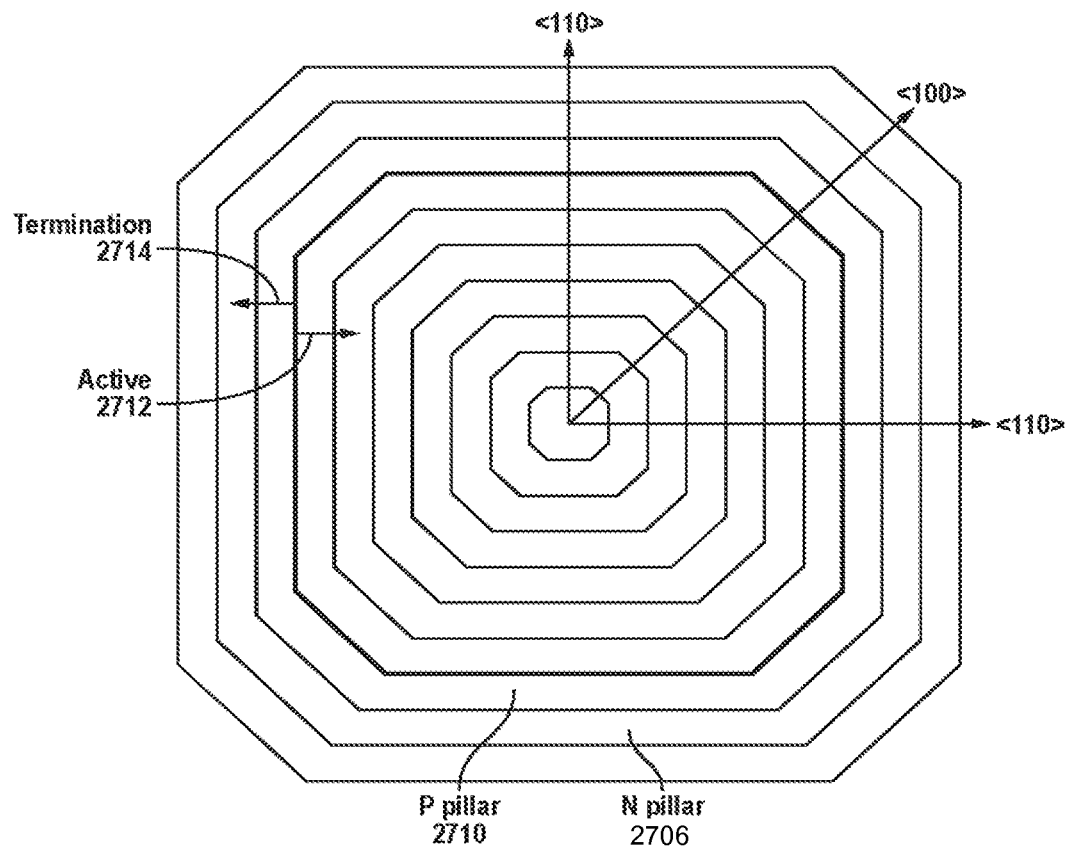
FIGS. 27A and 27B are respectively top view of a die layout diagram and top view of a wafer where the wafer flat extends parallel to the laterally extending pillars in FIG. 27A.
Figure 27B:
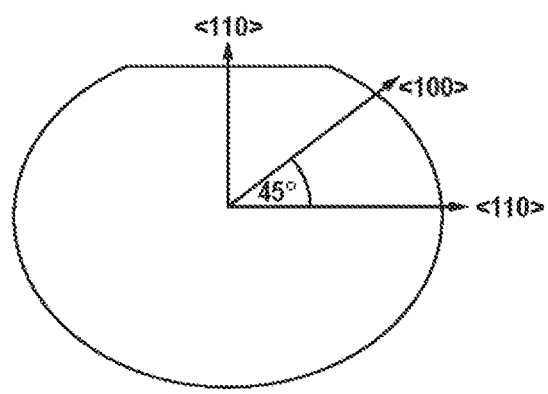

A challenge in filling trenches having a high aspect ratio is avoiding formation of voids in the trench or preventing premature epi closure along the top of the trench due to localized growth near the top corners of the trench. In superjunction layout configurations where trench sidewalls have different plane directions, filling trenches with epi becomes even more difficult because the epi filling process is sensitive to silicon crystal plane direction. For example, the rate at which epitaxial silicon grows along the <100> plane direction is different than the rate at which epitaxial silicon grows along the <110> plane direction. This is more clearly illustrated in FIGS. 27A and 27B. FIG. 27A shows a top view of a die layout diagram, and FIG. 27B shows a top view of a wafer where the wafer flat extends parallel to the laterally extending pillars in FIG. 27A.

FIG. 27A shows a full concentric octagon layout configuration. That is, P-pillars 2710 and N-pillars 2706 in both active region 2712 and termination region 2714 are concentric octagons. P-pillars 2710 are formed in trenches using techniques disclosed herein. While the sidewalls of vertically and horizontally extending trenches have the same plane direction, namely, <110>, the diagonally extending trenches have the <100> plane (this assumes that the die shown in FIG. 27A is positioned on the wafer so that the horizontally extending trenches run parallel to the wafer flat, as depicted in FIGS. 27A and 27B). This variation in plane direction will result in non-uniform filling of the trenches.

Figure 28:
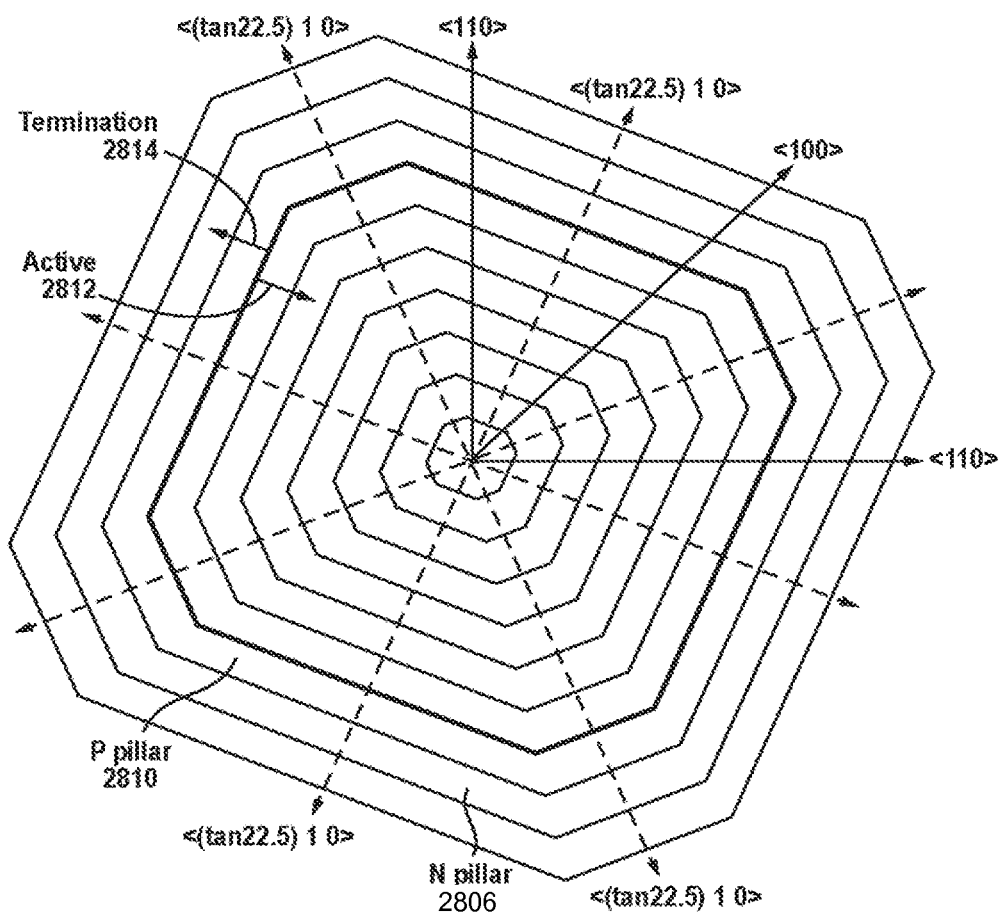
FIG. 28 is a top view of a die layout diagram illustrating rotation of the die for the purpose of eliminating the non-uniform epi filling due to variations in plane direction.

In accordance with one embodiment, the non-uniform epi filling due to variations in plane direction can be eliminated by rotating the wafer 22.5 degrees. This is illustrated in FIG. 28. As can be seen, by rotating the wafer and thus the dies on the wafer during photolithography processing, the dies can all be oriented so that all trench sidewalls line up along the <(tan 22.5)10> plane direction. In FIG. 28, similar to FIG. 27A, P-pillars 2810 and N-pillars 2806 in both active region 2812 and termination region 2814 are concentric octagons, and P-pillars 2810 are formed in trenches using techniques disclosed herein. Alternatively, N-pillars 2806 may be formed in trenches using techniques disclosed herein. In one embodiment, the wafer is maintained in the 22.5 degree rotated position throughout the process sequence. The structural details of the power device (e.g., MOSFET, IGBT or rectifier) housed in the die shown in FIG. 28 are not shown, but such details can be found in other embodiments disclosed herein.

In the FIG. 1C layout design where the striped active P-pillars are surrounded by termination P-pillars, the sharp corners of the concentric rectangular or square shaped termination pillars are difficult to etch and fill and may result in formation of voids in the epi fill. Such voids can cause charge imbalance resulting in localized breakdown voltage. These voids can also result in areas in the termination region having high electric field stress that become a source of electron injection into the oxide and a magnet for positive charges, resulting in reliability failures.

Figure 29:
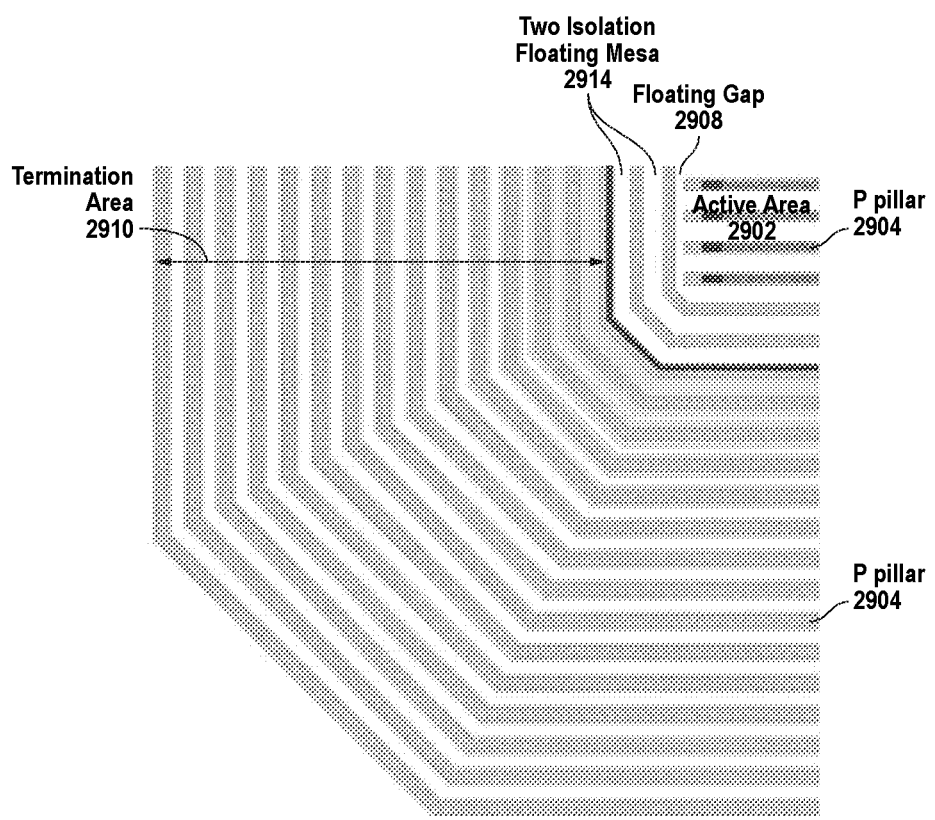
FIG. 29 is a top layout view of a corner of a super-junction power MOSFET with striped active P-pillars surrounded by concentric termination P-pillars.

FIG. 29 is a top layout view of a corner of a super-junction power MOSFET with striped active P-pillars 2904 surrounded by concentric termination P-pillars 2904. In this layout design the sharp corners of the concentric termination P-pillars in FIG. 1C are eliminated by forming octagon shaped termination P-pillars. By eliminating the sharp corners, the concentric termination trenches can be filled without formation of voids in the fill material. As can be seen, the corner edges of the octagon shaped termination P-pillars gradually increase in length in the direction away from the active region. Also, as compared to the fully concentric octagon design with equal length legs, the FIG. 29 layout configuration provides better packing and thus a more efficient use of silicon.

Figure 30:
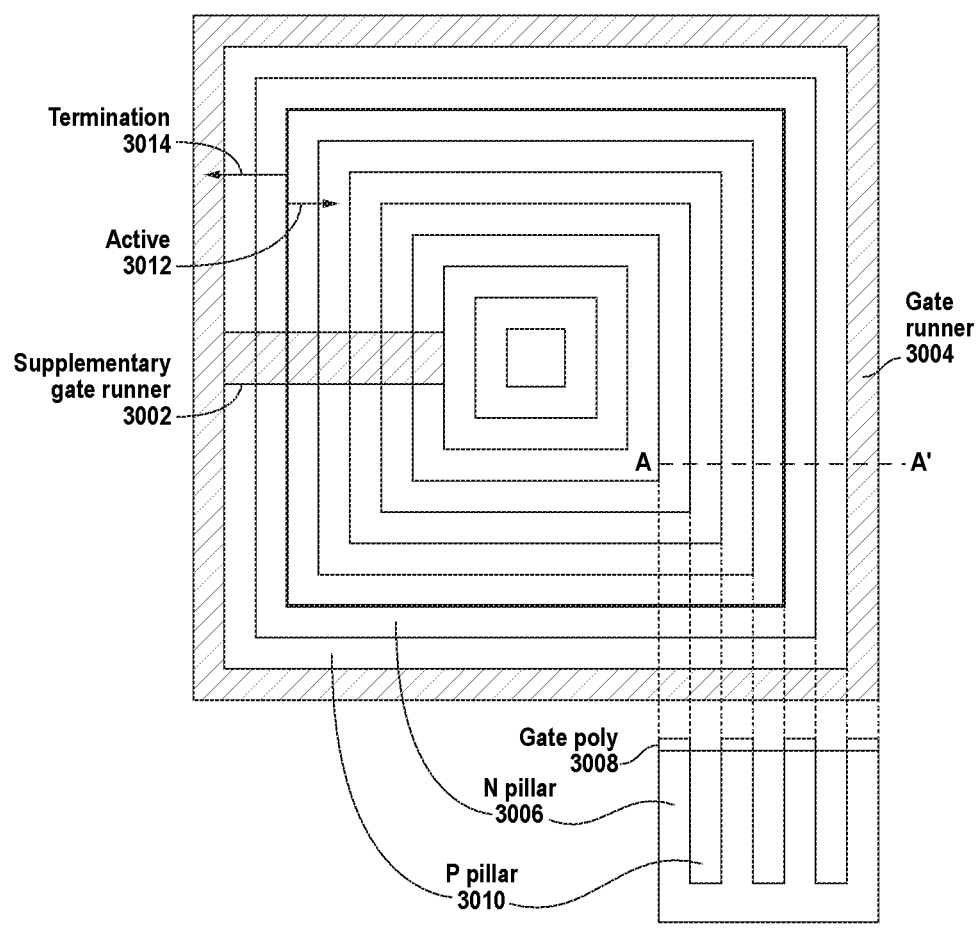
FIG. 30 is a top view of a fully concentric layout design where a supplementary metal gate runner is bussed through a center portion of the die to provide metal connection to the concentric polysilicon gates.

In FIG. 29, gap region 2908 is formed between an end of active P-pillars 2904 and the first concentric P-pillar in termination region 2910. Two full floating mesa regions (or N-pillars) 2914 are inserted to provide isolation between gap 2708 and corner areas and termination 2910. These features reduce the sensitivity to breakdown voltage due to charge imbalance in this area. In one embodiment, the trench fill process described in connection with the FIG. 28 embodiment is used to further eliminate the possibility of void formation due to non-uniform epi filling caused by differing plane directions along the termination trench sidewalls. That is, prior to filling the trenches, the wafer is rotated 22.5 degrees so that all trench sidewalls line up along the <(tan 22.5)10> plane direction. In one embodiment, the wafer is maintained in the 22.5 degree rotated position (relative to a wafer flat) throughout the process sequence. The structural details of the power device (e.g., MOSFET, IGBT or rectifier) housed in the die shown in FIG. 28 are not shown, but such details can be found in other embodiments disclosed herein FIG. 30 is a top view of a fully concentric layout design where a supplementary metal gate runner 3002 is bussed through a center portion of the die to provide metal connection to all the concentric polysilicon gates 3008. A cross section view along line A-A' is also included in FIG. 30. Metal gate runner 3004 extends around the perimeter of the die and connects to a gate pad (not shown), and to supplementary metal gate runner 3002. P-pillars 3010, N-pillars 3006 and planar polysilicon gates 3008 all extend in a concentric fashion in active region 3012 and termination region 3014.

Supplementary metal gate runner 3002 extends far enough inside the die to contact the inner most concentric polysilicon gate. A drawback of this gate runner design is that it does not provide a balanced gate propagation delay. As can be seen, the inner most concentric polysilicon gates travel a shorter distance before contacting supplementary metal gate runner 3002 than do the outer most concentric polysilicon gates. The inner concentric polysilicon gates thus exhibit a lower propagation delay than the outer concentric polysilicon gates. This imbalance in propagation delays makes it difficult to obtain good switching speeds without dynamic failure of the device.

Figure 31B:
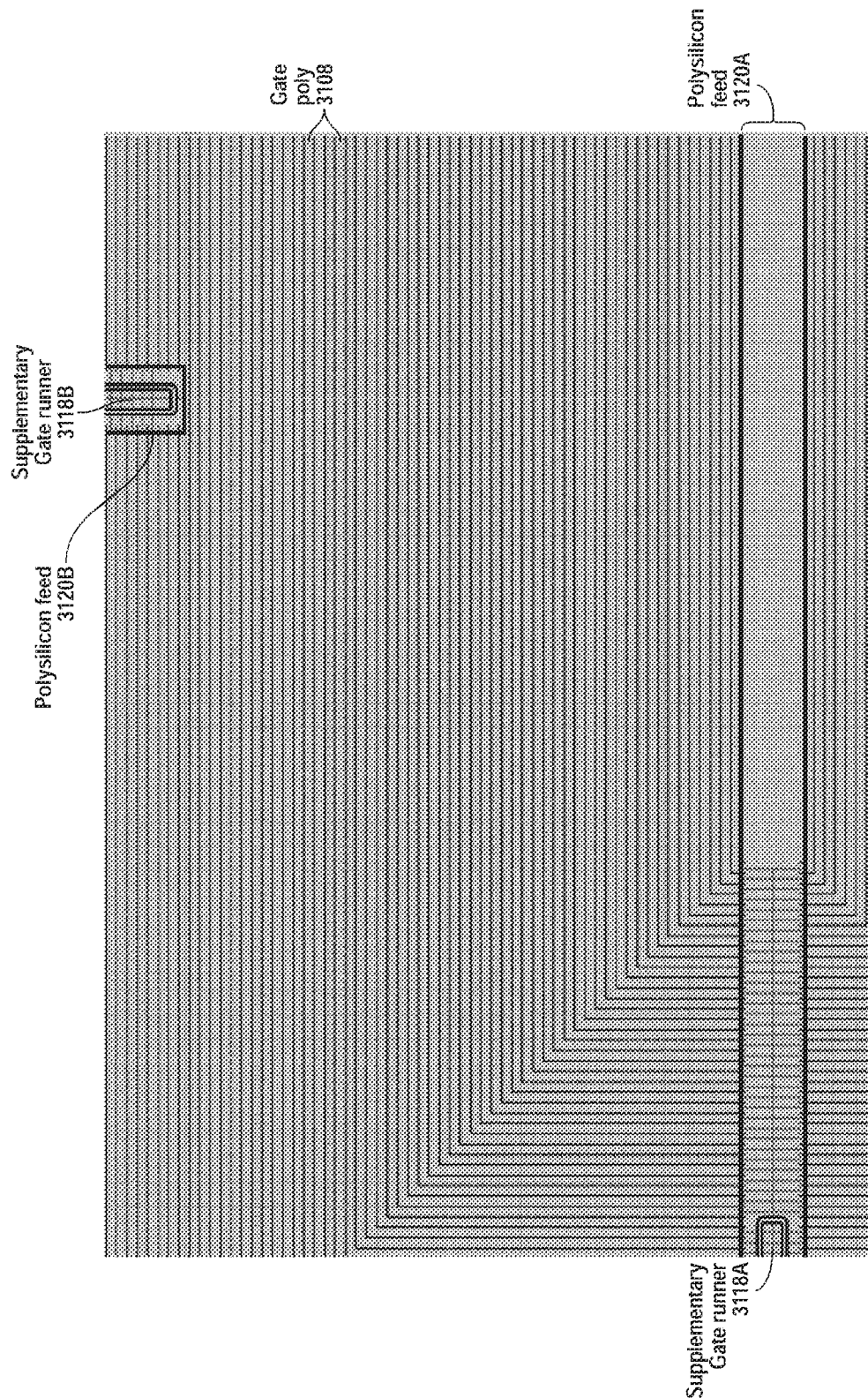
FIG. 31B is an expanded view of an inner portion of the top view in FIG. 31A.

FIG. 31A shows a top layout view of a fully concentric design with a gate runner design that provides a more balanced gate propagation delay throughout the die. While FIG. 31A does not show the concentric P and N pillars and the concentric polysilicon gates, these regions of the die in FIG. 31A are similar to those in FIG. 30. Outer metal gate bus 3114 extends around the outer perimeter of the die and contacts gate pad 3116. Four supplementary metal gate runners 3118A, 3118B, 3118C and 3118D extend from outer metal gate bus 3114 toward the center of the die, but terminate before reaching the die center. In this design, while a number of the outer concentric polysilicon gates directly tie into the four supplementary metal gate runners, a number of the inner-most concentric polysilicon gates are not directly connected to all of the supplementary metal gate runners. This can be seen more clearly in FIG. 31B which is an expanded view of an inner portion of the top view in FIG. 31A.

In FIG. 31B, the concentric poly gates 3108 as well as the end portions of supplementary metal gate runners 3118A and 3118B in the active region can be seen. Concentric polysilicon gates 3108 encircle a center portion of the die through which polysilicon feed 3120 extends. Polysilicon feed 3120 extends laterally to make electrical contact with supplementary metal gate runner 3118A to the left of the die center, and to supplementary metal gate runner 3118C (not shown in FIG. 31B) to the right of the die center. As can be seen, none of the supplementary metal gate runners extend all the way to the center of the die. Instead, the lengths to which these four supplementary metal gate runners extend are carefully selected in order to obtain a more balanced gate propagation delay among the concentric poly gates 3108. As a result, a number of the inner-most concentric polysilicon gates do not directly tie into all of the supplementary metal gate runners.

Figure 31C:
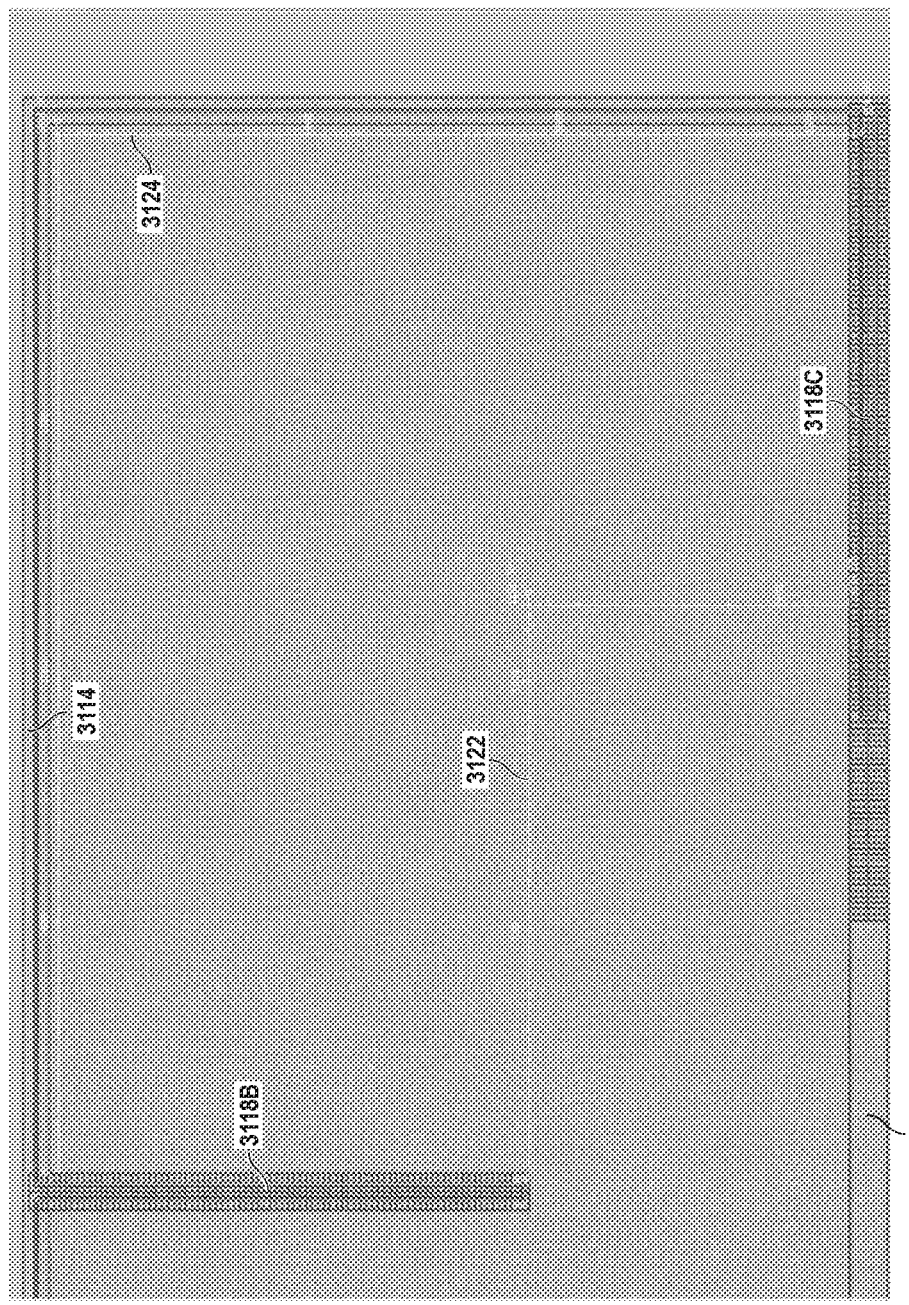
FIG. 31C is an expanded view of the upper right quadrant of the die shown in FIG. 31A.

FIG. 31C is an expanded view of the upper right quadrant of the die shown in FIG. 31A. FIG. 31C will be used to illustrate how the particular lengths selected for the supplementary metal gate runners for this embodiment result in a more balanced propagation delay through the concentric poly gates. Two measurements are shown. The inner measurement, marked by reference numeral 3122, measures one half the length of a concentric gate poly that extends between two supplementary metal gate runner 3118C to just below the bottom end of supplementary metal gate runner 3118B (i.e., does not tie into gate runner 3118B), ties into supplementary metal gate runner 3118A (not shown in FIG. 31C), and circles back around to tie into metal gate runner 3118C. That is, the measured concentric gate poly ties into gate runners 3118A and 3118C, but not 3118B and 3118D. On the other hand, the outer measurement, marked by reference numeral 3124, measures a length of the outermost concentric gate poly connected between two supplementary gate runners as it circles around the die. The measurements illustrate that the portion of the measured inner poly gate that extends between supplementary gate runner 3118C and 3118A (i.e., the closest two gate runner to which it is directly connected) is substantially equal to the portion of the measured outer poly gate that extends between supplementary gate runners 3118B and 3118C (i.e., the closest two gate runners to which it is directly connected). Also, those concentric poly gates closer to the center of the die that do not contact any of the four supplementary metal gate runners have short enough length that the propagation delay through them would not be very different from the outer concentric poly gates that are tied to two or all four of the supplementary gate runners.

As can be seen, while this technique does not obtain perfectly equal propagations delays through all concentric poly gates, it significantly improves the imbalance in the gate poly propagation delay that is present in the FIG. 30 gate runner design. As FIG. 31A illustrates, while supplementary metal gate runners 3118A, 3118B, 3118C, 3118D extend into the middle of the die, ample surface area remains for bonding to the source metal. The technique illustrated in FIGS. 31A-31C can be implemented in the planar gate variation or the trench gate variation.

Figure 32:
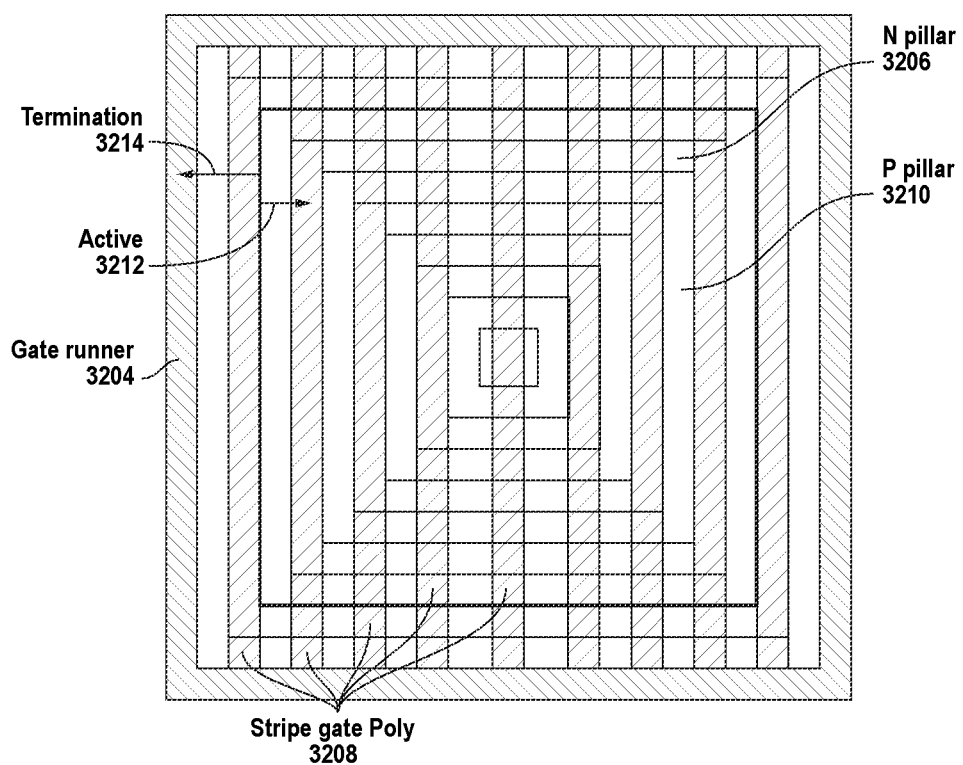
FIG. 32 shows a top layout view of a fully concentric pillar design with stripe polysilicon gates.

FIG. 32 shows a top layout view of a fully concentric pillar design with stripe polysilicon gates. Metal gate runner 3204 extends around the perimeter of the die and connects to a gate pad (not shown). P-pillars 3210 and N-pillars 3206 extend in a concentric fashion in active region 3212 and in termination region 3214. Polysilicon gates 3208 (which can be of the planar gate or trench gate varieties) are stripe shaped and extend through both active and termination regions, and contact metal gate runner 3204 along their opposite ends.

This configuration advantageously eliminates the need for the supplementary gate runner(s) that is needed in the concentric gate poly design, thus resulting in area savings. While some channel area is lost where gate poly stripes 3208 cross over P-pillars 3210, the impact on Rds-on due to channel resistance increase is small in high voltage devices.

While the above provides a complete description of specific embodiments of the present invention, various modifications, alternatives and equivalents are possible. For example, while some embodiments of the invention are illustrated in the context of planar gate MOSFETs, the same techniques could easily be applied to other planar-gate structures such as planar gate IGBTs by merely reversing the polarity of the substrate from those shown in the figures. Similarly, some of the structures and process sequences are described in the context of N-channel FETs, however, modifying these structures and process sequences to form P-channel FETs would be obvious to one skilled in the art in view of this disclosure. Further, the various techniques disclosed herein are not limited to planar gate structures and may be implemented in trench gate MOSFETs, trench gate IGBTs (which have trench gates), shielded gate MOSFETs or IGBTs (which have trenched gates with underlying shield electrode(s)), and rectifiers (including Schottky rectifiers, TMBS rectifiers, etc.).

Additionally, while not specifically called out for each embodiment, the various embodiments including many of the termination designs and charge balance techniques may be implemented in any of the three layout configurations shown in FIGS. 1A-1C. Similarly, many of the embodiments disclosed herein including many of the termination designs and charge balance techniques are not limited in implementation to the trench epi fill charge balance process technology, and may also be implemented in the multi-epi layer pillar process technology. For this and other reasons, therefore, the above description should not be taken as limiting the scope of the invention, which is defined by the appended claims.

What is claimed is:

1. A power device comprising:
at least one epitaxial layer of a first conductivity type;
an active region;
a termination region surrounding the active region;
a plurality of trenches disposed in the at least one epitaxial layer; and
silicon material of a second conductivity type disposed in the plurality of trenches, the silicon material of the second conductivity type, together with a plurality of mesas defined in the at least one epitaxial layer by the plurality of trenches, defining a plurality of concentric octagon-shaped pillars of alternating conductivity type, at least a first portion of the concentric octagon-shaped pillars being disposed in the active region and at least a second portion of the concentric octagon-shaped pillars being disposed in the termination region,
sidewalls of the plurality of trenches defining a first four legs and a second four legs of each of the plurality of concentric octagon-shaped pillars, the sidewalls having a same crystallographic plane direction, the first four legs including at least two legs of a first length and the second four legs including at least two legs of a second length, the second length being different than the first length.

2. The power device of claim 1, wherein legs of the plurality of concentric octagon-shaped pillars increase in length in a direction away from a center of the plurality of concentric octagon-shaped pillars.

3. The power device of claim 1, further comprising:
a body region of the second conductivity type disposed in the at least one epitaxial layer;
a source region of the first conductivity type disposed in the body region; and
an insulated gate electrode disposed on at least a portion of the body region and at least a portion of the source region.

4. The power device of claim 1, wherein the same plane direction is a <(tan 22.5)10> plane direction.

5. The power device of claim 1, wherein the silicon material of the second conductivity type disposed in the plurality of trenches includes:
a first layer of silicon material of the second conductivity type having a first doping concentration; and
a second layer of silicon material of the second conductivity type disposed on the first layer of silicon material of the second conductivity type, the second layer of silicon material of the second conductivity type having a second doping concentration, the second doping concentration being different than the first doping concentration.

6. The power device of claim 5, wherein the first doping concentration is greater than the second doping concentration.

7. The power device of claim 5, wherein the first doping concentration is less than the second doping concentration.

8. The power device of claim 5, wherein the silicon material of the second conductivity type disposed in the plurality of trenches further includes a third layer of silicon material of the second conductivity type disposed on the second layer of silicon material of the second conductivity type, the third layer of silicon material of the second conductivity type having a third doping concentration, the third doping concentration being different than at least the second doping concentration.

9. The power device of claim 1, wherein at least one mesa of the plurality of mesas is a floating mesa, the floating mesa defining an isolation region between the active region and the termination region.

10. A method of forming a power device having an active region surrounded by a termination region, the method comprising:
forming a plurality of trenches in at least one epitaxial layer of a first conductivity type; and
filling the plurality of trenches with silicon material of a second conductivity type, the silicon material of the second conductivity type, together with a plurality of mesas defined in the at least one epitaxial layer by the plurality of trenches, defining a plurality of concentric octagon-shaped pillars of alternating conductivity type, at least a first portion of the concentric octagon-shaped pillars being disposed in the active region and at least a second portion of the concentric octagon-shaped pillars being disposed in the termination region,
each of the plurality of concentric octagon-shaped pillars having a first four legs of a first length and a second four legs of a second length, the second length being different than the first length, and
sidewalls of trenches defining the first four legs and the second four legs of each of the plurality of concentric octagon-shaped pillars having a same crystallographic plane direction.

11. The method of claim 10, further comprising:
prior to forming the plurality of trenches, rotating, by 22.5 degrees, a wafer in which the power device is formed.

12. The method of claim 10, wherein corner legs of the plurality of concentric octagon-shaped pillars gradually increase in length in a direction away from a center of the plurality of concentric octagon-shaped pillars.

13. The method of claim 10, further comprising:
forming a body region of the second conductivity type in the at least one epitaxial layer;
forming a source region of the first conductivity type in the body region; and
forming an insulated gate electrode on at least a portion of the body region and at least a portion of the source region.

14. The method of claim 10, wherein filling the plurality of trenches with silicon material of the second conductivity type includes:
forming a first epitaxial layer of the second conductivity type having a first doping concentration; and
forming a second epitaxial layer of the second conductivity type on the first epitaxial layer of the second conductivity type, the second epitaxial layer of the second conductivity type having a second doping concentration, the second doping concentration being different than the first doping concentration.

15. The method of claim 14, wherein filling the plurality of trenches with silicon material of the second conductivity type further includes forming a third epitaxial layer of the second conductivity type on the second epitaxial layer of the second conductivity type, the third epitaxial layer of the second conductivity type having a third doping concentration, the third doping concentration being different than at least the second doping concentration.

16. A power device comprising:
an epitaxial layer of a first conductivity type;
an active region disposed in the epitaxial layer of the first conductivity type;
a termination region disposed in the epitaxial layer of the first conductivity type and surrounding the active region;
a plurality of trenches disposed in the epitaxial layer of the first conductivity type; and
an epitaxial layer of a second conductivity type disposed in the plurality of trenches, the epitaxial layer of the second conductivity type, together with a plurality of mesas defined in the epitaxial layer of the first conductivity type by the plurality of trenches, defining a plurality of concentric octagon-shaped pillars of alternating conductivity type, at least a first portion of the concentric octagon-shaped pillars being disposed in the active region and at least a second portion of the concentric octagon-shaped pillars being disposed in the termination region,
each of the plurality of concentric octagon-shaped pillars having a first four legs of a first length and a second four legs of a second length, the second length being different length than the first length, and
sidewalls of trenches defining the first four legs and the second four legs of each of the plurality of concentric octagon-shaped pillars having a (tan 22.5)10> crystallographic plane direction.

17. The power device of claim 16, wherein the epitaxial layer of the second conductivity type includes:
a first epitaxial layer of the second conductivity type having a first doping concentration; and
a second epitaxial layer of the second conductivity type disposed on the first epitaxial layer of the second conductivity type, the second epitaxial layer of the second conductivity type having a second doping concentration, the second doping concentration being different than the first doping concentration.

18. The power device of claim 17, wherein the epitaxial layer of the second conductivity type further includes a third epitaxial layer of the second conductivity type disposed on the second epitaxial layer of the second conductivity type, the third epitaxial layer of the second conductivity type having a third doping concentration, the third doping concentration being different than at least the second doping concentration.

19. The power device of claim 18, wherein the third doping concentration is substantially equal to the first doping concentration.

20. The power device of claim 17, wherein the first doping concentration is less than the second doping concentration.

* * * * *